(12) United States Patent
Minami

(10) Patent No.: US 7,615,453 B2
(45) Date of Patent: Nov. 10, 2009

(54) METHOD OF MANUFACTURING A SEMICONDUCTOR INTEGRATED CIRCUIT DEVICE

(75) Inventor: Masataka Minami, Tokyo (JP)

(73) Assignee: Renesas Technology Corp., Tokyo (JP)

(*) Notice: Subject to any disclaimer, the term of this patent is extended or adjusted under 35 U.S.C. 154(b) by 26 days.

(21) Appl. No.: 12/098,312

(22) Filed: Apr. 4, 2008

(65) Prior Publication Data

US 2008/0286928 A1 Nov. 20, 2008

(30) Foreign Application Priority Data

May 15, 2007 (JP) .............................. 2007-129547

(51) Int. Cl.
*H01L 21/8236* (2006.01)

(52) U.S. Cl. ...................................... 438/276
(58) Field of Classification Search ................. 438/276
See application file for complete search history.

(56) References Cited

U.S. PATENT DOCUMENTS

| 6,387,744 B2* | 5/2002 | Taniguchi et al. ........... 438/228 |
| 7,067,877 B2* | 6/2006 | Nagaoka ..................... 257/335 |
| 7,220,637 B2 | 5/2007 | Ota et al. |
| 2001/0021551 A1* | 9/2001 | Taniguchi et al. ............ 438/228 |
| 2005/0098846 A1* | 5/2005 | Nagaoka ..................... 257/487 |
| 2006/0194392 A1* | 8/2006 | Nagaoka ..................... 438/268 |

FOREIGN PATENT DOCUMENTS

| JP | 2003-31682 A | 1/2003 |
| JP | 2003-100902 A | 4/2003 |

* cited by examiner

*Primary Examiner*—Charles D. Garber
*Assistant Examiner*—Andre' C Stevenson
(74) *Attorney, Agent, or Firm*—Miles & Stockbridge P.C.

(57) ABSTRACT

In the chip with which a plurality of MISFET from which threshold value voltage differs is intermingled, leakage current, such as GIDL current and BTBT current, is suppressed, inhibiting the short channel effect of MISFET. The concentration of the impurity for threshold value voltage adjustment implanted to the region in which n channel type MISFET with relatively low threshold value voltage is formed is made lower than the concentration of the impurity for threshold value voltage adjustment implanted to the region in which n channel type MISFET with relatively high threshold value voltage is formed. Implantation amount of the impurity at the time of forming n⁻ type semiconductor region 19 and punch-through stopper layer 20 in region ALTN is made larger than the implantation amount of the impurity at the time of forming n⁻ type semiconductor region 16 and punch-through stopper layer 17 in region AHTN, respectively.

28 Claims, 62 Drawing Sheets

METHOD OF MANUFACTURING A SEMICONDUCTOR INTEGRATED CIRCUIT DEVICE

CROSS-REFERENCE TO RELATED APPLICATION

The present application claims priority from Japanese patent application No. 2007-129547 filed on May 15, 2007, the content of which is hereby incorporated by reference into this application.

FIELD OF THE INVENTION

The present invention relates to the manufacturing technology of a semiconductor integrated circuit device, and particularly relates to an effective technology in the application to manufacture of the semiconductor integrated circuit device which has the semiconductor chip with which a plurality of transistors from which threshold value voltage differs were formed.

DESCRIPTION OF THE BACKGROUND ART

In Japanese patent laid-open No. 2003-100902 (Patent Reference 1), a semiconductor device with which a plurality of same channel type MOS's from which the impurity concentration in an extension layer and the impurity concentration in a pocket layer differ, and a breakdown voltage differs were formed on the same chip, and its manufacturing method are disclosed.

A semiconductor device with which a plurality of same channel type MOS's from which the impurity concentration in a channel region differs, and threshold value voltage differs were formed on the same chip, and its manufacturing method are disclosed in Japanese patent laid-open No. 2003-31682 (Patent Reference 2).

[Patent Reference 1] Japanese patent laid-open No. 2003-100902

[Patent Reference 2] Japanese patent laid-open No. 2003-31682

SUMMARY OF THE INVENTION

In the semiconductor integrated circuit device in recent years, in order to improve the working speed of MISFET (Metal Insulator Semiconductor Field Effect Transistor), operating current is large. In MISFET, in order to make operating current increase, gate length's microfabrication, and the enrichment of the impurity concentration in the semiconductor region used as a source/drain extension region are progressing. Even when gate length is microfabricated, in order to maintain the short channel characteristics of MISFET, it is necessary to form the punch-through stopper layer called the so-called halo region or the so-called pocket region near the source/drain extension region, and to do enrichment also of the impurity concentration in this punch-through stopper layer. On the other hand, when the impurity concentration in the source/drain extension region and the punch-through stopper layer is enriched, an electric field near the drain region becomes large, and GIDL (Gate Induced Drain Leakage) current and BTBT (Band To Band Tunneling) current increases.

The off-state current of MISFET is divided roughly into sub threshold current, and leakage current, such as GIDL current and BTBT current. Sub threshold current is decided by setup of threshold value voltage. Usually, in a circuit to lower standby current to, MISFET with high threshold value voltage (the off-state current value is small) is used. In a circuit where rapidity is needed, MISFET with low threshold value voltage (an off-state current value is high) is used. Therefore, when the circuit to lower standby current to and the circuit where rapidity is needed are intermingled in the same semiconductor chip (it is merely hereafter described as a chip), MISFET of different threshold value voltage is properly used by the circuit. In the manufacturing process of the semiconductor integrated circuit device, in order to reduce the process number, within the same chip, the source/drain region is formed at the same step also about MISFET from which threshold value voltage differs.

However, as for the MISFET with high threshold value voltage, leakage current, such as above-mentioned GIDL current, BTBT current, etc. in room temperature (about 25° C.) atmosphere, becomes large even to the value of the extent that is the same as sub threshold current in case that microfabrication of the gate length is done to about 65 nm. When microfabrication of the gate length is furthermore done to about 45 nm, it will be thought that leakage current, such as GIDL current and BTBT current, becomes larger than sub threshold current. That is, the present inventor found out that off-state current could not be made as small as expected in connection with gate length's microfabrication, even if threshold value voltage was set up highly, in order to make the off-state current of MISFET small.

Since temperature characteristics are small compared with sub threshold current, leakage current, such as GIDL current and BTBT current, hardly becomes a problem under a high temperature atmosphere. However, in mobile communications apparatus by which the standby current value in room temperature atmosphere constitutes important specification, for example, such as a cellular phone, the problem that standby current will become large generates on the contrary if microfabrication of the gate length of MISFET in the circuit is done in quest of the high-speed operation of the circuit.

There is the purpose of the present invention in offering the technology which can suppress leakage current, such as GIDL current and BTBT current, in the chip with which a plurality of MISFET from which threshold value voltage differs is intermingled and gate length's microfabrication progresses, inhibiting the short channel effect of MISFET.

The above-described and the other purposes and novel features of the present invention will become apparent from the description herein and accompanying drawings.

Of the inventions disclosed in the present application, typical ones will next be summarized briefly.

The manufacturing method of the semiconductor device by the present invention is a method of manufacturing a semiconductor integrated circuit device with a first MISFET of a first threshold value voltage and a second MISFET of a second threshold value voltage lower than the first threshold value voltage in a main surface of the same semiconductor substrate, comprising the steps of:

(a) forming a semiconductor region for threshold value voltage adjustment of the first MISFET which has a first conductivity type and has first concentration in a first region of the semiconductor substrate;

(b) forming a semiconductor region for threshold value voltage adjustment of the second MISFET which has the first conductivity type and has a second concentration of impurity concentration lower than the first concentration in a second region of the semiconductor substrate;

(c) forming a gate insulating film over the main surface of the semiconductor substrate;

(d) forming a first gate electrode of the first MISFET in the first region, and forming a second gate electrode of the second MISFET in the second region by depositing a conductive film over the gate insulating film, and patterning the conductive film and the gate insulating film;

(e) after the step (d), forming a first semiconductor region which has a second conductivity type and has third concentration in the first region of the semiconductor substrate;

(f) after the step (d), forming a second semiconductor region which has the first conductivity type and has fourth concentration in the first region of the semiconductor substrate;

(g) after the step (d), forming a third semiconductor region which has the second conductivity type and has a fifth concentration of impurity concentration higher than the third concentration in the second region of the semiconductor substrate;

(h) after the step (d), forming a fourth semiconductor region which has the first conductivity type and has a sixth concentration of impurity concentration higher than the fourth concentration in the second region of the semiconductor substrate;

(i) after the steps from (e) to (h), forming an insulation film at a side wall of the first gate electrode and the second gate electrode; and (j) after the step (i), forming a fifth and a sixth semiconductor region which have the second conductivity type and have a seventh concentration of impurity concentration higher than the third and the fifth concentration in the first and the second region of the semiconductor substrate, respectively.

Advantages achieved by some of the most typical aspects of the invention disclosed in the present application will be briefly described below.

In the chip with which a plurality of MISFET from which threshold value voltage differs is intermingled, leakage current, such as GIDL current and BTBT current, can be suppressed, inhibiting the short channel effect of MISFET.

DETAILED DESCRIPTION OF THE PREFERRED EMBODIMENTS

Figure 1:
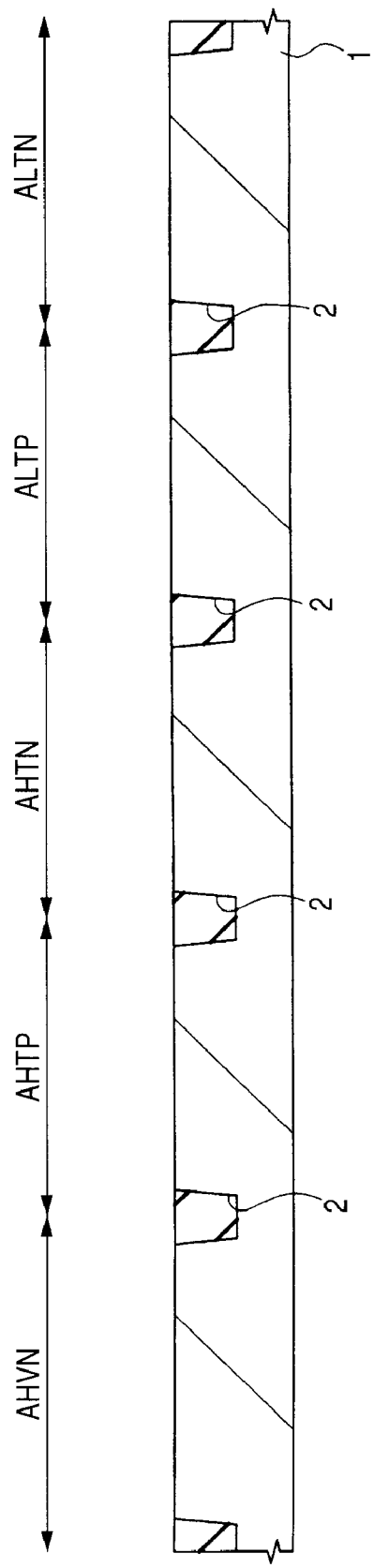
FIG. 1 is a principal part cross-sectional view explaining the manufacturing method of the semiconductor integrated circuit device of Embodiment 1 of the present invention.

In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated.

And, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number.

Furthermore, in the below-described embodiments, it is needless to say that the constituting elements (including element steps) are not always essential unless otherwise specifically indicated or principally apparent that they are essential. It cannot be overemphasized that it does not eliminate other element about a constituent element etc. except for the case where a clear statement of the purport that it is the only element is done, in an example etc. especially when saying, "It consists of A".

Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range.

When making reference about material etc., except for the time that the specification of the purport that it is especially not so is done, or the time that it is not so theoretically or in situation, the specified materials are main materials and do not eliminate a secondary element, an additive, an addition element, etc. For example, a silicon member shall include not only the case of pure silicon but an addition impurity, alloys which use silicon as main elements, such as an alloy of 2 elements and 3 elements etc. (for example, SiGe), etc., removing the case where a clear statement is done especially etc.

And, in all the drawings for describing the embodiments, members of a like function will be identified by like reference numerals in principle and overlapping descriptions will be omitted.

Hereafter, embodiments of the invention are explained in detail based on drawings.

Embodiment 1

The semiconductor integrated circuit device of Embodiment 1 includes the CMOS logic LSI mounted, for example in mobile communications apparatus, such as a cellular phone. The manufacturing process of the semiconductor integrated circuit device of such Embodiment 1 is explained to process order using FIG. 1-FIG. 22.

FIG. 1-FIG. 22 show the principal part section of the semiconductor substrate (it is merely hereafter described as a substrate) in the manufacturing process of the semiconductor integrated circuit device of Embodiment 1 to process order, and show the section of the same part of the substrate, respectively. The logical circuit, the input and output circuit, etc. are formed in CMOS logic LSI. MISFET with relatively high threshold value voltage and MISFET with relatively low threshold value voltage are included in MISFET which forms the logical circuit. Into the portion which determines the working speed of a circuit among MISFET which forms a logical circuit, MISFET with relatively low threshold value voltage is arranged. MISFET (a breakdown voltage is about 3.3V) with a relatively larger breakdown voltage than MISFET (a breakdown voltage is about 1.2V) which forms a logical circuit is included in MISFET which forms an input and output circuit etc. In FIG. 1-FIG. 22, among MISFET's which form the logical circuit, region (first region) AHTN in which n channel type MISFET with relatively high threshold value voltage is formed, region (third region) AHTP in which p channel type MISFET with relatively high threshold value voltage is formed, region (second region) ALTN in which n channel type MISFET with relatively low threshold value voltage is formed, region (fourth region) ALTP in which p channel type MISFET with relatively low threshold value voltage is formed, and region (fifth region) AHVN in which n channel type MISFET with a relatively large breakdown voltage which forms the input and output circuit etc. is formed are illustrated. Although illustration in FIG. 1-FIG. 22 is omitted, the region where p channel type MISFET with a relatively large breakdown voltage which forms an input and output circuit etc. is formed in the substrate is also secured.

First, as shown in FIG. 1, a thin silicon oxide film of about thickness of 10 nm (pad oxide film) is formed in the main surface by heat-treating substrate 1 which is made of the single crystal silicon at about 850° C., and whose specific resistance is about 10 Ωcm. Subsequently, after depositing a silicon nitride film of about thickness of 120 nm with the CVD (Chemical Vapor Deposition) method on this silicon oxide film, the silicon nitride film and the silicon oxide film of the element isolation region are removed by dry etching which used the photoresist film as a mask. When densifying (thermally tightening) the silicon oxide film embedded to the inside of the element isolation trench at the later step, the silicon oxide film is formed in order to ease the stress applied to the substrate. Since the silicon nitride film has the character which cannot oxidize easily, it is used as a mask which prevents oxidization on the front surface of the substrate of the lower part (active region).

Then, after forming the trench of about the depth of 350 nm in substrate 1 of the element isolation region by dry etching which used the silicon nitride film as a mask, in order to remove the damaged layer generated in the inner wall of the trench by etching, the thin silicon oxide film of the thickness of about 10 nm is formed in the inner wall of the trench by heat-treating semiconductor substrate 1 at about 1000° C.

Then, after depositing a silicon oxide film on substrate 1 with a CVD method, in order to improve the membranous quality of this silicon oxide film, the silicon oxide film is densifyed (thermally tightened) by heat-treating semiconductor substrate 1. Then, element isolation trench 2 where planarizing of the front surface was done is formed by leaving the inside of the trench by polishing the silicon oxide film by the chemical mechanical polishing (Chemical Mechanical Polishing; CMP) method which used the silicon nitride film as a stopper.

Figure 2:
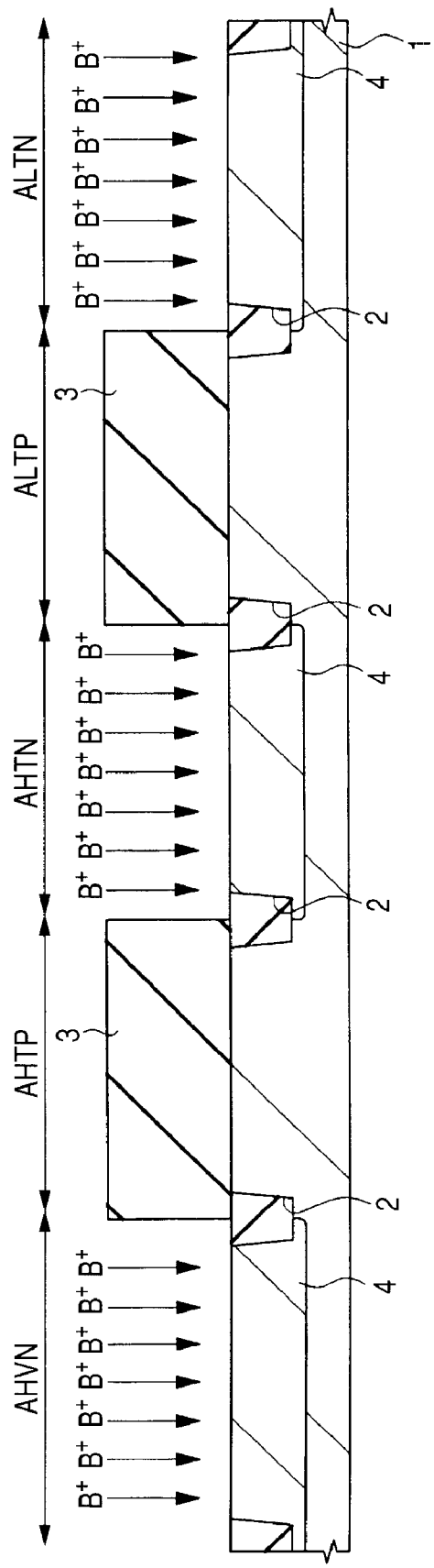
FIG. 2 is a principal part cross-sectional view in the manufacturing process of the semiconductor integrated circuit device following FIG. 1.

Then, after removing the silicon nitride film which remained on the active region of substrate 1 by the wet etching using heat phosphoric acid, as shown in FIG. 2, photoresist film 3 is formed on substrate 1. Photoresist film 3 is left in the regions in which n channel MISFET is not formed, such as region AHTP and ALTP, by patterning the photoresist film 3 with photolithography technology. Subsequently, p type well 4 is formed by doing the ion implantation of the B (boron) to the regions in which n channel MISFET is formed, such as regions AHVN, AHTN, and ALTN, by using photoresist film 3 as a mask.

Figure 3:
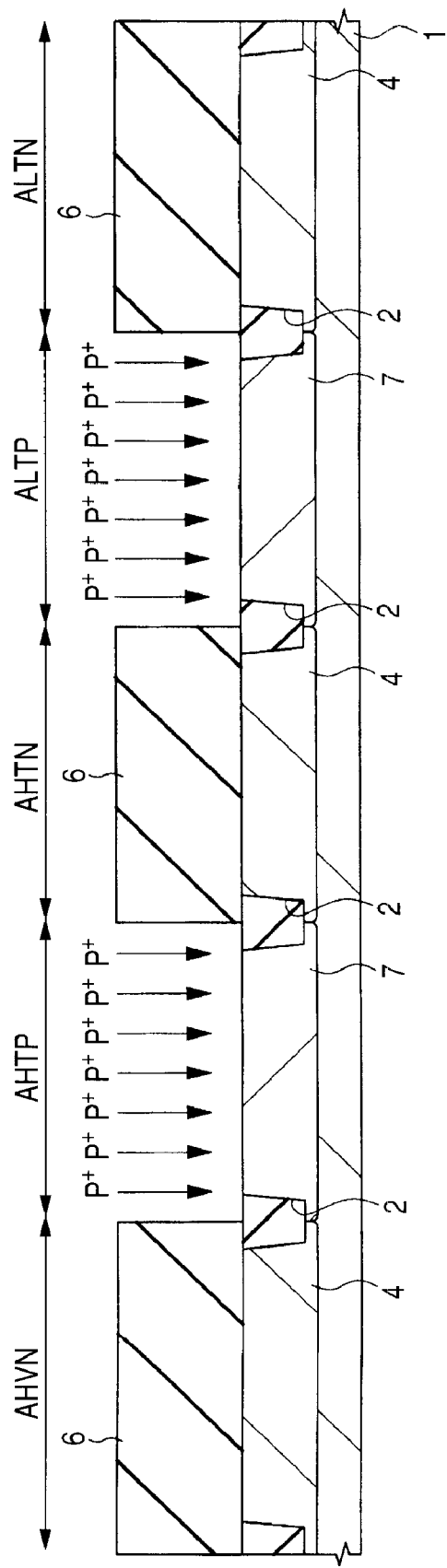
FIG. 3 is a principal part cross-sectional view in the manufacturing process of the semiconductor integrated circuit device following FIG. 2.

Next, after removing photoresist film 3, as shown in FIG. 3, photoresist film 6 is formed on substrate 1, and the photoresist film 6 is patterned with photolithography technology. This leaves photoresist film 6 to the regions in which p channel MISFET is not formed, such as regions AHVN, AHTN, and ALTN. Subsequently, by using photoresist film 6 as a mask, the ion implantation of the P (phosphorus) is done to the regions in which p channel MISFET is formed, such as regions AHTP and ALTP, and n type well 7 is formed in them.

Figure 4:
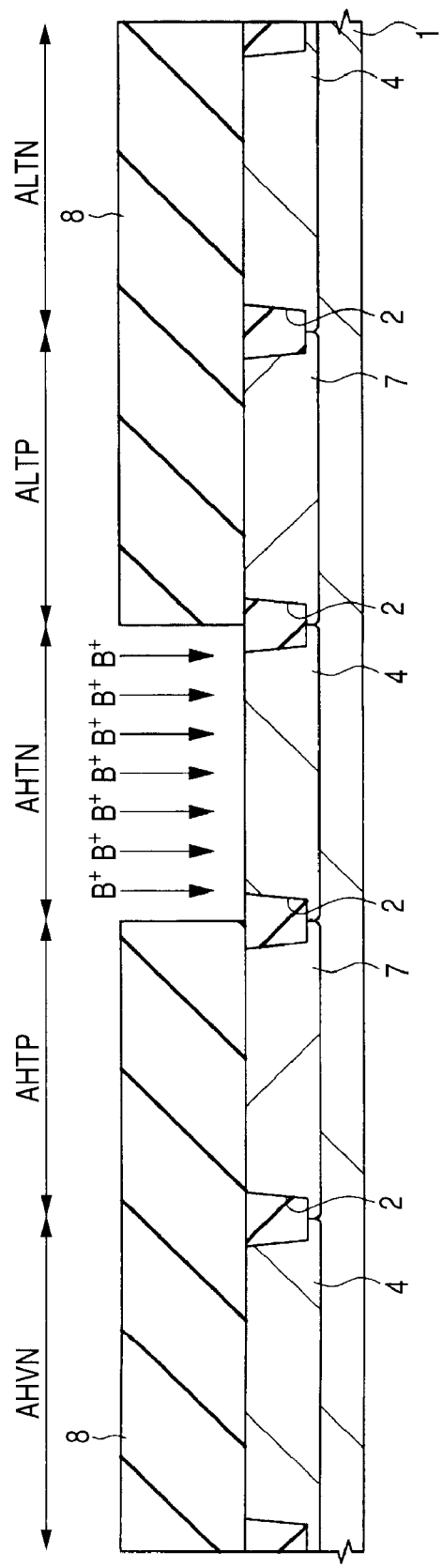
FIG. 4 is a principal part cross-sectional view in the manufacturing process of the semiconductor integrated circuit device following FIG. 3.

Next, after removing photoresist film 6, as shown in FIG. 4, photoresist film 8 is left behind to regions other than region AHTN by forming photoresist film 8 and patterning the photoresist film 8 with photolithography technology on substrate 1. Then, the ion implantation of the impurity, for example, B or $BF_2$ (boron difluoride), which has a p type conductivity type (first conductivity type) is done to region AHTN by using patterned photoresist film 8 as a mask. The threshold value voltage of n channel type MISFET with relatively high threshold value voltage formed in region AHTN is adjusted by the ion implantation of this B.

Figure 5:
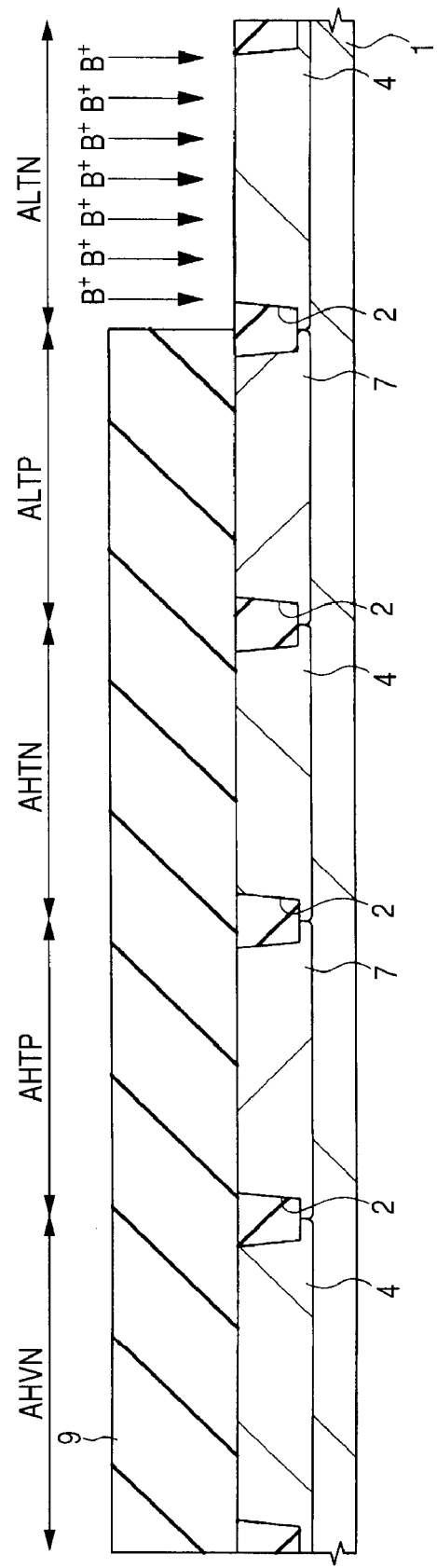
FIG. 5 is a principal part cross-sectional view in the manufacturing process of the semiconductor integrated circuit device following FIG. 4.

Next, after removing photoresist film 8, as shown in FIG. 5, on substrate 1, photoresist film 9 is formed and the photoresist film 9 is patterned with photolithography technology. This leaves photoresist film 9 to regions other than region ALTN. Then, the ion implantation of the impurity, for example, B or $BF_2$, which has a p type conductivity type is done to region ALTN by using patterned photoresist film 9 as a mask. The threshold value voltage of n channel type MISFET with relatively low threshold value voltage formed in region ALTN is adjusted by the ion implantation of this B. The concentration (second concentration) of B whose ion implantation is done to region ALTN is made to become lower than the concentration (first concentration) of B (refer to FIG. 4) which is implanted into above-mentioned region AHTN at this time.

Figure 6:
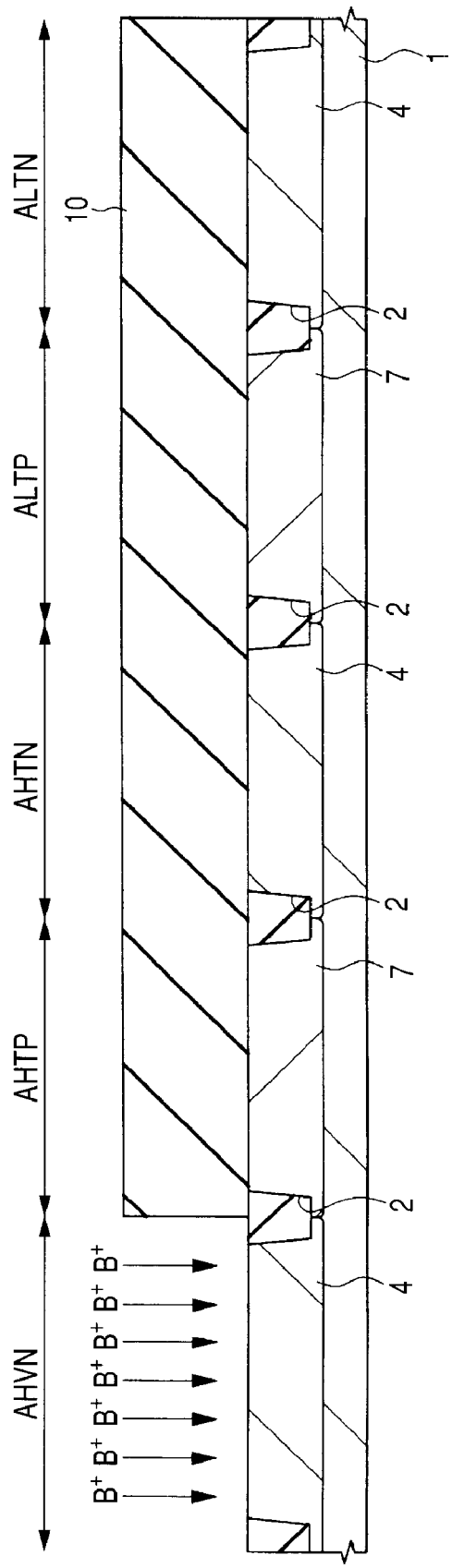
FIG. 6 is a principal part cross-sectional view in the manufacturing process of the semiconductor integrated circuit device following FIG. 5.

Next, after removing photoresist film 9, as shown in FIG. 6, on substrate 1, photoresist film 10 is formed and the photoresist film 10 is patterned with photolithography technology. This leaves photoresist film 10 to regions other than region AHVN. Then, the ion implantation of the impurity, for example, B or $BF_2$, which has a p type conductivity type is done to region AHVN by using patterned photoresist film 10 as a mask. The threshold value voltage of n channel type MISFET with a large breakdown voltage formed in region AHVN is adjusted by the ion implantation of this B.

Figure 7:
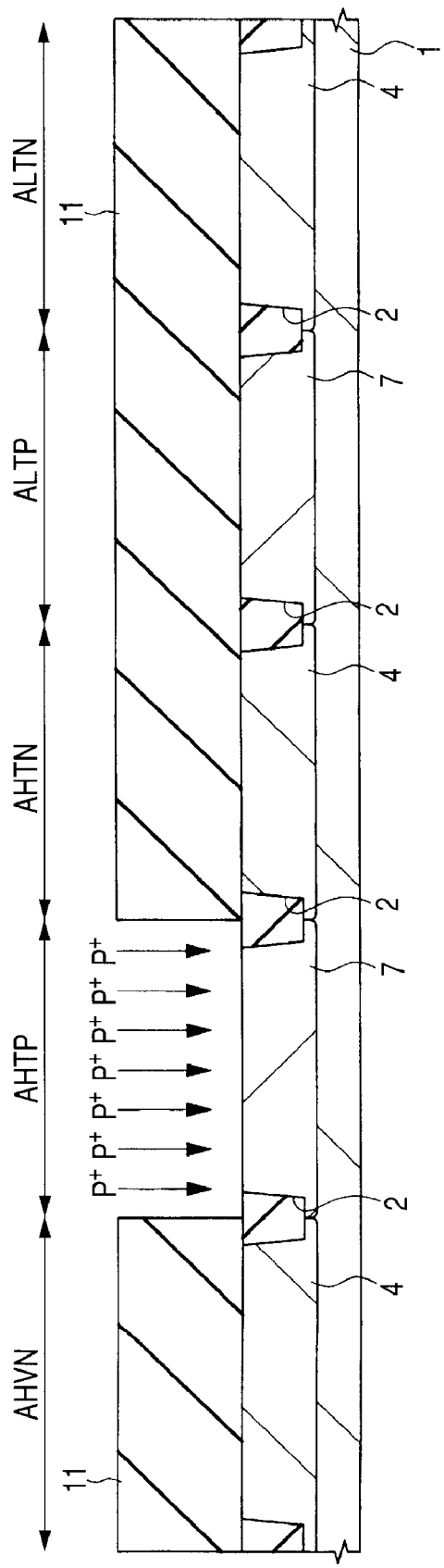
FIG. 7 is a principal part cross-sectional view in the manufacturing process of the semiconductor integrated circuit device following FIG. 6.

Next, after removing photoresist film 10, as shown in FIG. 7, on substrate 1, photoresist film 11 is formed and the photoresist film 11 is patterned with photolithography technology. This leaves photoresist film 11 to regions other than region AHTP. Then, the ion implantation of the impurity which has an n type conductivity type, for example, the P, is done to region AHTP by using patterned photoresist film 11 as a mask. The threshold value voltage of p channel type MISFET with relatively high threshold value voltage formed in region AHTP is adjusted by the ion implantation of this P.

Figure 8:
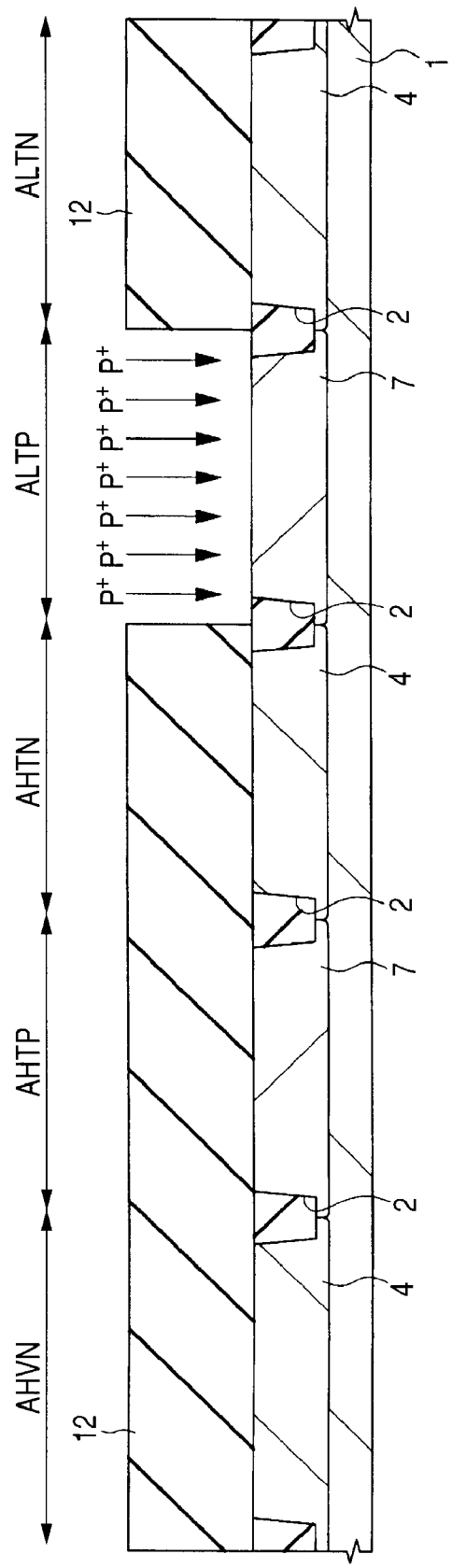
FIG. 8 is a principal part cross-sectional view in the manufacturing process of the semiconductor integrated circuit device following FIG. 7.

Next, after removing photoresist film 11, as shown in FIG. 8, on substrate 1, photoresist film 12 is formed and the photoresist film 12 is patterned with photolithography technology. This leaves photoresist film 12 to regions other than region ALTP. Then, the ion implantation of the impurity which has an n type conductivity type, for example, the P, is done to region ALTP by using patterned photoresist film 12 as a mask. The threshold value voltage of p channel type MISFET with relatively low threshold value voltage formed in region ALTP is adjusted by the ion implantation of this P. The concentration (ninth concentration) of P whose ion implantation is done to region ALTP is made to become lower than the concentration (eighth concentration) of P which is implanted into above-mentioned region AHTP (refer to FIG. 7) at this time.

Next, after removing photoresist film 12, although illustration is omitted, the ion implantation of the impurity which has an n type conductivity type, for example, the P, is done to the region in which p channel type MISFET with a relatively large breakdown voltage is formed by using as a mask the photoresist film newly patterned by photolithography technology. The threshold value voltage of p channel type MISFET with a relatively large breakdown voltage is adjusted by the ion implantation of this P. The concentration of P whose ion implantation is done at this time is made to become lower than the concentration of P which is implanted into above-mentioned region ALTP (refer to FIG. 8).

The ion implantation for the threshold value voltage adjustment of MISFET to each of the regions AHTN, ALTN, AHVN, AHTP and ALTP explained using FIG. 4-FIG. 8, and the region in which p channel type MISFET with a relatively large breakdown voltage is formed is not necessary to necessarily carry out by the process order explained using above-mentioned FIG. 4-FIG. 8, and any region may become first.

Figure 9:
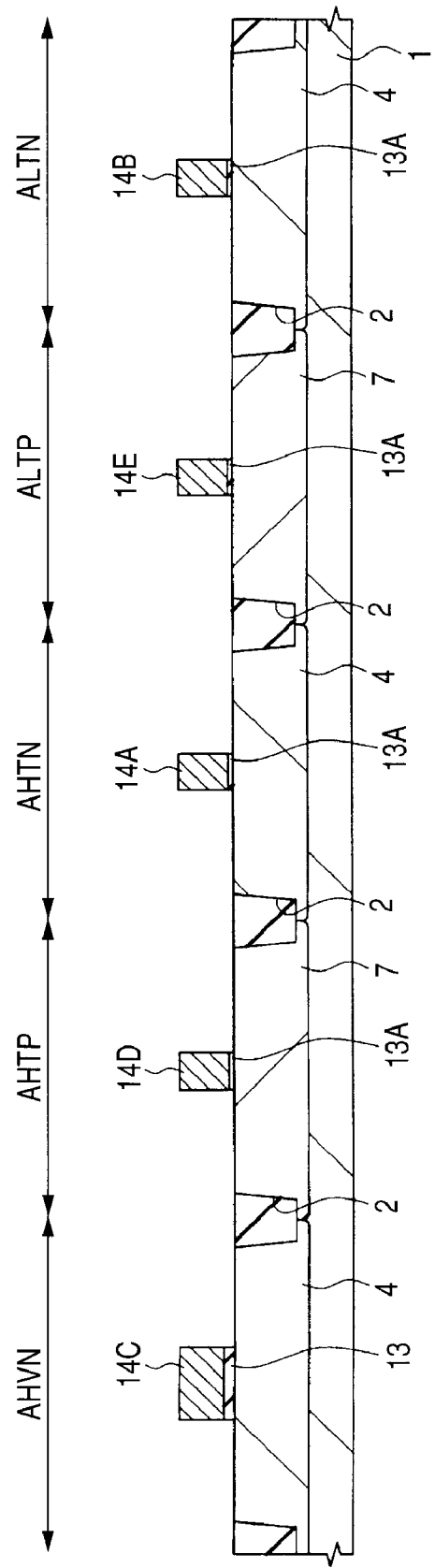
FIG. 9 is a principal part cross-sectional view in the manufacturing process of the semiconductor integrated circuit device following FIG. 8.

Next, as shown in FIG. 9, wet cleaning of the main surface of substrate 1 (p type well 4 and n type well 7) is done using the cleaning liquid of a fluoric acid system. Then, gate insulating film 13 which consists of a pure oxide film is formed in each front surface of p type well 4 and n type well 7 by the thermal oxidation of about 800° C. Then, the cleaning treatment (wet etching) which used the photoresist film as the mask removes gate insulating film 13 of regions other than region AHVN. Subsequently, after removing the photoresist film, gate insulating film 13A thinner than gate insulating film 13 is formed in each front surface of p type well 4 and n type well 7 of regions other than region AHVN by performing thermal oxidation processing to substrate 1 again. In Embodiment 1, it can be exemplified that the thickness of gate insulating film 13 constitutes a thickness of about 7.6 nm, and the thickness of gate insulating film 13A constitutes about 2 nm.

Then, the low resistance polycrystalline silicon film of thickness of about 100 nm (conductive film) is deposited on the upper part of gate insulating films 13 and 13A as a conductor film, for example with a CVD method. Then, the polycrystalline silicon film is patterned by the dry etching which used as the mask the photoresist film patterned by photolithography technology. This forms gate electrodes 14A, 14B, 14C, 14D, and 14E in regions AHTN, ALTN, AHVN, AHTP, and ALTP, respectively. A gate electrode is formed also in the region in which p channel type MISFET with a relatively large breakdown voltage is formed at this time. Gate electrode 14C of n channel type MISFET with a relatively large breakdown voltage, and the gate electrode of p channel type MISFET with a relatively large breakdown voltage are formed with the size of gate length becoming long, and have the structure which can secure the breakdown voltage compared with the gate electrodes (14A, 14B, 14D, 14E, etc.) of other MISFET with a relatively small breakdown voltage.

Figure 10:
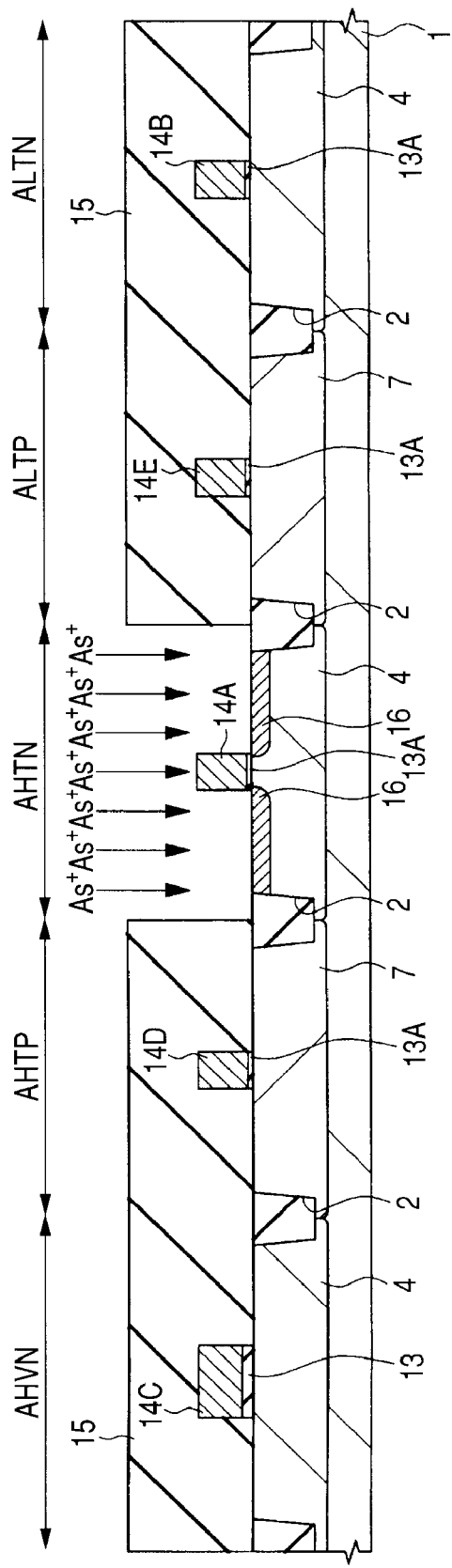
FIG. 10 is a principal part cross-sectional view in the manufacturing process of the semiconductor integrated circuit device following FIG. 9.

Next, as shown in FIG. 10, on substrate 1, photoresist film 15 is formed and the photoresist film 15 is patterned with photolithography technology. This leaves photoresist film 15 to regions other than region AHTN. Then, the ion implantation of the impurity which has an n type conductivity type (second conductivity type), for example, the As, (arsenic) is done to region AHTN by using patterned photoresist film 15 as a mask. This forms n⁻ type semiconductor region (first semiconductor region) 16 which becomes a part of source/drain of n channel type MISFET with relatively high threshold value voltage in p type well 4 of the both sides of gate electrode 14A. As ion implantation conditions at this time, it can be exemplified setting implantation energy to about 3 keV, and setting implantation amount to about 7×10¹⁴/cm². The means which does the ion implantation of the P instead of As is also considered. When P is used, while the effect that the pn junction of n channel type MISFET in region AHTN becomes deep, and can ease the electric field concentration to the source/drain can be acquired, compared with the case where As is used, drain current will become small. Therefore, it can be exemplified that which shall be used between P or As is chosen suitably according to the characteristics of n channel type MISFET to form.

Figure 11:
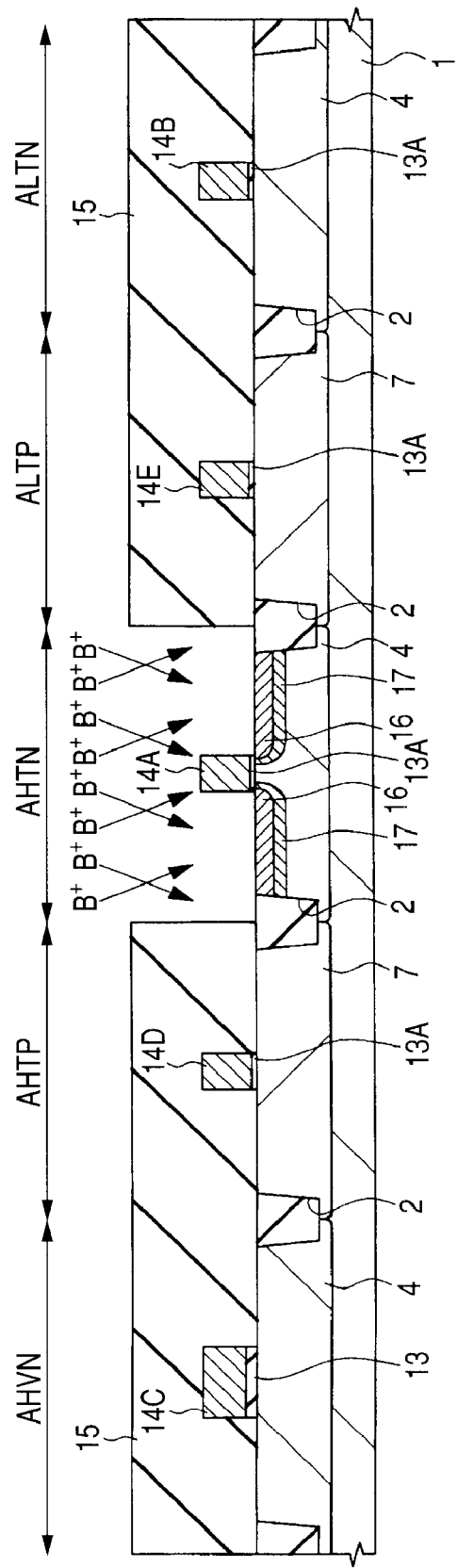
FIG. 11 is a principal part cross-sectional view in the manufacturing process of the semiconductor integrated circuit device following FIG. 10.

Next, as shown in FIG. 11, the ion implantation of the impurity which has a p type conductivity type, for example, the B, is done to region AHTN by using the above-mentioned photoresist film 15 as a mask, and punch-through stopper layer 17 is formed. As ion implantation conditions at this time, it can be exemplified setting implantation energy to about 10 keV, and setting implantation amount to about 5×10¹³/cm². B is implanted from an oblique direction to the main surface of substrate 1 at this time. For example, B is implanted from the direction parallel and vertical to the extending direction of gate electrode 14A in plane, rotating substrate 1 every 90° along the main surface. Thereby, punch-through stopper layer 17 can be formed so that n⁻ type semiconductor region 16 may be surrounded. By forming this punch-through stopper layer (second semiconductor region) 17, it becomes possible to prevent a punch through occurring in n channel type MISFET formed in region AHTN even when the microfabrication of gate electrode 14A progresses.

n⁻ type semiconductor region 16 and punch-through stopper layer 17 are formed using the same photoresist film 15 as a mask. This makes it possible to aim at simplification of a manufacturing process. Punch-through stopper layer 17 can be formed first, and n⁻ type semiconductor region 16 can also be formed after that. This is the same about the below-mentioned n⁻ type semiconductor region 19 and punch-through stopper layer 20, and p⁻ type semiconductor regions 22 and 23 and punch-through stopper layers 24 and 25.

Figure 12:
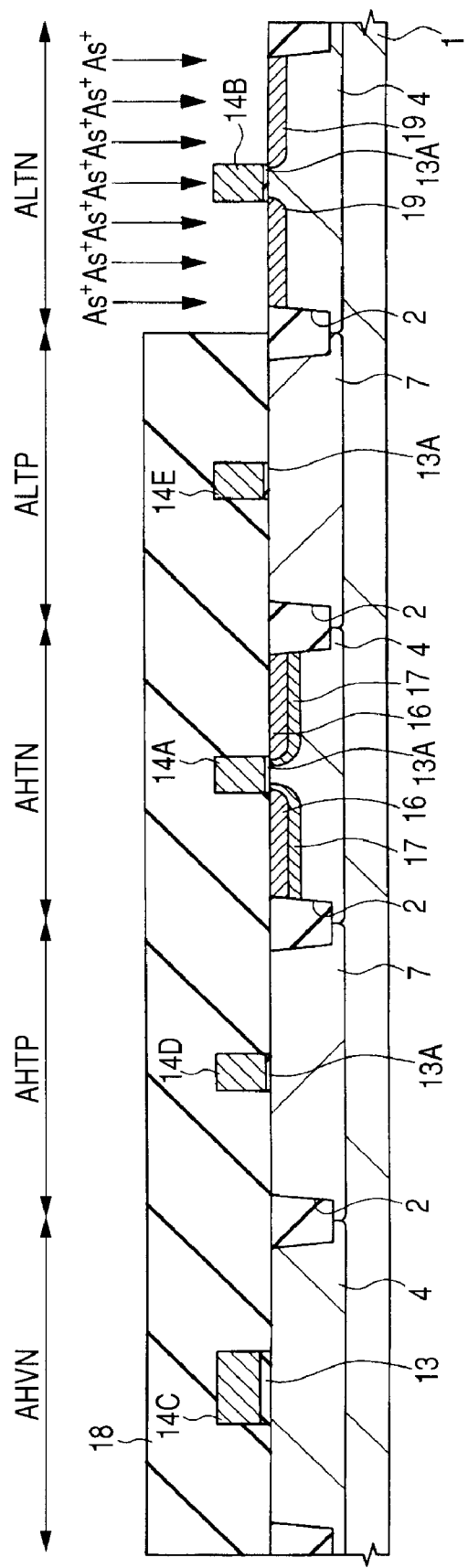
FIG. 12 is a principal part cross-sectional view in the manufacturing process of the semiconductor integrated circuit device following FIG. 11.

Next, after removing photoresist film 15, as shown in FIG. 12, on substrate 1, photoresist film 18 is formed and the photoresist film 18 is patterned with photolithography technology. This leaves photoresist film 18 to regions other than region ALTN. Then, the ion implantation of the impurity which has an n type conductivity type, for example, the As, is done to region ALTN by using patterned photoresist film 18 as a mask. This forms n⁻ type semiconductor region (third semiconductor region) 19 which becomes a part of source/drain of n channel type MISFET with relatively low threshold value voltage in p type well 4 of the both sides of gate electrode (second gate electrode) 14B. It can be exemplified making it more than the amount of ion implantation (third concentration) of As at the time of formation of n⁻ type semiconductor region 16 and being referred to as about $1 \times 10^{15}/cm^2$ (fifth concentration) as ion implantation conditions at this time. Thereby, the drain current of n channel type MISFET with relatively low threshold value voltage formed in region ALTN can be made larger than the drain current of n channel type MISFET with relatively high threshold value voltage formed in region AHTN. It can be exemplified setting implantation energy to about 3 keV.

Figure 13:
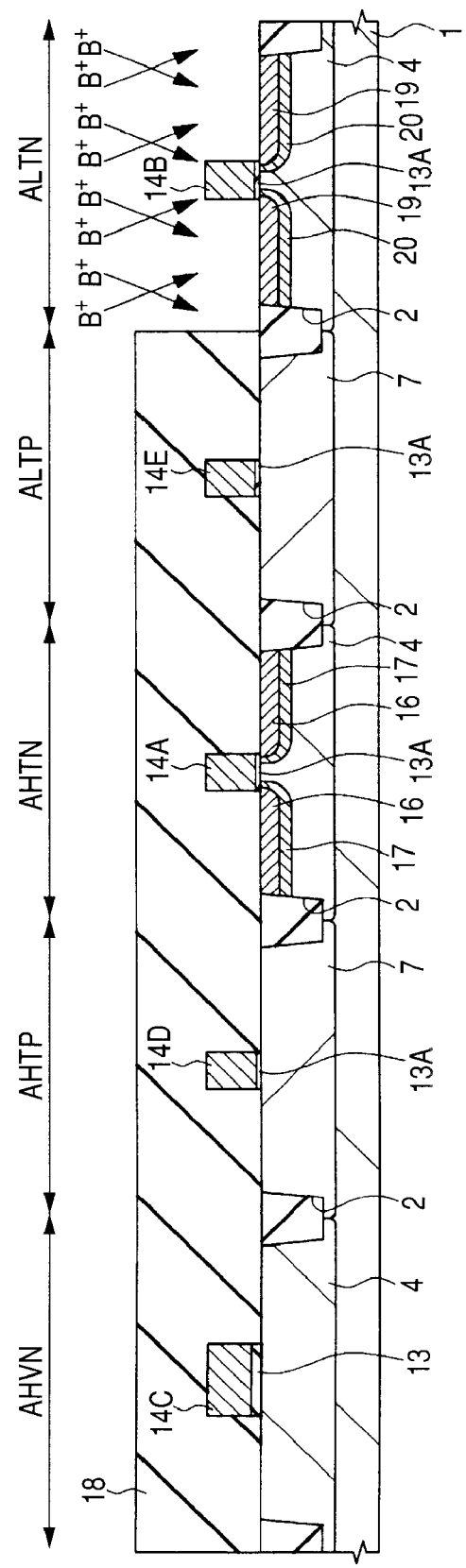
FIG. 13 is a principal part cross-sectional view in the manufacturing process of the semiconductor integrated circuit device following FIG. 12.

Next, as shown in FIG. 13, the ion implantation of the impurity which has a p type conductivity type, for example, the B, is done to region ALTN by using the above-mentioned photoresist film 18 as a mask, and punch-through stopper layer (fourth semiconductor region) 20 is formed. It can be exemplified making it more than the amount of ion implantation (fourth concentration) of B at the time of formation of punch-through stopper layer 17 and being referred to as about $7 \times 10^{13}/cm^2$ (sixth concentration) as ion implantation conditions at this time. Implantation energy is set to about 10 keV, and it is implanted from an oblique direction to the main surface of substrate 1 like the time of formation of punch-through stopper layer 17. Thereby, punch-through stopper layer 20 can be formed so that n⁻ type semiconductor region 19 may be surrounded. By forming this punch-through stopper layer 20, even when the microfabrication of gate electrode 14B progresses, it becomes possible to prevent a punch through occurring in n channel type MISFET formed in region ALTN.

As mentioned above, the implantation amount of As at the time of forming n⁻ type semiconductor region 19 which becomes a part of source/drain of n channel type MISFET with relatively low threshold value voltage in Embodiment 1 is made larger than the implantation amount of As at the time of forming n⁻ type semiconductor region 16 which becomes a part of source/drain of n channel type MISFET with relatively high threshold value voltage. Therefore, when the implantation amount of B at the time of forming a punch-through stopper layer is kept as the same in both n channel type MISFET, in n channel type MISFET with relatively low threshold value voltage, we will be anxious about the inconvenience that short channel characteristics will fall. So, in Embodiment 1, the implantation amount of B at the time of forming punch-through stopper layer 20 of n channel type MISFET with relatively low threshold value voltage is made larger than the implantation amount of B at the time of forming punch-through stopper layer 17 of n channel type MISFET with relatively high threshold value voltage. This makes it possible to improve the short channel characteristics of n channel type MISFET with relatively low threshold value voltage.

Figure 14:
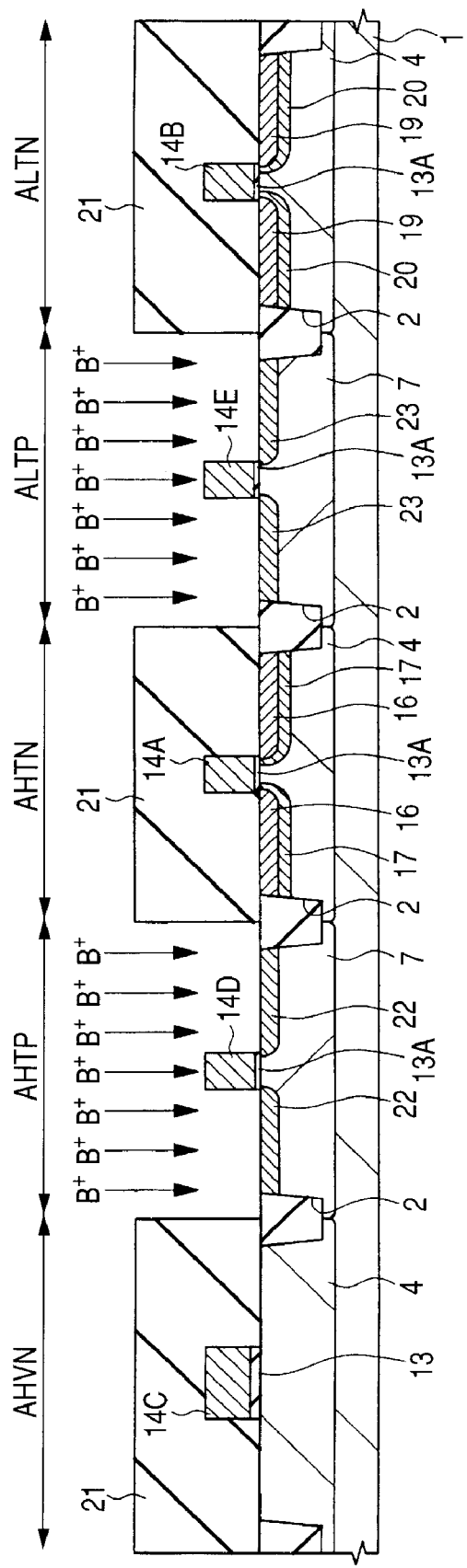
FIG. 14 is a principal part cross-sectional view in the manufacturing process of the semiconductor integrated circuit device following FIG. 13.

Next, after removing photoresist film 18, as shown in FIG. 14, on substrate 1, photoresist film 21 is formed and the photoresist film 21 is patterned with photolithography technology. This leaves photoresist film 21 to regions other than regions AHTP and ALTP. Then, the ion implantation of the impurity which has a p type conductivity type, for example, the B, is done to regions AHTP and ALTP by using patterned photoresist film 21 as a mask. In n type well 7 of the both sides of gate electrode (third gate electrode) 14D and gate electrode (fourth gate electrode) 14E, p⁻ type semiconductor region 22 which becomes a part of source/drain of p channel type MISFET with relatively high threshold value voltage and p⁻ type semiconductor region which becomes a part of source/drain of p channel type MISFET with relatively low threshold value voltage (seventh semiconductor region) 22 and 23 are formed.

Figure 15:
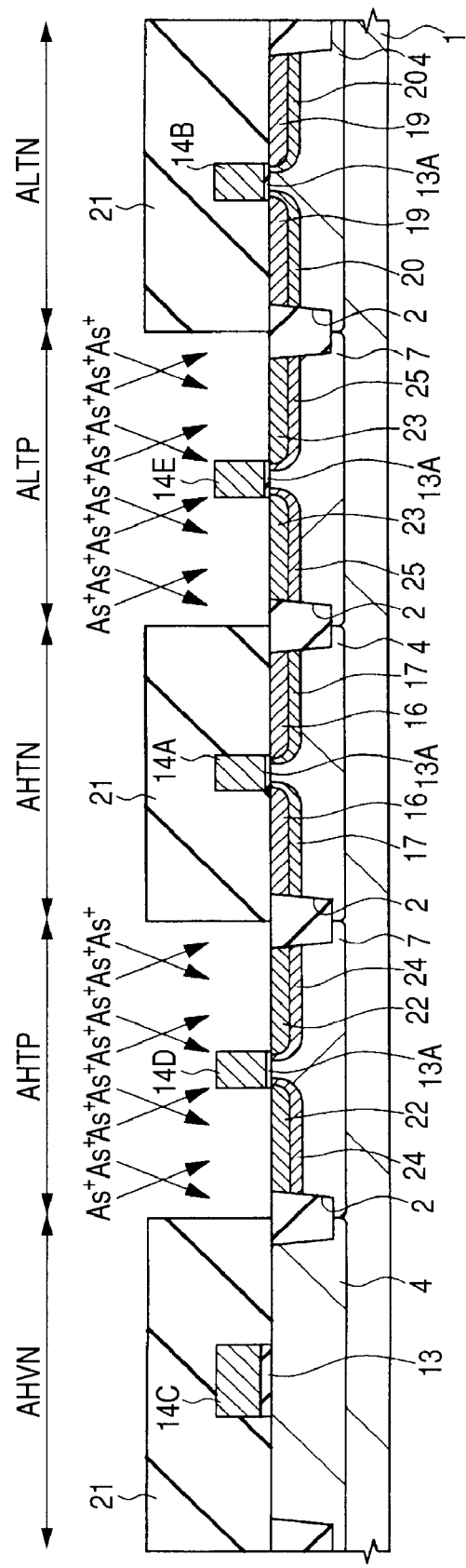
FIG. 15 is a principal part cross-sectional view in the manufacturing process of the semiconductor integrated circuit device following FIG. 14.

Next, by doing the ion implantation of the impurity which has an n type conductivity type, for example, the As, to regions AHTP and ALTP by using the above-mentioned photoresist film 21 as a mask, as shown in FIG. 15, punch-through stopper layers (eighth semiconductor region) 24 and 25 are formed in each of regions AHTP and ALTP. As ion implantation conditions at this time, it is implanted from an oblique direction to the main surface of substrate 1 like the time of formation of punch-through stopper layers 17 and 20. Thereby, punch-through stopper layers 24 and 25 can be formed so that p⁻ type semiconductor regions 22 and 23 may be surrounded, respectively. It becomes possible to prevent a punch through occurring in p channel type MISFET formed in regions AHTP and ALTP by forming these punch-through stopper layers 24 and 25.

In p channel type MISFET, it is hard to generate leakage current, such as GIDL current and BTBT current, compared with n channel type MISFET. Therefore, the step which forms p⁻ type semiconductor region (22, 23), and the step which forms a punch-through stopper layer (24, 25) can be communized in p channel type MISFET with high threshold value voltage, and p channel type MISFET with low threshold value voltage. Thus, by communizing a step, it becomes possible to reduce the number of manufacturing processes of the semiconductor integrated circuit device of Embodiment 1.

Figure 16:
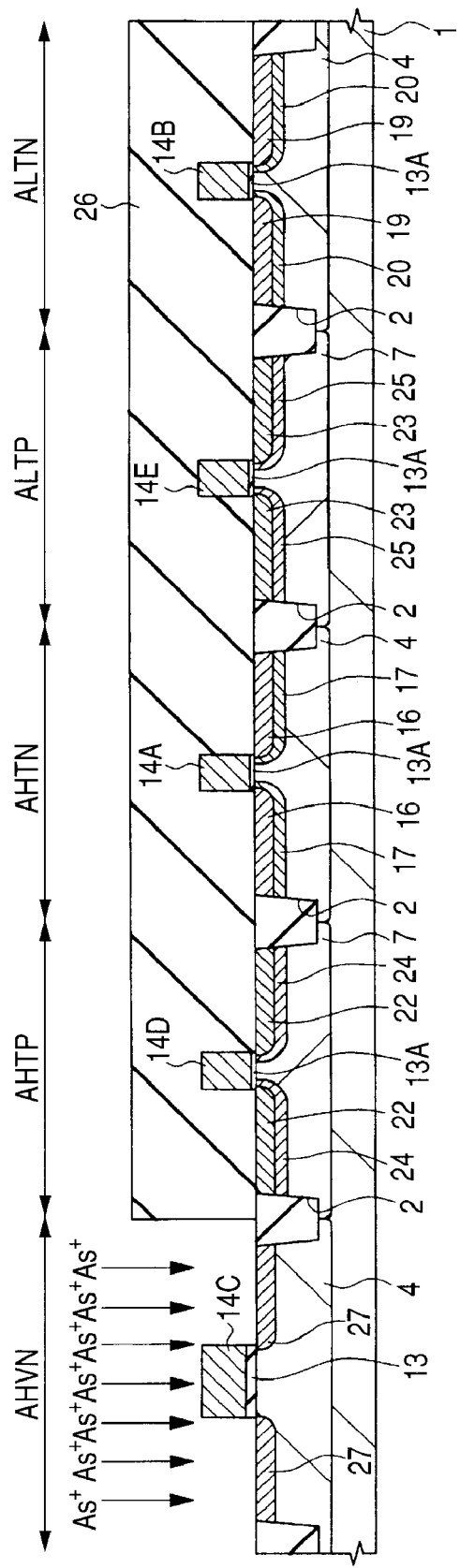
FIG. 16 is a principal part cross-sectional view in the manufacturing process of the semiconductor integrated circuit device following FIG. 15.

Next, after removing photoresist film 21, as shown in FIG. 16, on substrate 1, photoresist film 26 is formed and the photoresist film 26 is patterned with photolithography technology. This leaves photoresist film 26 to regions other than region AHVN. Then, the ion implantation of the impurity which has an n type conductivity type, for example, the As, is done to region AHVN by using patterned photoresist film 26 as a mask. n⁻ type semiconductor region (the 10th semiconductor region) 27 which becomes a part of source/drain of n channel type MISFET with a relatively large breakdown voltage is formed in p type well 4 of the both sides of gate electrode (fifth gate electrode) 14C. The amount of ion implantation of As to region AHVN (the 11th concentration) is made less than the amount of ion implantation of As at the time of formation of n⁻ type semiconductor region 16 (refer to FIG. 10) at this time.

Next, after removing photoresist film 26, on substrate 1, a photoresist film (illustration is omitted) is formed, and the photoresist film 26 is patterned with photolithography technology. This leaves the photoresist film to regions other than the region in which p channel type MISFET with a relatively large breakdown voltage is formed. Then, the ion implantation of the impurity which has a p type conductivity type, for example, the B, is done to the region in which p channel type MISFET with a relatively large breakdown voltage is formed by using the patterned photoresist film as a mask. p⁻ type semiconductor region (illustration is omitted) which becomes a part of source/drain of p channel type MISFET with a relatively large breakdown voltage is formed in n type well 7 of the both sides of the gate electrode currently formed in the region.

Figure 17:
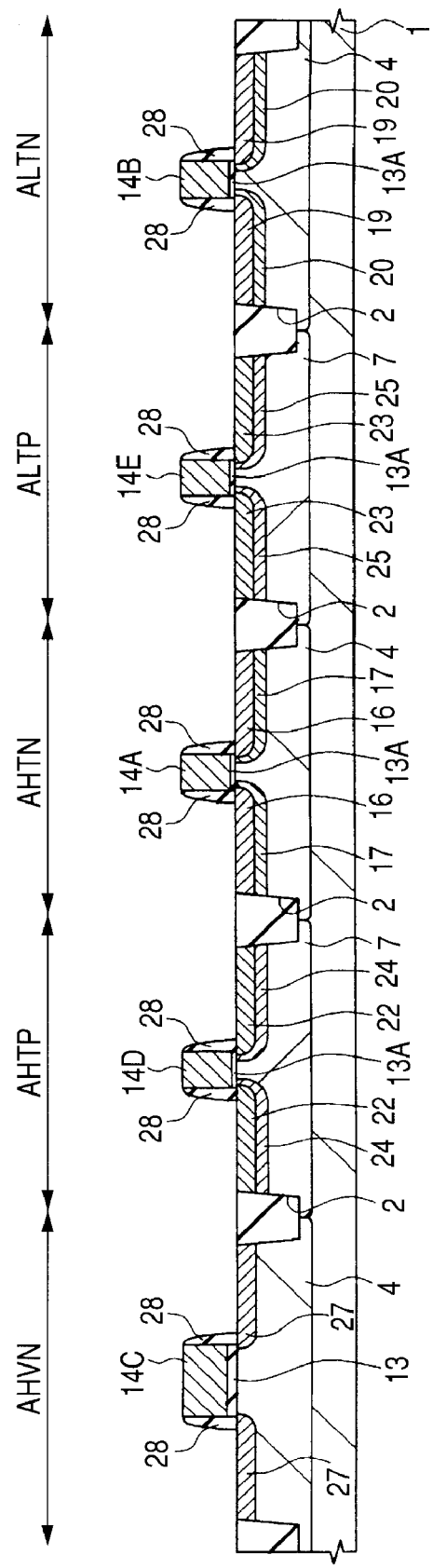
FIG. 17 is a principal part cross-sectional view in the manufacturing process of the semiconductor integrated circuit device following FIG. 16.

Next, after removing the above-mentioned photoresist film used at the time of formation of p⁻ type semiconductor region which becomes a part of source/drain of p channel type MISFET with a relatively large breakdown voltage, as shown in FIG. 17, a silicon oxide film is deposited on substrate 1. Sidewall spacer (insulation film) 28 is formed in the side wall of gate electrodes 14A, 14B, 14C, 14D, and 14E and the gate electrode which is not illustrated by etching the silicon oxide film unisotropically.

Figure 18:
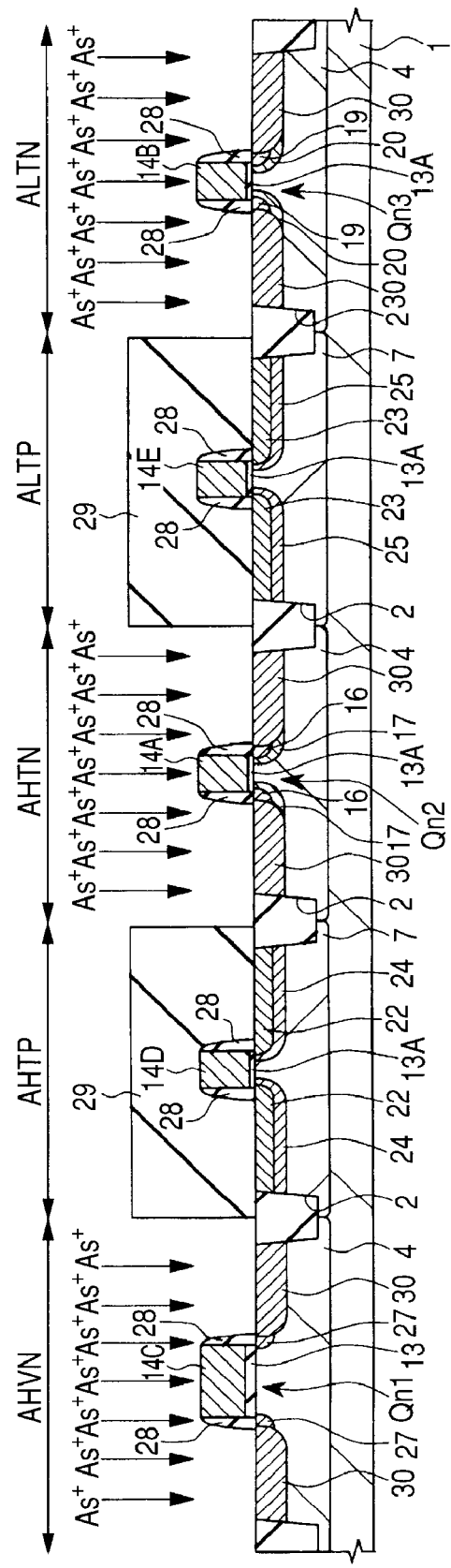
FIG. 18 is a principal part cross-sectional view in the manufacturing process of the semiconductor integrated circuit device following FIG. 17.

Next, as shown in FIG. 18, photoresist film 29 is left to regions other than regions AHVN, AHTN, and ALTN by forming photoresist film 29 and patterning the photoresist film 29 with photolithography technology on substrate 1. Then, by doing the ion implantation of the impurity which has an n type conductivity type, for example, As or P, by seventh concentration to regions AHVN, AHTN, and ALTN by using patterned photoresist film 29 as a mask, n$^+$ type semiconductor region (the fifth semiconductor region, the sixth semiconductor region, the 11th semiconductor region) 30 is formed in regions AHVN, AHTN, and ALTN, respectively. This n$^+$ type semiconductor region 30 becomes a source/drain of n channel type MISFET with a relatively large breakdown voltage in region AHVN, becomes a source/drain of n channel type MISFET with relatively high threshold value voltage in region AHTN, and becomes a source/drain of n channel type MISFET with relatively low threshold value voltage in region ALTN. According to the steps so far, n channel type MISFET (third MISFET) Qn1 which has a relatively larger breakdown voltage (second breakdown voltage) than the breakdown voltage (first breakdown voltage) of other MISFET can be formed in region AHVN. In region AHTN, n channel type MISFET (first MISFET) Qn2 of first threshold value voltage with relatively high threshold value voltage can be formed. In region ALTN, n channel type MISFET (second MISFET) Qn3 of second threshold value voltage with relatively low threshold value voltage can be formed.

Figure 19:
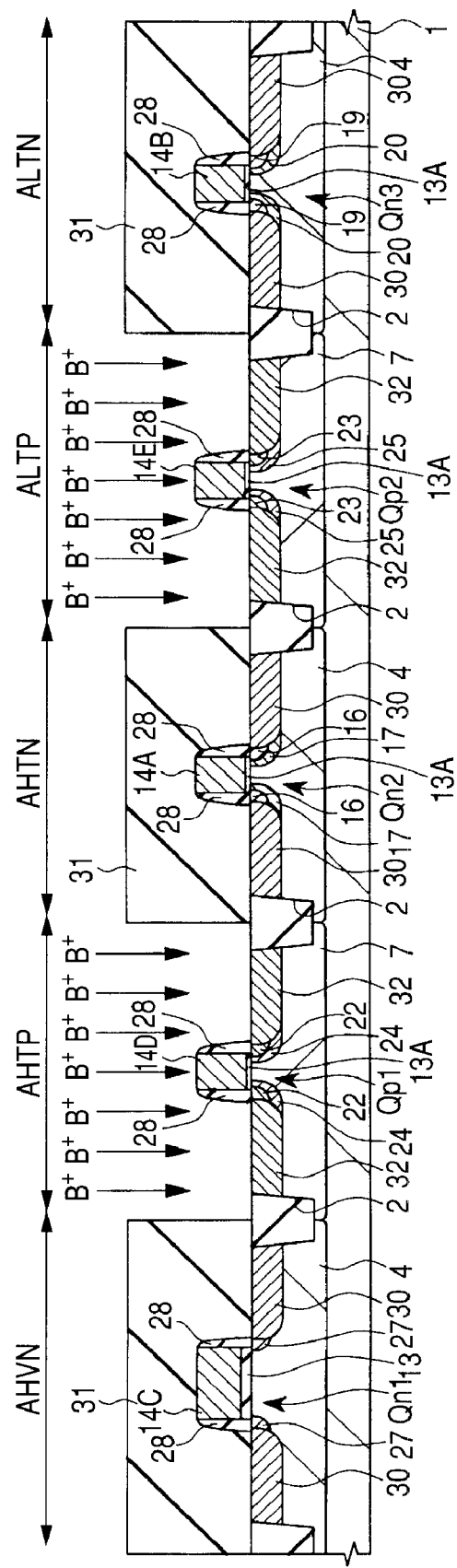
FIG. 19 is a principal part cross-sectional view in the manufacturing process of the semiconductor integrated circuit device following FIG. 18.

Next, after removing photoresist film 29, as shown in FIG. 19, on substrate 1, photoresist film 31 is formed and the photoresist film 31 is patterned with photolithography technology. This leaves photoresist film 31 to regions AHTP, ALTP, and regions other than the region in which p channel type MISFET with a relatively large breakdown voltage is formed. Then, p$^+$ type semiconductor region (ninth semiconductor region) 32 is formed in each region by doing the ion implantation of the impurity, for example, B or BF2, which has a p type conductivity type to regions AHTP and ALTP, and the region in which p channel type MISFET with a relatively large breakdown voltage is formed by using patterned photoresist film 31 as a mask. This p$^+$ type semiconductor region 32 becomes a source/drain of p channel type MISFET with relatively high threshold value voltage in region AHTP, becomes a source/drain of p channel type MISFET with relatively low threshold value voltage in region ALTP, and becomes a source/drain of the p channel type MISFET with a relatively large breakdown voltage in the region in which p channel type MISFET with a relatively large breakdown voltage is formed. According to the steps so far, p channel type MISFET (first p channel type MISFET) Qp1 of third threshold value voltage with relatively high threshold value voltage can be formed in region AHTP. In region ALTP, p channel type MISFET (second p channel type MISFET) Qp2 of fourth threshold value voltage with relatively low threshold value voltage can be formed.

According to the manufacturing process of MISFET of the above Embodiment 1, when 2 kinds of n channel type MISFET Qn2 and Qn3 from which threshold value voltage differs are formed on the same substrate 1, the impurity concentration in n$^-$ type semiconductor region 16 and punch-through stopper layer 17 in n channel type MISFET Qn2 with relatively high threshold value voltage is made lower than the impurity concentration in n$^-$ type semiconductor region 19 and punch-through stopper layer 20 in n channel type MISFET Qn3 with relatively low threshold value voltage, respectively. Thereby, in n channel type MISFET Qn3 with relatively low threshold value voltage, impurity concentration in n$^-$ type semiconductor region 19 and punch-through stopper layer 20 is made high, and it becomes possible to reduce resistance improving short channel characteristics. As a result, the drain current in n channel type MISFET Qn3 with relatively low threshold value voltage can be enlarged more.

On the other hand, in n channel type MISFET Qn2 with relatively high threshold value voltage, impurity concentration in n$^-$ type semiconductor region 16 and punch-through stopper layer 17 is made low, and it becomes possible to ease the electric field near the drain. Although we are anxious about the short channel characteristics of n channel type MISFET Qn2 with relatively high threshold value voltage getting worse by making low impurity concentration in punch-through stopper layer 17, it can be compensated by making low impurity concentration in n$^-$ type semiconductor region 16. As a result, in n channel type MISFET Qn2 with relatively high threshold value voltage, off-state current, such as GIDL current and BTBT current, can be suppressed, inhibiting a short channel effect.

As mentioned above, in Embodiment 1, n channel type MISFET Qn3 and p channel type MISFET Qp2 with relatively low threshold value voltage are used in the portion (portion asked for rapidity) which determines the working speed of the circuit. Since the drain current of n channel type MISFET Qn3 with relatively low threshold value voltage can be enlarged more according to Embodiment 1, it becomes possible to prevent lowering of the working speed of the circuit.

In the portion which is not asked for the rapidity in the circuit, n channel type MISFET Qn2 and p channel type MISFET Qp1 with relatively high threshold value voltage are used. Since the off-state current in n channel type MISFET Qn2 with relatively high threshold value voltage can be suppressed according to Embodiment 1, the power consumption of the semiconductor integrated circuit device of Embodiment 1 can be reduced.

As mentioned above, the semiconductor integrated circuit device of Embodiment 1 includes the CMOS logic LSI mounted in mobile communications apparatus, such as a cellular phone. Since the power supply of mobile communications apparatus is supplied by a battery, in order to improve the temporal duration of the battery, reducing the power consumption of the semiconductor integrated circuit device mounted in mobile communications apparatus is called for. Namely, by using n channel type MISFET Qn3 and p channel type MISFET Qp2 with relatively low threshold value voltage in the portion which determines the working speed of a circuit, and n channel type MISFET Qn2 and p channel type MISFET Qp1 with relatively high threshold value voltage in the portion which is not asked for the rapidity in the circuit like Embodiment 1, the power consumption of the semiconductor integrated circuit device can be reduced, without reducing the working speed of the circuit. As a result, the temporal duration of the battery mounted in mobile communications apparatus can be improved.

Figure 20:
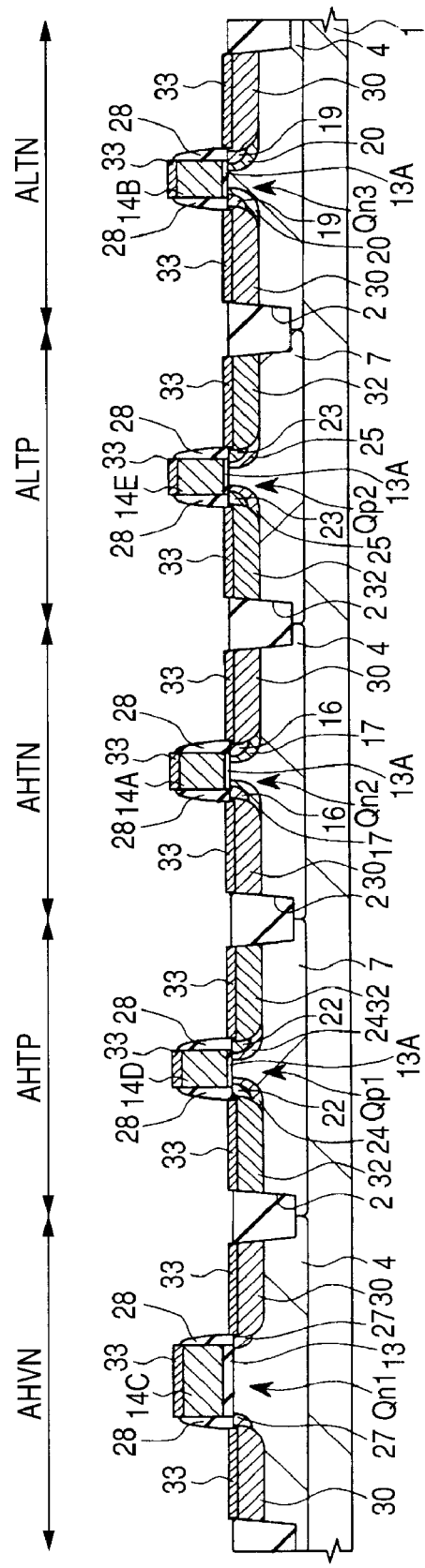
FIG. 20 is a principal part cross-sectional view in the manufacturing process of the semiconductor integrated circuit device following FIG. 19.

Next, after removing photoresist film 31, as shown in FIG. 20, Co (cobalt) film is deposited as a metallic film on substrate 1. Subsequently, by making Co film and Si (silicon) react by heat-treating to substrate 1, CoSi$_2$ film 33 is formed in the front surface of gate electrodes 14A, 14B, 14C, 14D, and 14E, the gate electrode of p channel type MISFET with a relatively large breakdown voltage, n+ type semiconductor region 30, and p+ type semiconductor region 32 as a silicide film. By forming these silicide films, the contact resistance on each gate electrode front surface and the front surface of a semiconductor region can be reduced. In Embodiment 1, although $CoSi_2$ film using Co was exemplified as a silicide film, even if Ni (nickel), Mo (molybdenum), Ti (titanium), etc. are used as other materials, the same effect can be acquired.

Figure 21:
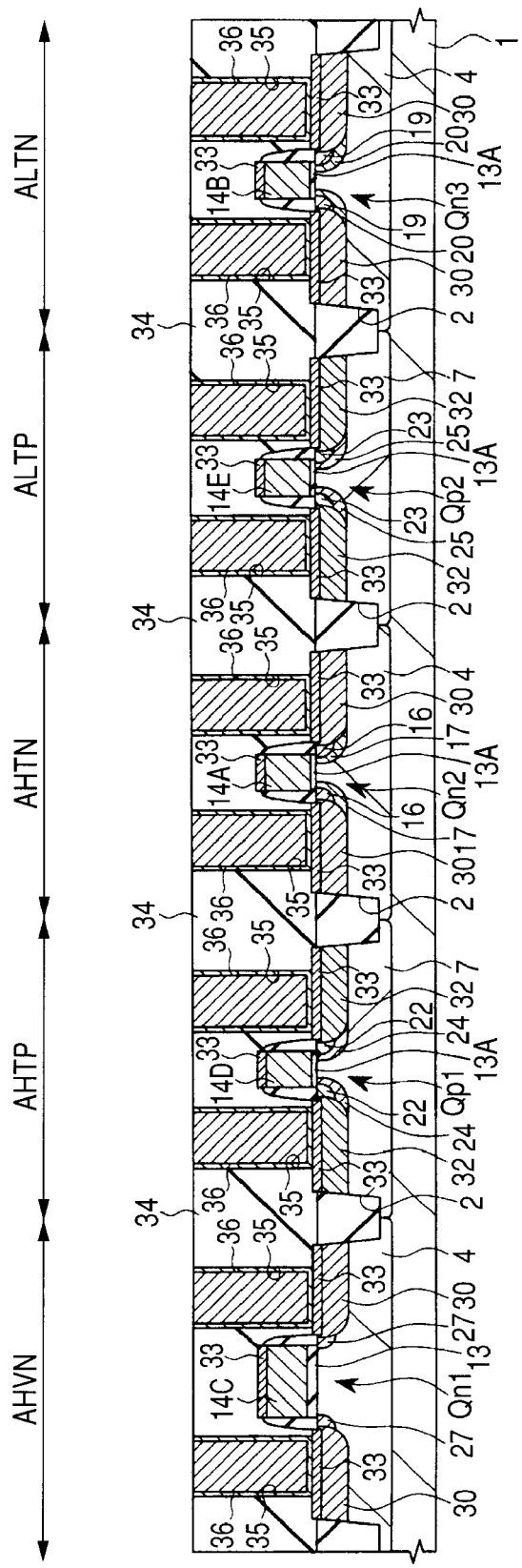
FIG. 21 is a principal part cross-sectional view in the manufacturing process of the semiconductor integrated circuit device following FIG. 20.

Next, as shown in FIG. 21, interlayer insulation film 34 is formed by depositing a silicon oxide film on substrate 1. Then, the interlayer insulation film 34 is etched by using as a mask the photoresist film patterned by photolithography technology. This forms in interlayer insulation film 34 contact hole 35 which reaches each of n+ type semiconductor region 30, p+ type semiconductor region 32, gate electrodes 14A, 14B, 14C, 14D, and 14E, and the gate electrode of p channel type MISFET with a relatively large breakdown voltage. In FIG. 21, the illustration of contact hole 35 which reaches at each of gate electrodes 14A, 14B, 14C, 14D, and 14E and the gate electrode of p channel type MISFET with a relatively large breakdown voltage is omitted.

Then, Ti film and a titanium nitride film are deposited one by one, for example by a sputtering method on substrate 1 including the inside of the above-mentioned contact hole 35. Subsequently, W (tungsten) film which embeds the inside of contact hole 35 is deposited on substrate 1, for example with a CVD method. Subsequently, W film and the titanium nitride film on substrate 1 are removed by the CMP (Chemical Mechanical Polishing) method, and W film and a titanium nitride film are left in contact hole 35. By this, plug 36 which electrically connects each of n+ type semiconductor region 30, p+ type semiconductor region 32, gate electrodes 14A, 14B, 14C, 14D and 14E, and the gate electrode of p channel type MISFET with a relatively large breakdown voltage is formed in contact hole 35.

Figure 22:
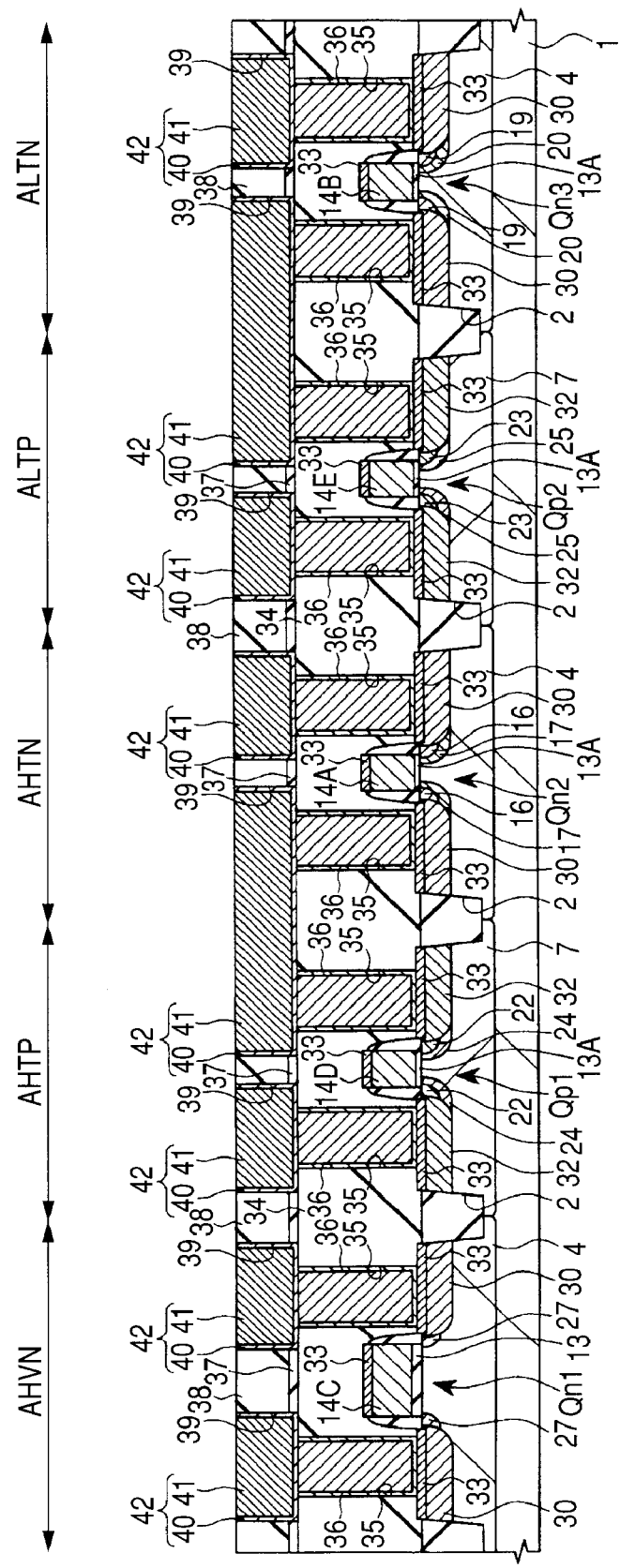
FIG. 22 is a principal part cross-sectional view in the manufacturing process of the semiconductor integrated circuit device following FIG. 21.

Next, as shown in FIG. 22, etching stopper film 37 is formed by depositing a silicon nitride film, for example with a CVD method on substrate 1. Etching stopper film 37 is for avoiding giving damage to a lower layer or that working dimension accuracy deteriorates by digging too much, when forming the trench and hole for wiring formation in the insulation film of the upper layer. In Embodiment 1, using a silicon nitride film as this etching stopper film 37 is exemplified. However, the SiC (silicon carbide) film deposited with plasma CVD method or the SiCN (silicon carbonitride) film which includes N (nitrogen) by predetermined amount in the component of a SiC film may be used instead of a silicon nitride film. Since the relative dielectric constant is relatively lower than a silicon nitride film, a SiC film and the SiCN film can improve the wiring delay in the CMOS logic LSI of Embodiment 1 by using a SiC film or a SiCN film as etching stopper film 37.

Next, a silicon oxide film is deposited on the front surface of etching stopper film 37 with a CVD method, for example, and interlayer insulation film 38 of the thickness of about 200 nm is deposited. When forming this interlayer insulation film 38, F (fluorine) may be added to silicon oxide. Since the dielectric constant of interlayer insulation film 38 can be lowered by adding F, it is possible to lower the overall dielectric constant of a wiring of a semiconductor integrated circuit device, and wiring delay can be improved.

Then, etching stopper film 37 and interlayer insulation film 38 are processed using photolithography technology and dry etching technology, and wiring groove 39 for embedded wiring formation is formed. Subsequently, in order to remove the reaction layer of the front surface of plug 36 exposed to the bottom of wiring groove 39, the surface treatment of substrate 1 by sputter etching is performed in Ar (argon) atmosphere.

Then, for example, the tantalum nitride film used as barrier conductor film 40 is deposited all over substrate 1 by performing reactive sputtering for a tantalum target in argon/nitrogen mixture atmosphere. Deposition of this tantalum nitride film is performed for the improvement in the adhesion of Cu (copper) film deposited in the following step, and the diffusion prevention of Cu, and it can be exemplified that the thickness is set to about 30 nm. In Embodiment 1, although a tantalum nitride film is exemplified as barrier conductor film 40, it may be metallic films, such as tantalum, a laminated film of tantalum nitride and tantalum, a titanium nitride film, the laminated film of a metallic film and a titanium nitride film, etc. When barrier conductor film 40 is tantalum or tantalum nitride, adhesion with a Cu film is better than the case where titanium nitride is used. When barrier conductor film 40 is a titanium nitride film, it is also possible to do sputter etching of the front surface of the titanium nitride film just before deposition of the Cu film which is the following step. By such sputter etching, water, an oxygen molecule, etc. which stuck on the surface of the titanium nitride film can be removed, and the adhesive property of a Cu film can be improved. This technology has a large effect, when doing vacuum break, putting the front surface to the atmosphere after deposition of the titanium nitride film and depositing a Cu film especially. This technology is not restricted to a titanium nitride film, but also in a tantalum nitride film, although there is just an operative difference, it is effective.

Then, a Cu film or a Cu alloy film used as a seed film is deposited all over substrate 1 on which barrier conductor film 40 is deposited. When this seed film is a Cu alloy film, about 80 or more percentages by weight of Cu(s) is included in the alloy. The seed film is deposited by the ionization sputtering method which increases the directivity of sputtering by ionizing Cu sputtering atom. The thickness is about 100 nm to 200 nm in the front surface of barrier conductor film 40 except the inside of wiring groove 39, and is about 150 nm preferably. In Embodiment 1, although the case where an ionization sputtering method is used for deposition of a seed film is exemplified, a long-distance sputtering method may be used. Deposition of a seed film may be performed with a CVD method. Since a high vacuum state is keepable when the CVD forming unit has combined with the formation room of barrier conductor film 40, it can be prevented that the front surface of deposited barrier conductor film 40 oxidizes.

Next, all over substrate 1 which the seed film deposited, a Cu film is deposited so that wiring groove 39 may be embedded, and this Cu film and the above-mentioned seed film are set to become conductive film 41. The Cu film which embeds this wiring groove 39 is formed, for example with an electrolysis electroplating method. As plating liquid, what added 10% of $CuSO_4$ (copper sulfate) and the additive for the improvement in coverage of a Cu film, for example to $H_2SO_4$ (sulfuric acid) is used. Since the growth rate of the Cu film can electrically be controlled when an electrolysis electroplating method is used for formation of the Cu film which embeds wiring groove 39, the coverage of the Cu film in the inside of wiring groove 39 can be improved. In Embodiment 1, although the case where an electrolysis electroplating method is used for deposition of the Cu film which embeds wiring groove 39 is exemplified, electroless plating may be used. Since voltage application is not needed when electroless plating is used, the damage of substrate 1 resulting from voltage application can be reduced rather than the case where an electrolysis electroplating method is used.

Then, a good Cu film can be obtained by making strain of a Cu film ease by annealing treatment.

Next, excessive barrier conductor film 40 and excessive conductive film 41 on interlayer insulation film 38 are removed, and barrier conductor film 40 and conductive film 41 are left behind in wiring groove 39. This forms embedded wiring 42 which electrically connects with plug 36 at the bottom of wiring groove 39, and the semiconductor integrated circuit device of Embodiment 1 is manufactured. The polish which used the CMP method performs removal of barrier conductor film 40 and conductive film 41.

Embodiment 2

In Embodiment 2, in addition to MISFET with relatively high threshold value voltage (n channel type MISFET Qn2 (refer to FIG. 18) and p channel type MISFET Qp1 (refer to FIG. 19)), MISFET with relatively low threshold value voltage (n channel type MISFET Qn3 (refer to FIG. 18) and p channel type MISFET Qp2 (refer to FIG. 19)), and MISFET (n channel type MISFET Qn1 (refer to FIG. 18)) with a relatively large breakdown voltage explained in the Embodiment 1, MISFET which has the threshold value voltage between MISFET with relatively high threshold value voltage and MISFET with relatively low threshold value voltage is also formed in the same substrate 1.

FIG. 23-FIG. 42 show the principal part section of substrate 1 in the manufacturing process of the semiconductor integrated circuit device of Embodiment 2 to process order, and show the section of the same part of substrate 1, respectively. In FIG. 23-FIG. 42, in addition to region AHTN, AHTP, ALTN, ALTP, and AHVN explained using FIG. 1-FIG. 22 in the Embodiment 1, region (sixth region) AMTN in which above-mentioned n channel type MISFET which has the threshold value voltage between n channel type MISFET Qn2 with relatively high threshold value voltage and n channel type MISFET Qn3 with relatively low threshold value voltage is formed, and region AMTP in which p channel type MISFET which has the threshold value voltage between p channel type MISFET Qn1 with relatively high threshold value voltage and p channel type MISFET Qn2 with relatively low threshold value voltage is formed are illustrated. Regions AHTN, AHTP, AMTN, and AMTP are illustrated in FIG. 23, FIG. 25, FIG. 27, FIG. 28, FIG. 29, FIG. 31, FIG. 33, FIG. 35, FIG. 37, FIG. 39, and FIG. 41. Regions ALTN, ALTP, and AHVN are illustrated in FIG. 24, FIG. 26, FIG. 30, FIG. 32, FIG. 34, FIG. 36, FIG. 38, FIG. 40, and FIG. 42.

Figure 23:
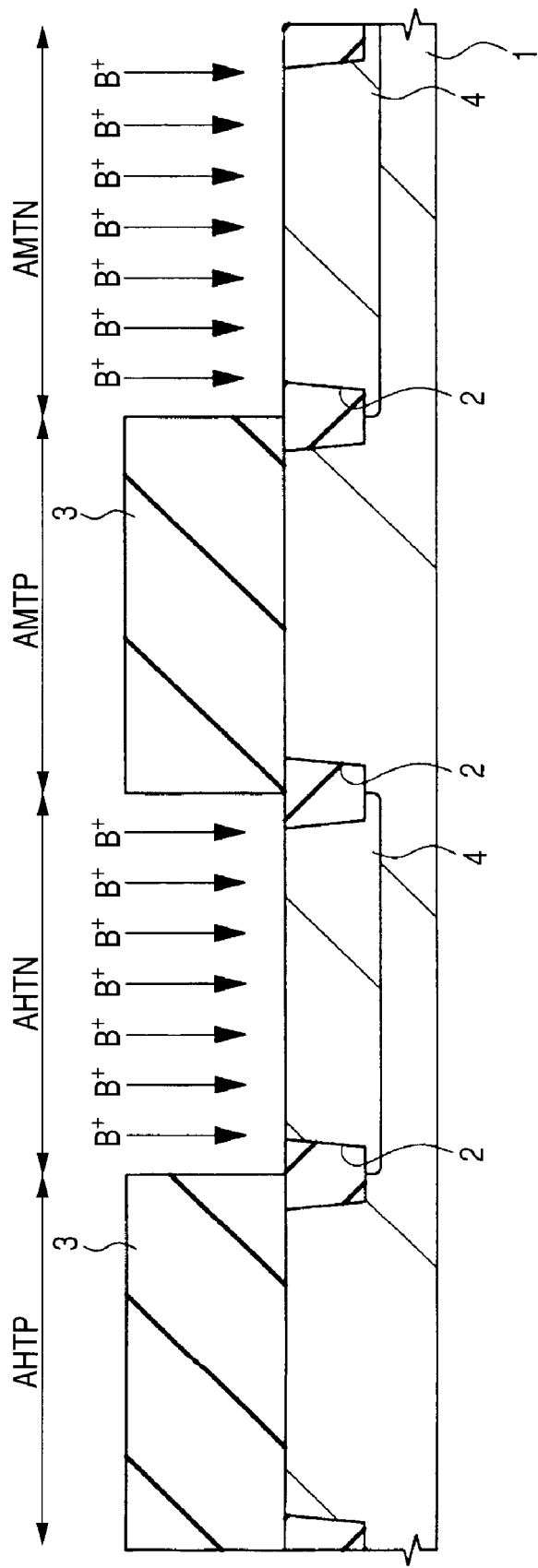
FIGS. 23 and 24 are principal part cross-sectional views explaining the manufacturing method of the semiconductor integrated circuit device of Embodiment 2 of the present invention.
Figure 24:
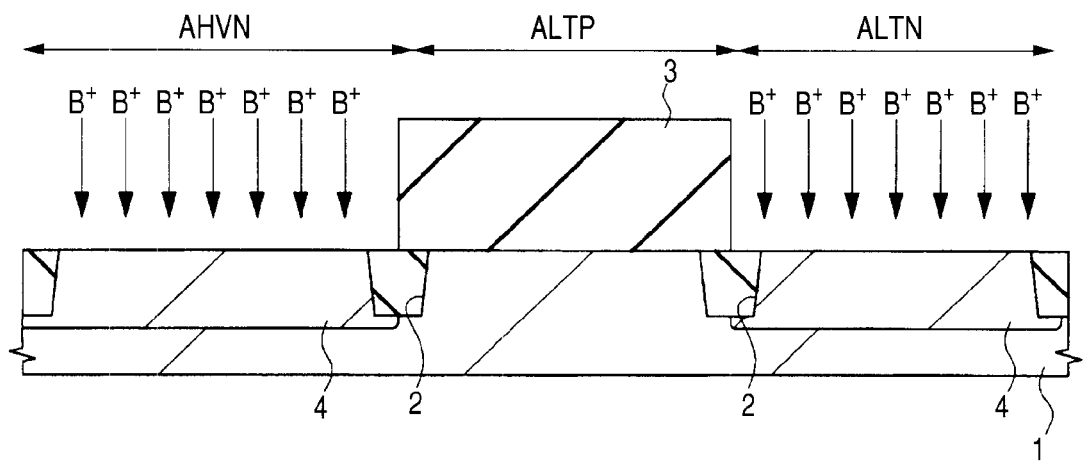

As for the manufacturing process of the semiconductor integrated circuit device of Embodiment 2, till the step (refer to FIG. 1) which forms element isolation trench 2 is the same as that of the Embodiment 1. Then, as shown in FIG. 23 and FIG. 24, photoresist film 3 is formed to substrate 1, and the photoresist film 3 is patterned with photolithography technology. Hereby, photoresist film 3 is left behind to the regions in which n channel MISFET is not formed, such as regions AHTP, AMTP, and ALTP. Subsequently, by using photoresist film 3 as a mask, the ion implantation of the B is done to the regions in which n channel MISFET is formed, such as regions AHVN, AHTN, AMTN and ALTN, and p type well 4 is formed in them.

Figure 25:
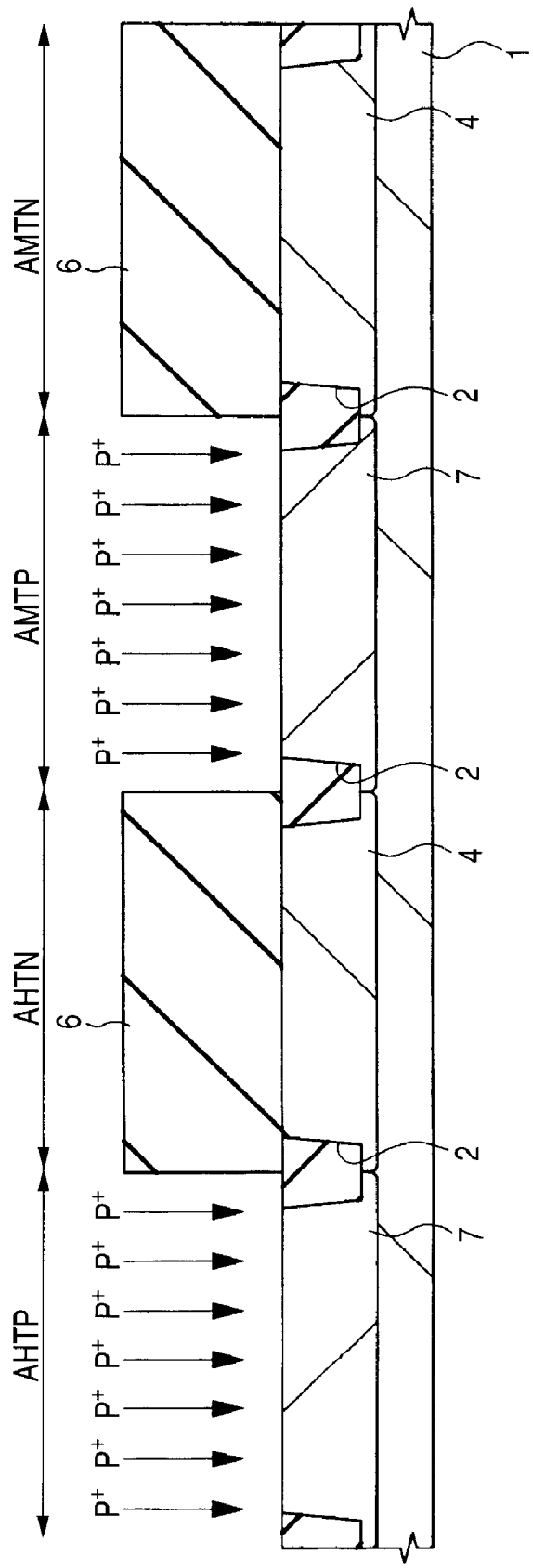
FIG. 25 is a principal part cross-sectional view in the manufacturing process of the semiconductor integrated circuit device following FIG. 23.
Figure 26:
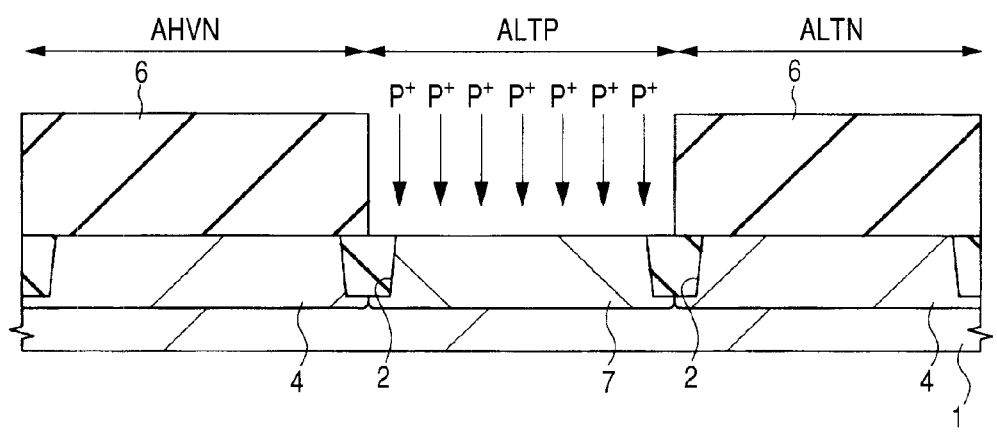
FIG. 26 is a principal part cross-sectional view in the manufacturing process of the semiconductor integrated circuit device following FIG. 24.

Next, after removing photoresist film 3, as shown in FIG. 25 and FIG. 26, photoresist film 6 is formed to substrate 1, and the photoresist film 6 is patterned with photolithography technology. Hereby, photoresist film 6 is left behind to the regions in which p channel MISFET is not formed, such as regions AHVN, AHTN, AMTN and ALTN. Subsequently, by using photoresist film 6 as a mask, the ion implantation of the P is done to the regions in which p channel MISFET is formed, such as regions AHTP, AMTP, and ALTP, and n type well 7 is formed in them.

Next, after removing photoresist film 6, by the same step as the step explained using FIG. 4-FIG. 8 in the Embodiment 1, the ion implantation of the impurity for the threshold value voltage adjustment of MISFET is done to each of regions AHTN, AMTN, ALTN, AHTP, AMTP, ALTP, and AHVN. At this time, the ion implantation of the impurity, for example, B or $BF_2$ (boron difluoride), which has a p type conductivity type is done to regions AHTN, AMTN, ALTN and AHVN. The ion implantation of the impurity which has an n type conductivity type, for example, the P, is done to regions AHTP, AMTP, and ALTP. When concentration of the impurity by which ion implantation is done to regions AHTN, AMTN, ALTN and AHVN is set to Dn1, Dn2 (the 12th concentration), Dn3, and Dn4, respectively, it is made to become Dn1>Dn2>Dn3>Dn4 in Embodiment 2. It is made to become Dp1>Dp2>Dp3 when concentration of the impurity by which ion implantation is done to regions AHTP, AMTP, and ALTP is set to Dp1, Dp2, and Dp3, respectively.

Next, wet cleaning of the main surface of substrate 1 (p type well 4 and n type well 7) is done by the same step as the step explained using FIG. 9 in the Embodiment 1. Then, gate insulating films 13 and 13A and gate electrodes 14A, 14B, 14C, 14D, and 14E are formed in each front surface of p type well 4 and n type well 7 by the thermal oxidation of about 800° C. At this time, gate electrodes 14F and 14G are formed in regions AMTN and AMTP, respectively.

Figure 27:
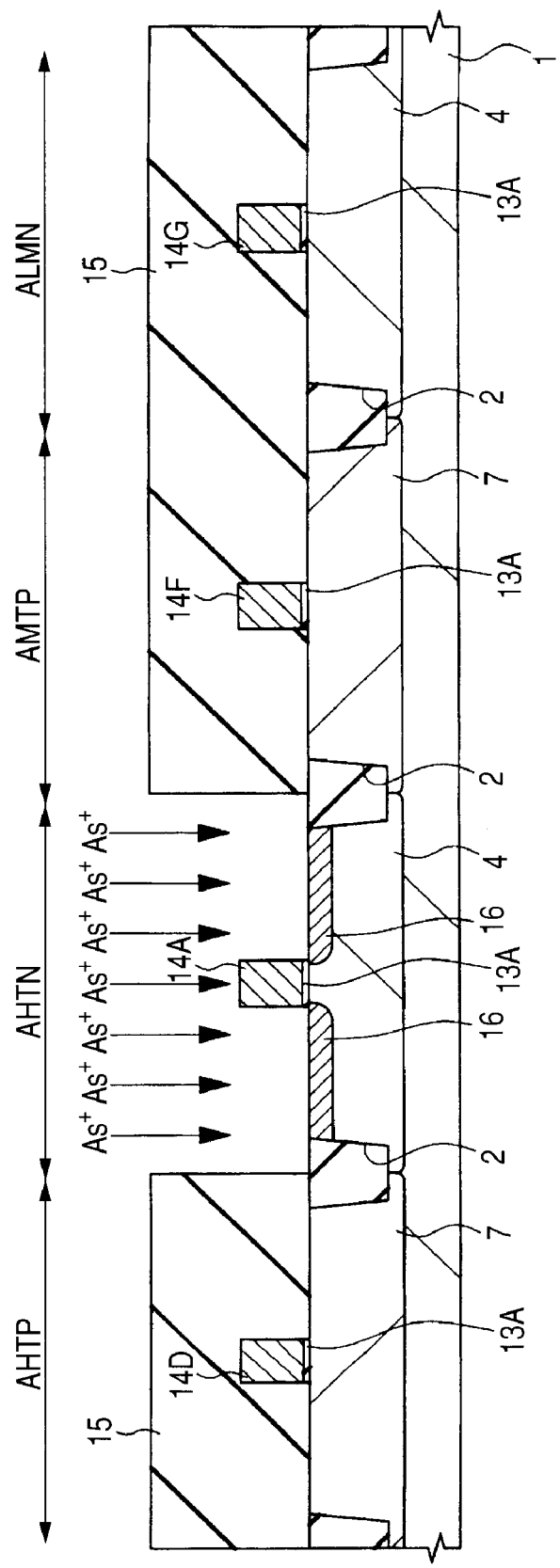
FIG. 27 is a principal part cross-sectional view in the manufacturing process of the semiconductor integrated circuit device following FIG. 25.

Next, by the same step as the step explained using FIG. 10 in the Embodiment 1, in region AHTN, $n^-$ type semiconductor region 16 which becomes a part of source/drain of n channel type MISFET with relatively high threshold value voltage is formed in p type well 4 of the both sides of gate electrode 14A (refer to FIG. 27).

Figure 28:
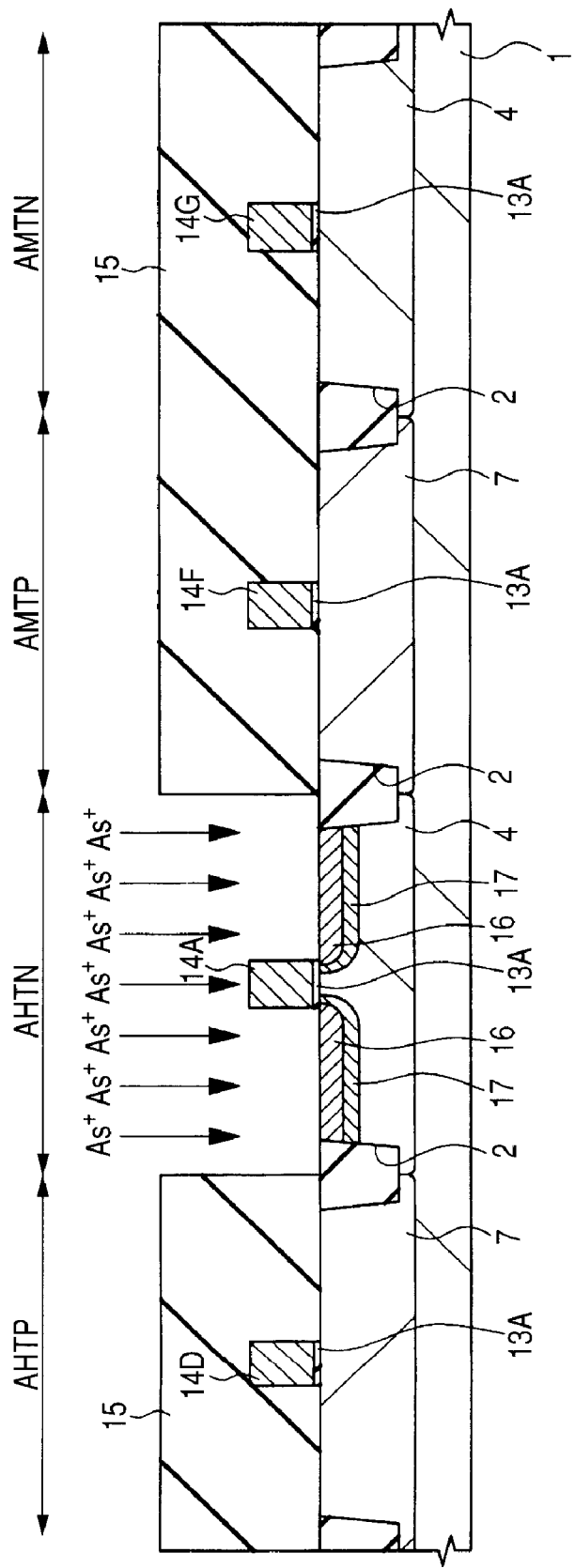
FIG. 28 is a principal part cross-sectional view in the manufacturing process of the semiconductor integrated circuit device following FIG. 27.

Then, as shown in FIG. 28, punch-through stopper layer 17 is formed in region AHTN by the same step as the step explained using FIG. 11 in the Embodiment 1.

Figure 29:
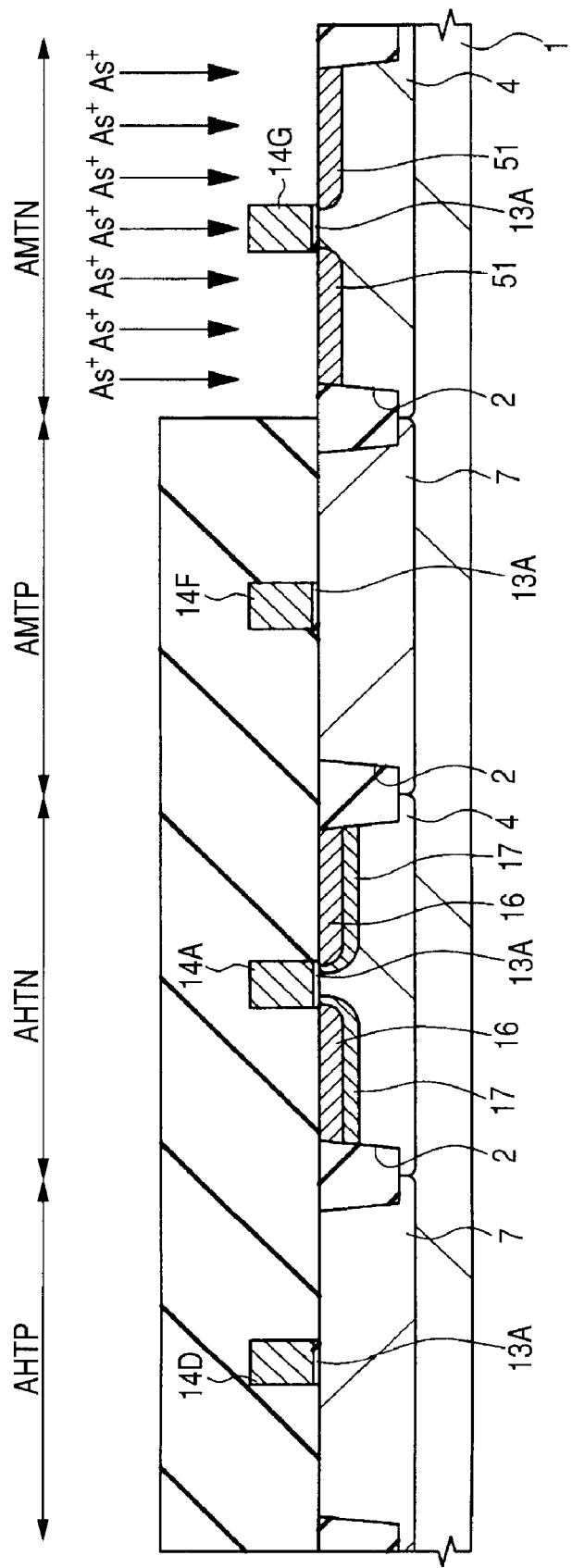
FIG. 29 is a principal part cross-sectional view in the manufacturing process of the semiconductor integrated circuit device following FIG. 28.
Figure 30:
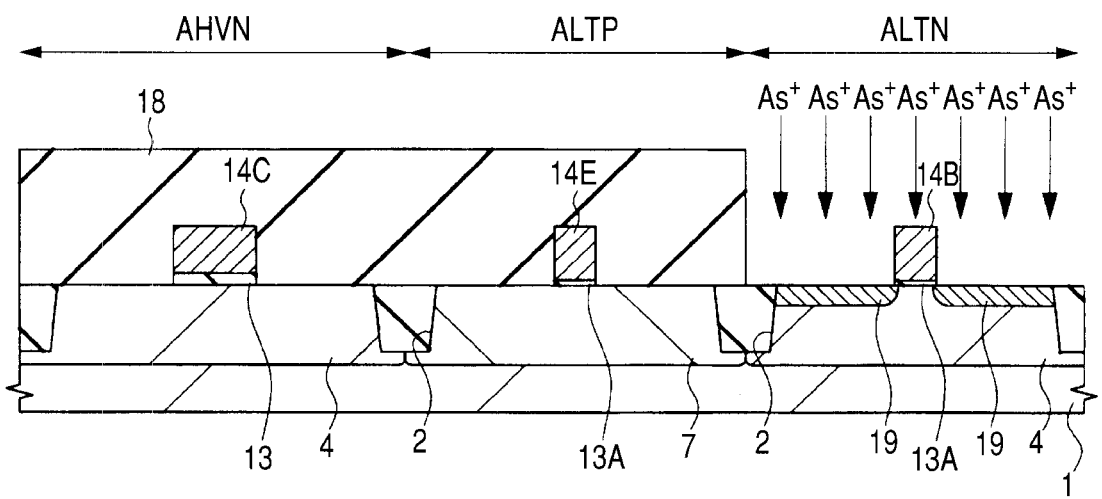
FIG. 30 is a principal part cross-sectional view in the manufacturing process of the semiconductor integrated circuit device of Embodiment 2 of the present invention.

Next, after removing photoresist film 15, as shown in FIG. 29 and FIG. 30, in region ALTN, n type semiconductor region 19 is formed in p type well 4 of the both sides of gate electrode 14B by the same step as the step explained using FIG. 12 in the Embodiment 1. In region AMTN, $n^-$ type semiconductor region (the 12th semiconductor region) 51 is formed in p type well 4 of the both sides of gate electrode (sixth gate electrode) 14G. This n-type semiconductor region 51 becomes a part of source/drain of n channel type MISFET which has the threshold value voltage between n channel type MISFET with relatively high threshold value voltage, and n channel type MISFET with relatively low threshold value voltage. Since $n^-$ type semiconductor region 51 is formed on the same conditions as $n^-$ type semiconductor region 19, the impurity concentration in $n^-$ type semiconductor region 51 becomes higher than the impurity concentration in the above-mentioned $n^-$ type semiconductor region 16.

Figure 31:
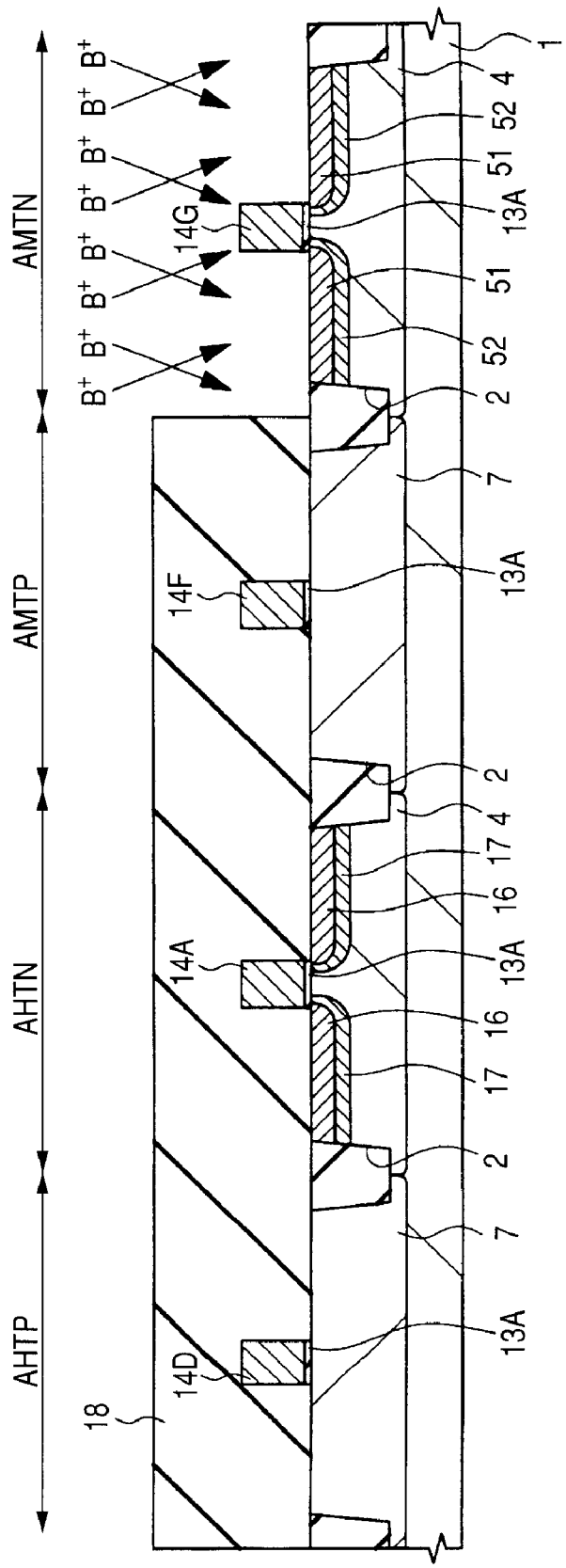
FIG. 31 is a principal part cross-sectional view in the manufacturing process of the semiconductor integrated circuit device following FIG. 29.
Figure 32:
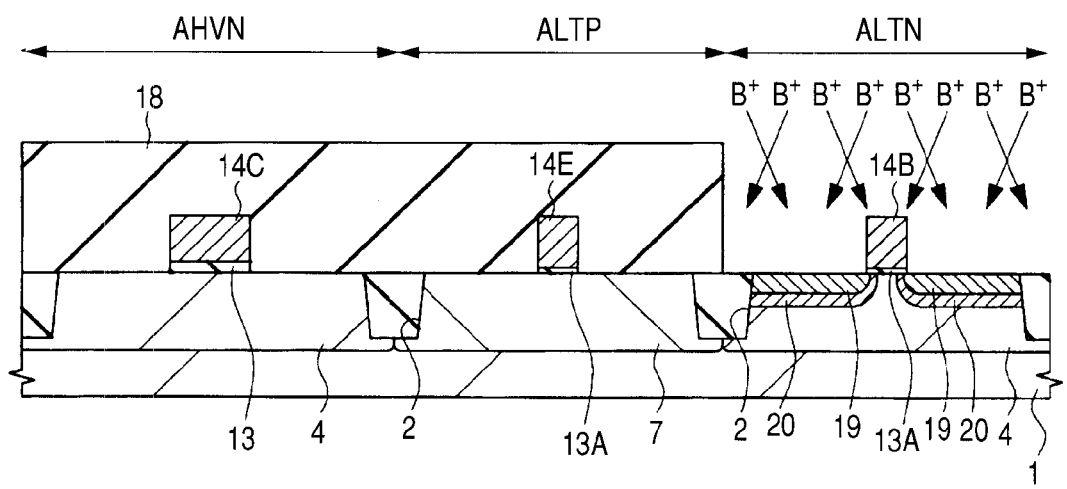
FIG. 32 is a principal part cross-sectional view in the manufacturing process of the semiconductor integrated circuit device following FIG. 30.

Next, as shown in FIG. 31 and FIG. 32, by the same step as the step explained using FIG. 13 in the Embodiment 1, punch-through stopper layer 20 is formed in region ALTN, and punch-through stopper layer (the 13th semiconductor region) 52 is formed in region AMTN. That is, the impurity concentration in punch-through stopper layer 20 and punch-through stopper layer 52 becomes higher than the impurity concentration in the above-mentioned punch-through stopper layer 17.

As mentioned above, also in Embodiment 2, implantation amount of the impurity (As) at the time of forming $n^-$ type semiconductor regions 19 and 51 is made larger than the implantation amount of the impurity at the time of forming n⁻ type semiconductor region 16 like the Embodiment 1. Implantation amount of the impurity at the time of forming punch-through stopper layers 20 and 52 is made larger than the implantation amount of the impurity at the time of forming punch-through stopper layer 17. It is possible to improve the short channel characteristics of n channel type MISFET with relatively low threshold value voltage thereby.

Figure 33:
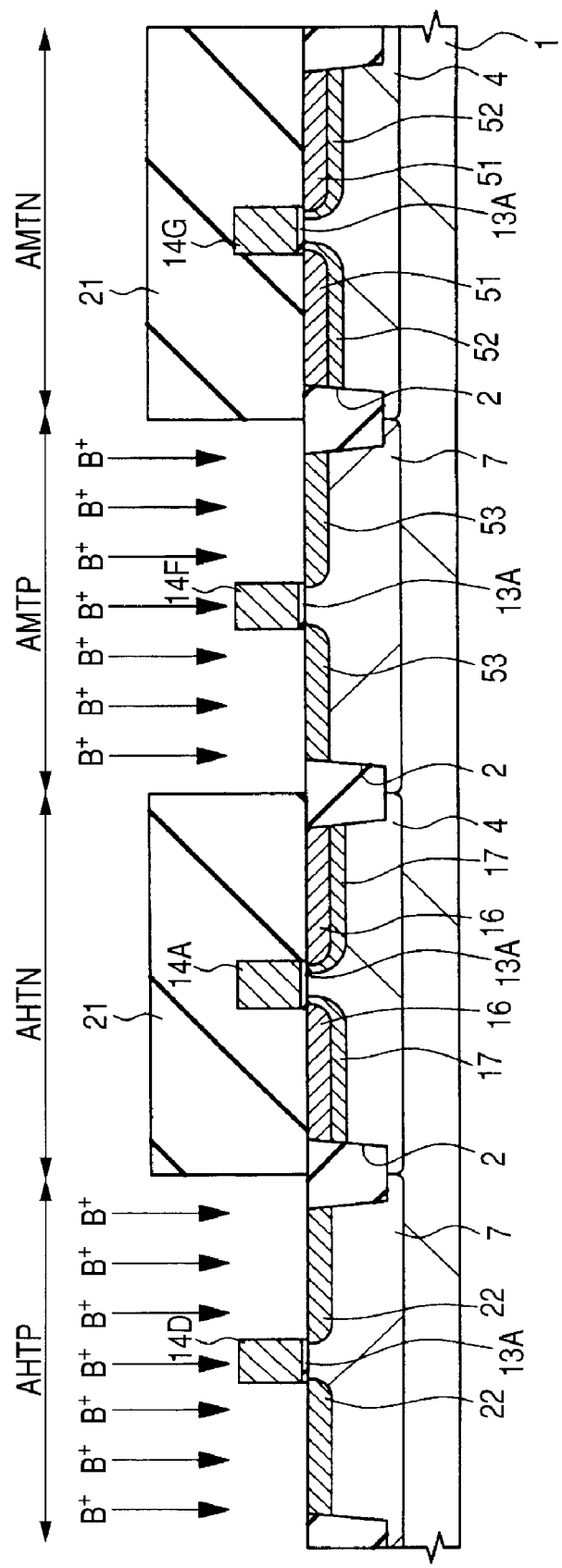
FIG. 33 is a principal part cross-sectional view in the manufacturing process of the semiconductor integrated circuit device following FIG. 31.
Figure 34:
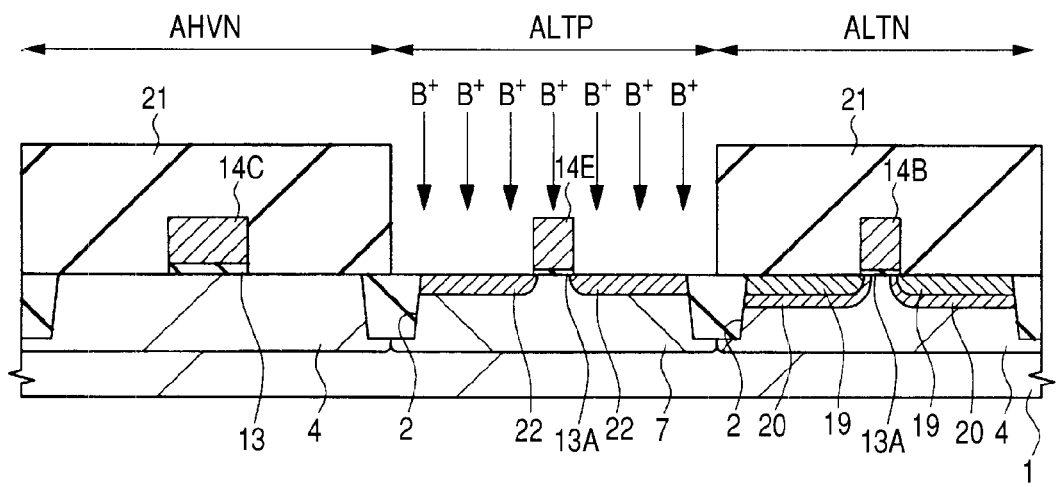
FIG. 34 is a principal part cross-sectional view in the manufacturing process of the semiconductor integrated circuit device following FIG. 32.

Next, after removing photoresist film 18, as shown in FIG. 33 and FIG. 34, in region AHTP, p⁻ type semiconductor region 22 is formed in n type well 7 of the both sides of gate electrode 14D by the same step as the step explained using FIG. 14 in the Embodiment 1. p⁻ type semiconductor region 23 is formed in n type well 7 of the both sides of gate electrode 14E in region ALTP, and p⁻ type semiconductor region 53 is formed in n type well 7 of the both sides of gate electrode 14F in region AMTP. This p⁻ type semiconductor region 53 becomes a part of source/drain of p channel type MISFET which has the threshold value voltage between p channel type MISFET with relatively high threshold value voltage, and p channel type MISFET with relatively low threshold value voltage.

Figure 35:
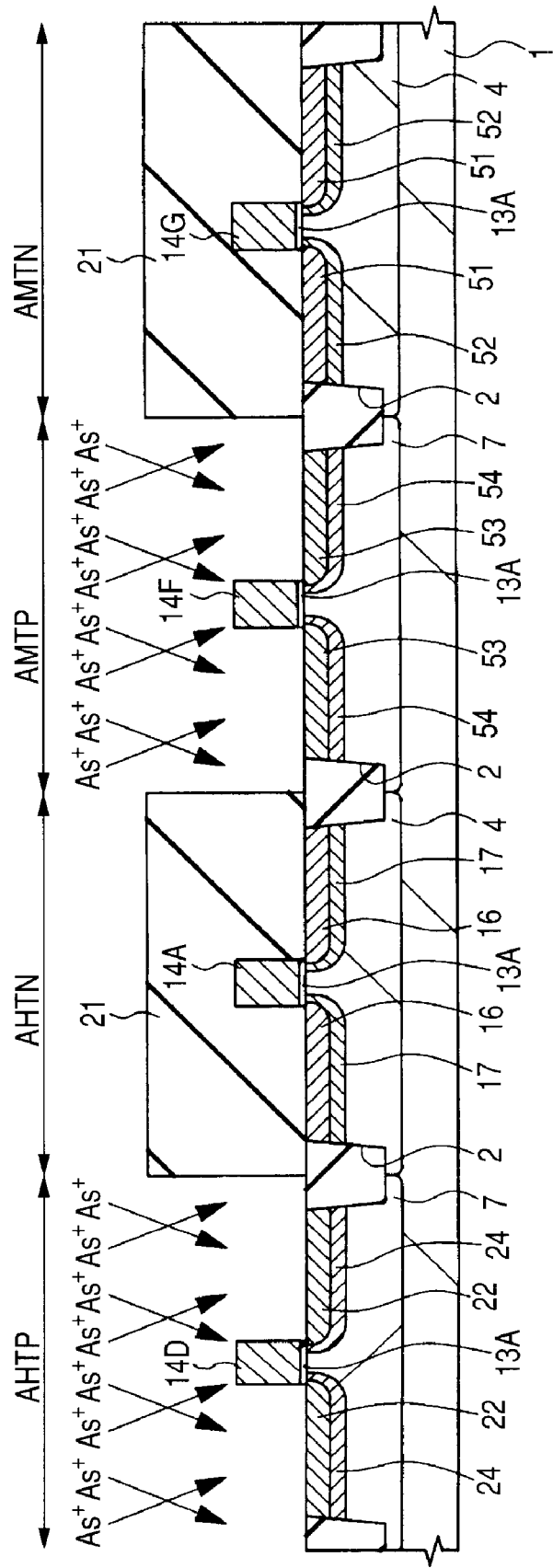
FIG. 35 is a principal part cross-sectional view in the manufacturing process of the semiconductor integrated circuit device following FIG. 33.
Figure 36:
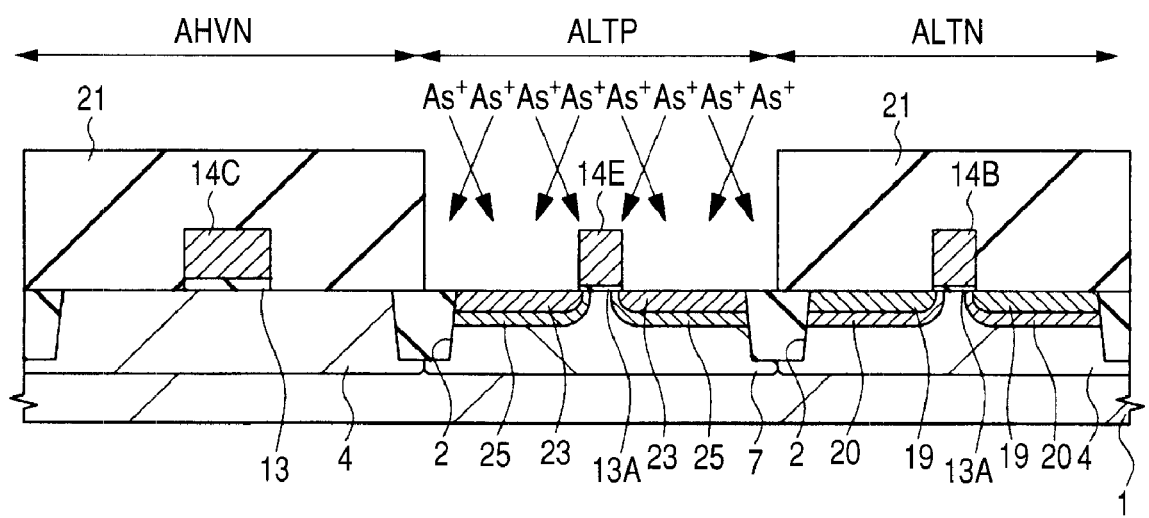
FIG. 36 is a principal part cross-sectional view in the manufacturing process of the semiconductor integrated circuit device following FIG. 34.

Next, as shown in FIG. 35 and FIG. 36, by the same step as the step explained using FIG. 15 in the Embodiment 1, punch-through stopper layer 24 is formed in region AHTP, punch-through stopper layer 54 is formed in region AMTP, and punch-through stopper layer 25 is formed in region ALTP.

Figure 37:
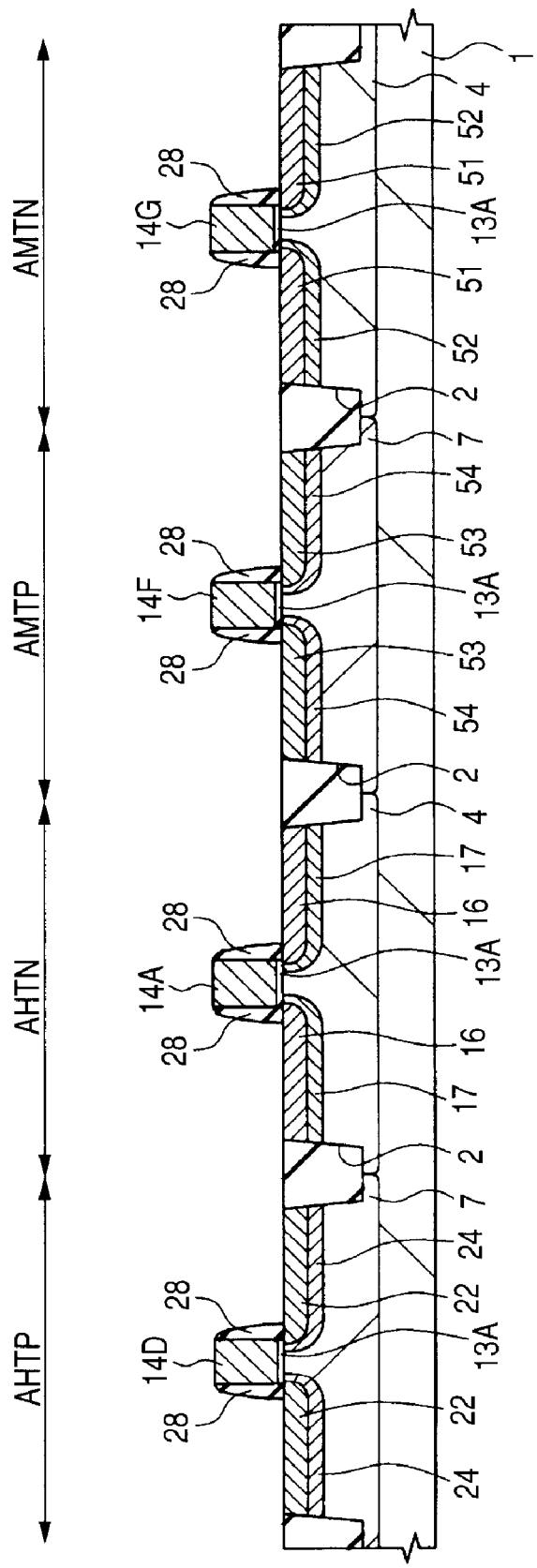
FIG. 37 is a principal part cross-sectional view in the manufacturing process of the semiconductor integrated circuit device following FIG. 35.
Figure 38:
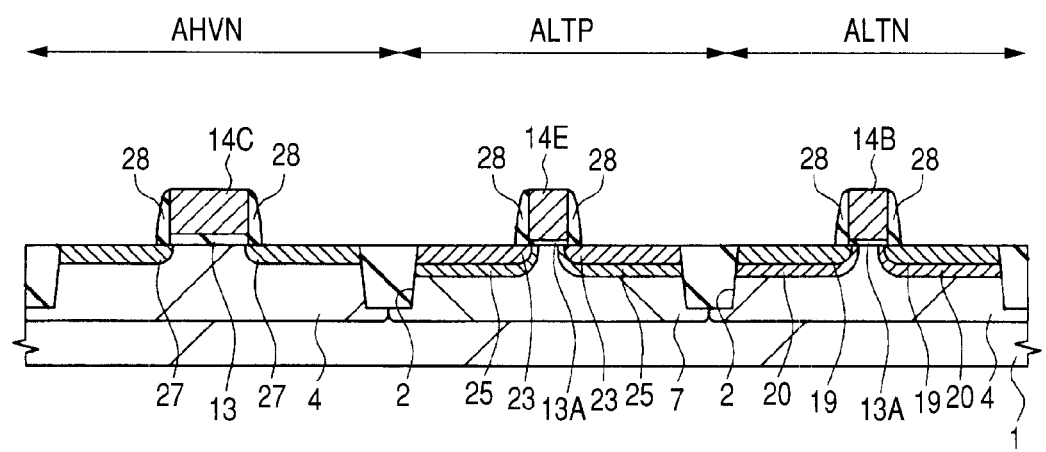
FIG. 38 is a principal part cross-sectional view in the manufacturing process of the semiconductor integrated circuit device following FIG. 36.

Next, after removing photoresist film 21, as shown in FIG. 37 and FIG. 38, in region AHVN, n⁻ type semiconductor region 27 is formed in p type well 4 of the both sides of gate electrode 14C by the same step as the step explained using FIG. 16 in the Embodiment 1.

Then, by the same step as the step explained in the Embodiment 1, p⁻ type semiconductor region (illustration is omitted) which becomes a part of source/drain of p channel type MISFET with a relatively large breakdown voltage is formed in the region in which p channel type MISFET with a relatively large breakdown voltage is formed.

Next, sidewall spacer 28 is formed in the side wall of gate electrodes 14A, 14B, 14C, 14D, 14E, 14F, and 14G, and the gate electrode which is not illustrated by the same step as the step explained using FIG. 17 in the Embodiment 1.

Figure 39:
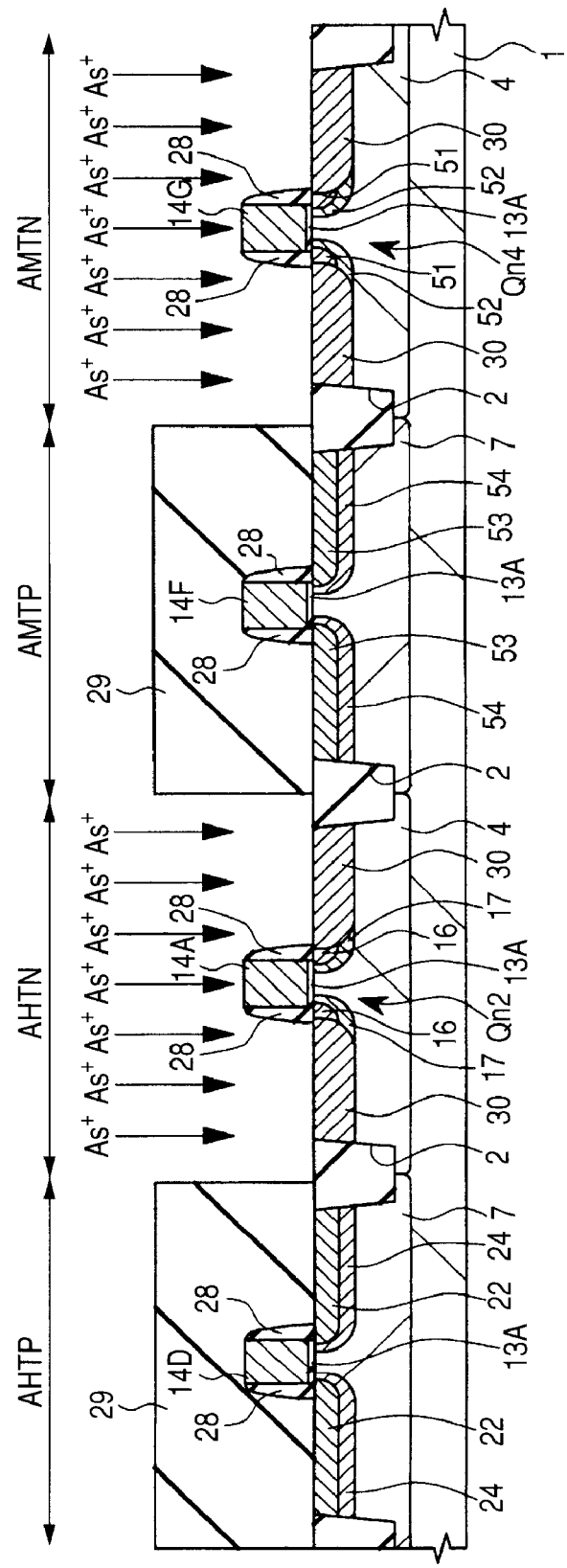
FIG. 39 is a principal part cross-sectional view in the manufacturing process of the semiconductor integrated circuit device following FIG. 37.
Figure 40:
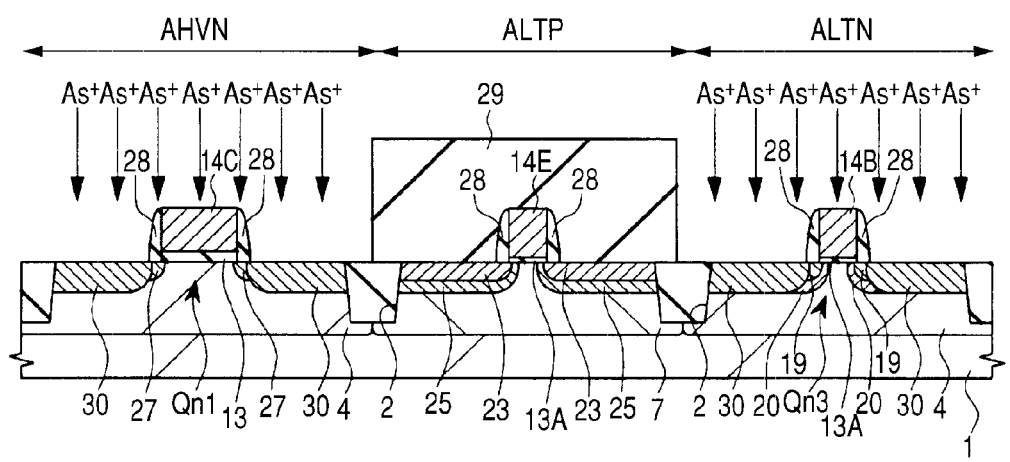
FIG. 40 is a principal part cross-sectional view in the manufacturing process of the semiconductor integrated circuit device following FIG. 38.

Next, as shown in FIG. 39 and FIG. 40, by the same step as the step explained using FIG. 18 in the Embodiment 1, n⁺ type semiconductor region (the 14th semiconductor region) 30 which constitutes a source/drain of n channel type MISFET, respectively is formed in regions AHVN, AHTN, AMTN and ALTN. According to the steps so far, n channel type MISFET Qn1 with a relatively large breakdown voltage is formed in region AHVN, n channel type MISFET Qn2 with relatively high threshold value voltage is formed in region AHTN, n channel type MISFET Qn3 with relatively low threshold value voltage is formed in region ALTN, and n channel type MISFET (fourth MISFET) Qn4 which has the threshold value voltage (third threshold value voltage) between n channel type MISFET Qn2 and n channel type MISFET Qn3 can be formed in region AMTN.

Figure 41:
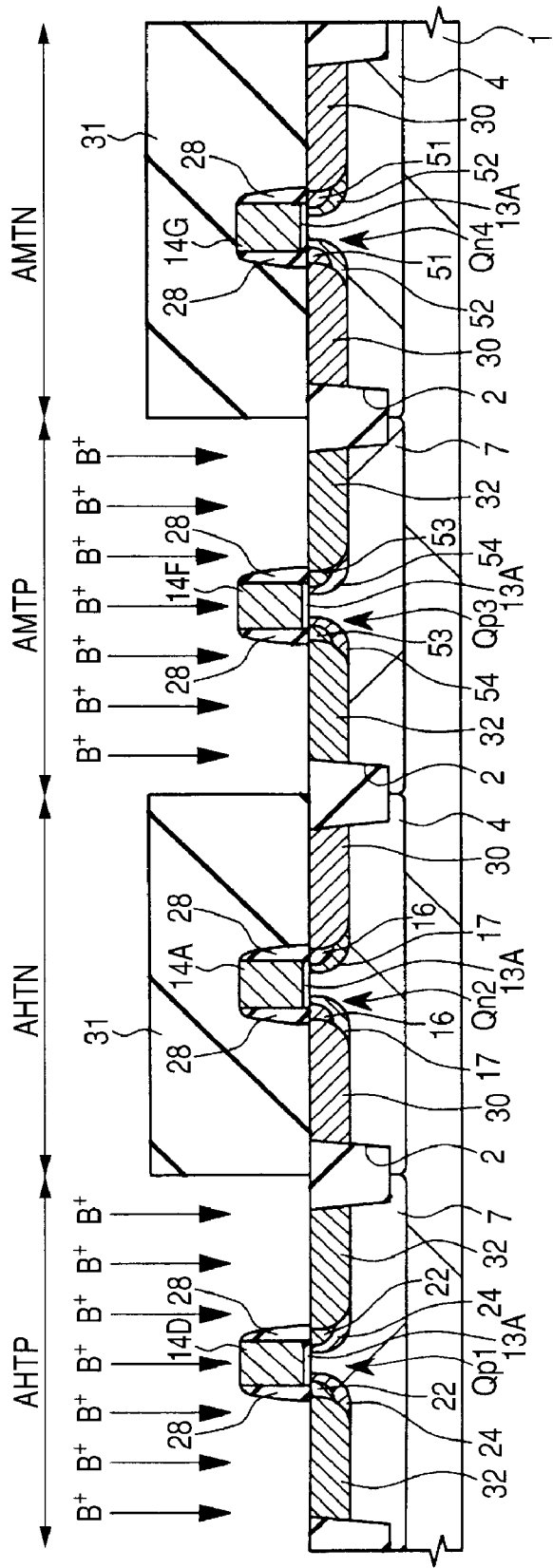
FIG. 41 is a principal part cross-sectional view in the manufacturing process of the semiconductor integrated circuit device following FIG. 39.
Figure 42:
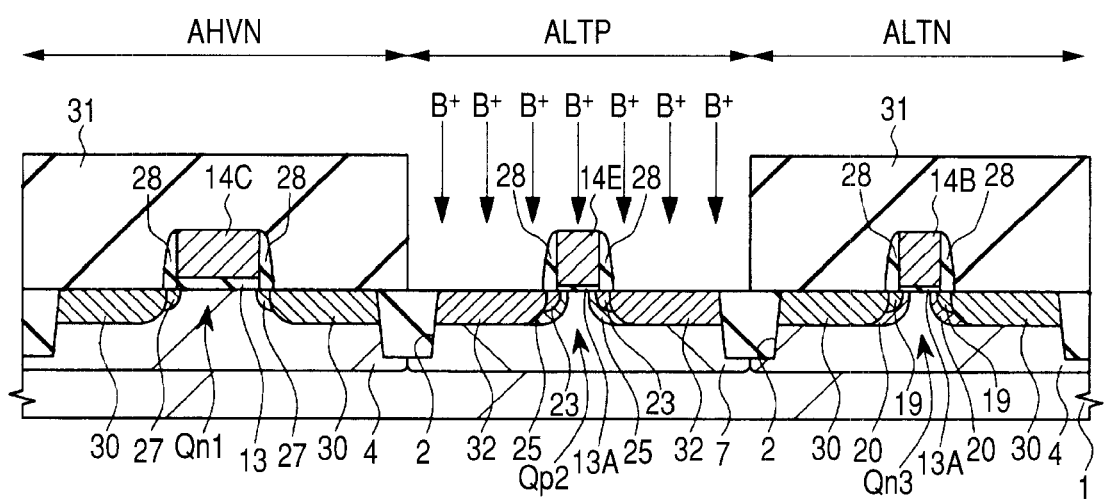
FIG. 42 is a principal part cross-sectional view in the manufacturing process of the semiconductor integrated circuit device following FIG. 40.

Next, as shown in FIG. 41 and FIG. 42, by the same step as the step explained using FIG. 19 in the Embodiment 1, p⁺ type semiconductor region 32 which constitutes a source/drain of p channel type MISFET, respectively is formed in regions AHTP, AMTP, and ALTP, and the region in which p channel type MISFET with a relatively large breakdown voltage is formed. According to the steps so far, p channel type MISFET Qp1 with relatively high threshold value voltage is formed in region AHTP, p channel type MISFET Qp2 with relatively low threshold value voltage is formed in region ALTP, and p channel type MISFET Qp3 which has the threshold value voltage between p channel type MISFET Qp1 and p channel type MISFET Qp2 can be formed in region AMTP.

Subsequent steps are the same as the step explained using FIG. 20-FIG. 22 in the Embodiment 1.

According to the above Embodiment 2, even when 3 kinds of n channel type MISFET Qn2, Qn3, and Qn4 from which threshold value voltage differs are formed on the same substrate 1, in n channel type MISFET Qn3 and Qn4 with relatively low threshold value voltage, resistance is reduced, and short channel characteristics are improved by making impurity concentration high in n⁻ type semiconductor regions 19 and 51 and punch-through stopper layers 20 and 52, and drain current can be enlarged more. In n channel type MISFET Qn2 with relatively high threshold value voltage, by making low impurity concentration in n⁻ type semiconductor region 16 and punch-through stopper layer 17, and easing the electric field near the drain, off-state current, such as GIDL current and BTBT current, can be suppressed, inhibiting a short channel effect. That is, according to the semiconductor integrated circuit device of the Embodiment 2 provided with such n channel type MISFET Qn2, Qn3, and Qn4, power consumption can be reduced, preventing lowering of the working speed of a circuit.

Also by the above Embodiment 2, the same effect as the Embodiment 1 can be acquired.

Embodiment 3

In Embodiment 3, in addition to MISFET with relatively high threshold value voltage (n channel type MISFET Qn2 (refer to FIG. 18) and p channel type MISFET Qp1 (refer to FIG. 19)), MISFET with relatively low threshold value voltage (n channel type MISFET Qn3 (refer to FIG. 18) and p channel type MISFET Qp2 (refer to FIG. 19)), and MISFET (n channel type MISFET Qn1 (refer to FIG. 18)) with a relatively large breakdown voltage explained by the Embodiment 1, MISFET which forms the memory cell of SRAM (Static Random Access Memory) is also formed in the same substrate 1. As the Embodiment 1 also described, the MISFET with relatively high threshold value voltage and MISFET with relatively low threshold value voltage form the logical circuit mounted in mobile communications apparatus. The semiconductor integrated circuit device in which this logical circuit was formed is asked for low power consumption property. MISFET which forms the memory cell of SRAM of Embodiment 3 is asked for low power consumption property like MISFET which forms such a logical circuit.

Figure 43:
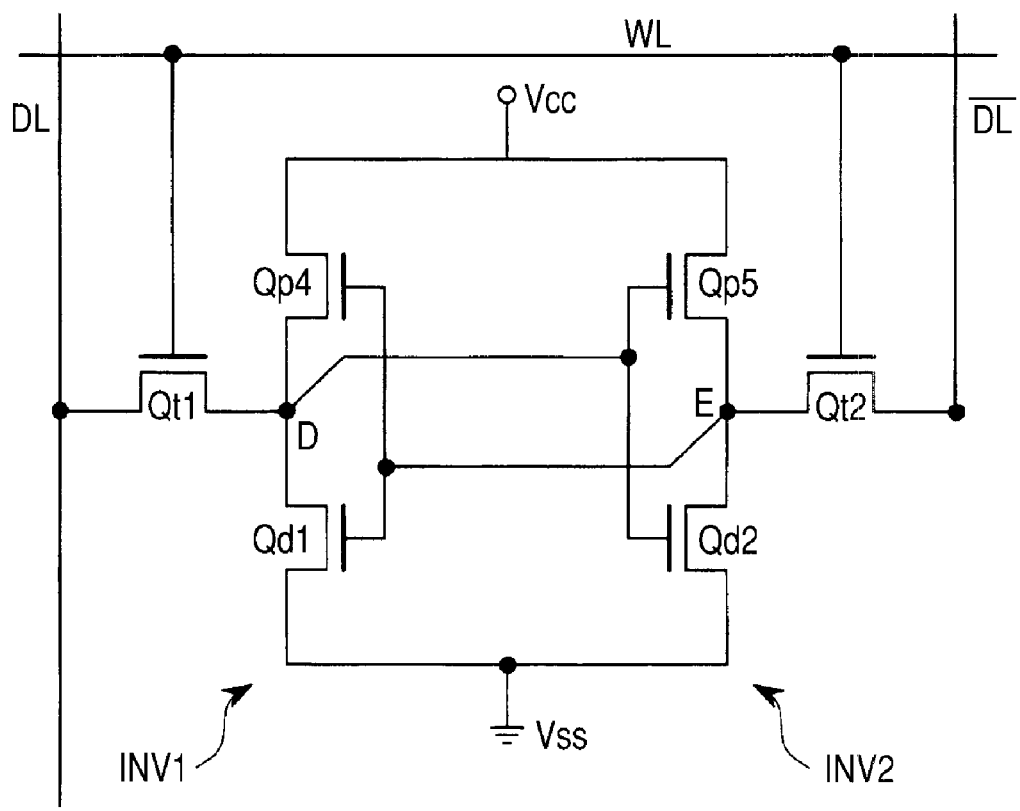
FIG. 43 is an equivalent circuit chart explaining the memory cell of SRAM.
Figure 44:
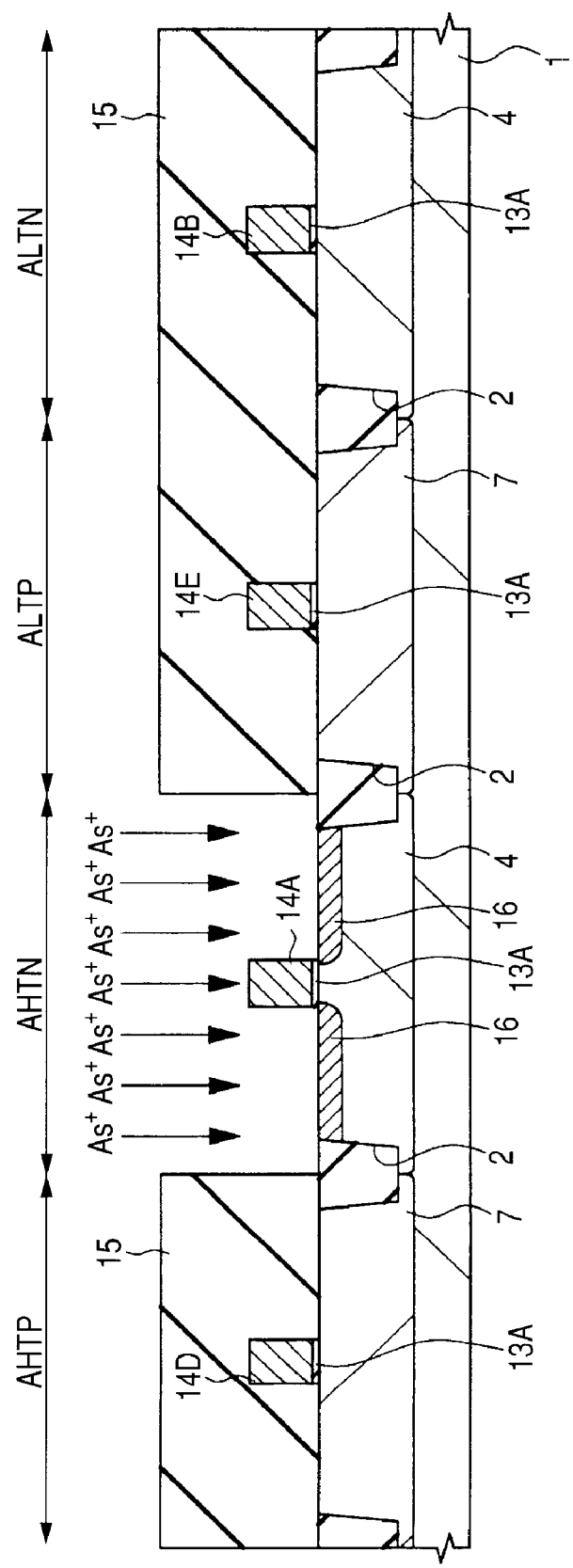
FIGS. 44 and 45 are principal part cross-sectional views explaining the manufacturing method of the semiconductor integrated circuit device of Embodiment 3 of the present invention.
Figure 45:
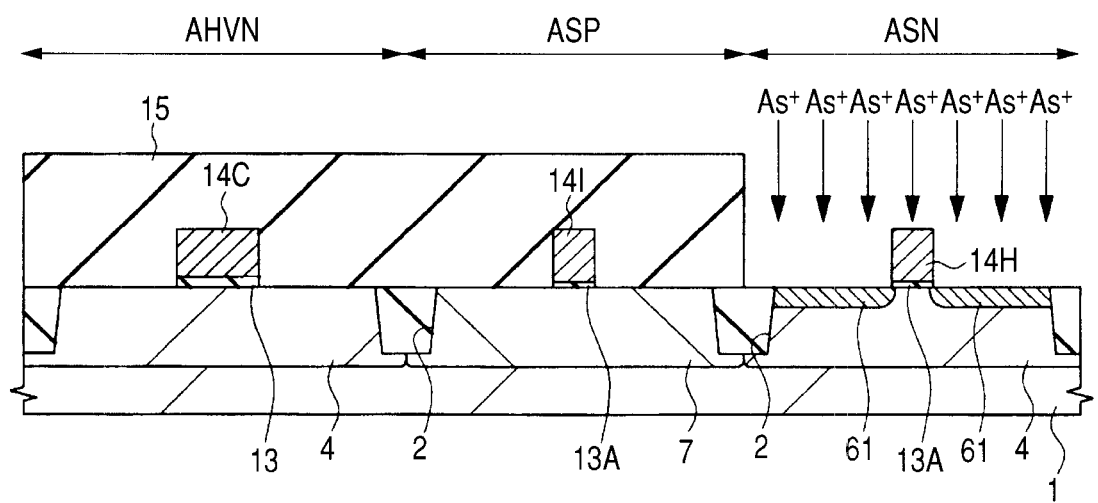

FIG. 43 is an equivalent circuit chart showing one memory cell of SRAM. As shown in this FIG. 43, the memory cell of SRAM of Embodiment 3 is arranged at the intersection part of the complementary data line (a data line DL, a data line/(bar) DL) of a pair, and word line WL. n channel type MISFET for drive Qd1 and Qd2 of a pair, p channel type MISFET for loads Qp4 and Qp5 of a pair, and n channel type MISFET Qt1 and Qt2 for transmission of a pair are formed. The gate of n channel type MISFET Qt1 and Qt2 for transmission and word line WL are electrically connected.

N channel type MISFET Qd1 for a drive and p channel type MISFET Qp4 for loads form inverter INV1 among six MISFET's which form the above-mentioned memory cell. N channel type MISFET Qd2 for a drive and p channel type MISFET Qp5 for loads form inverter INV2. Cross connection of the mutual input output terminals (storage node D, E) of inverter INV1 and INV2 of these pairs is electrically done, and they form the flip-flop circuit as an information storage part which memorizes 1-bit information. One input output terminal (storage node D) of this flip-flop circuit is electrically connected to one side of the source and drain of n channel type MISFET Qt1 for transmission. The input output terminal (storage node E) of the other is electrically connected to one side of the source and drain of n channel type MISFET Qt2 for transmission.

The other of the source and drain region of n channel type MISFET Qt1 for transmission is electrically connected to data line DL. The other of the source and drain region of n channel type MISFET Qt2 for transmission is similarly connected to data line /DL. The one end (each source of p channel type MISFET Qp4 and Qp5 for loads) of the flip-flop circuit is electrically connected to supply voltage Vcc. The other end (each source of n channel type MISFET Qd1 and Qd2 for a drive) is electrically connected to reference voltage Vss.

Operation of the circuit of the above-mentioned SRAM is explained. Since n channel type MISFET Qd2 for a drive is set to ON when storage node D of one inverter INV1 is high electric potential ("H"), storage node E of inverter INV2 of the other becomes low electric potential ("L"). Therefore, n channel type MISFET Qd1 for a drive is turned off, and the high electric potential ("H") of storage node D is held. That is, the state of mutual storage nodes D and E is held, and information is saved by the latch circuit which did cross linking of the inverter INV1 and INV2 of a pair while supply voltage is applied.

As described above, word line WL is electrically connected to each gate of n channel type MISFET Qt1 and Qt2 for transmission. The electrical connection and the non-electrical connection of n channel type MISFET Qt1 and Qt2 for transmission are controlled by this word line WL. That is, when word line WL is high electric potential ("H"), n channel type MISFET Qt1 and Qt2 for transmission are set to ON, and a flip-flop circuit and a complementary data line (data line DL, /DL) are electrically connected. Hereby, the potential state ("H" or "L") of storage node D and E appears in data line DL and /DL, and is read as information on a memory cell.

In order to write information in a memory cell, word line WL is made into "H" potential level, n channel type MISFET Qt1 and Qt2 for transmission are made into an ON state, and the information on data line DL and /DL is transmitted to storage node D and E.

FIG. 44-FIG. 53 show the principal part section of substrate 1 in the manufacturing process of the semiconductor integrated circuit device of Embodiment 3 to process order, and show the section of the same part of substrate 1, respectively. In FIG. 44-FIG. 53, in addition to regions AHTN, AHTP, ALTN, ALTP, and AHVN explained using FIG. 1-FIG. 22 in the Embodiment 1, region (seventh region) ASN in which n channel type MISFET (fifth MISFET (Qd1, Qd2, Qt1, Qt2)) which forms the memory cell of the above-mentioned SRAM is formed, and region ASP in which p channel type MISFET (Qp4, Qp5) which forms the memory cell of SRAM is formed are also illustrated. Regions AHTN, AHTP, ALTN and ALTP are illustrated in FIG. 44, FIG. 46, FIG. 48, FIG. 50, and FIG. 52. Regions ASN, ASP, and AHVN are illustrated in FIG. 45, FIG. 47, FIG. 49, FIG. 51, and FIG. 53.

As for the manufacturing process of the semiconductor integrated circuit device of Embodiment 3, until the step (refer to FIG. 9) which forms gate electrodes 14A-14E is the same as that of the Embodiment 1. In a step until gate electrodes 14A-14E are formed, when forming p type well 4 in regions AHTN, ALTN, and AHVN, p type well 4 is formed also in region ASN. When forming n type well 7 in regions AHTP and ALTP, n type well 7 is formed also in region ASP. When gate electrodes 14A-14E are formed in regions AHTN, ALTN, AHVN, AHTP, and ALTP, respectively, gate electrodes 14H and 14I are formed in regions ASN and ASP, respectively. Before forming gate electrodes 14H and 14I, the ion implantation of the impurity for the threshold value voltage adjustment of MISFET which forms the memory cell of SRAM is done to regions ASN and ASP, respectively. The impurity for these threshold value voltage adjustment is an impurity, for example, B or BF2, which has a p type conductivity type of the 13th concentration in region ASN, and is the impurity which has an n type conductivity type, for example, P, in region ASP.

Then, in regions AHTN and ASN, n⁻ type semiconductor regions 16 and 61 are formed in p type well 4 of the both sides of gate electrode 14A and gate electrode (seventh gate electrode) 14H, respectively by the same step as the step explained using FIG. 10 in the Embodiment 1. In region AHTN, n-type semiconductor region 16 becomes a part of source/drain of n channel type MISFET with relatively high threshold value voltage. In region ASN, n⁻ type semiconductor region (the 15th semiconductor region) 61 becomes a part of source/drain of n channel type MISFET (Qd1, Qd2, Qt1, Qt2) which forms the memory cell of SRAM.

Figure 46:
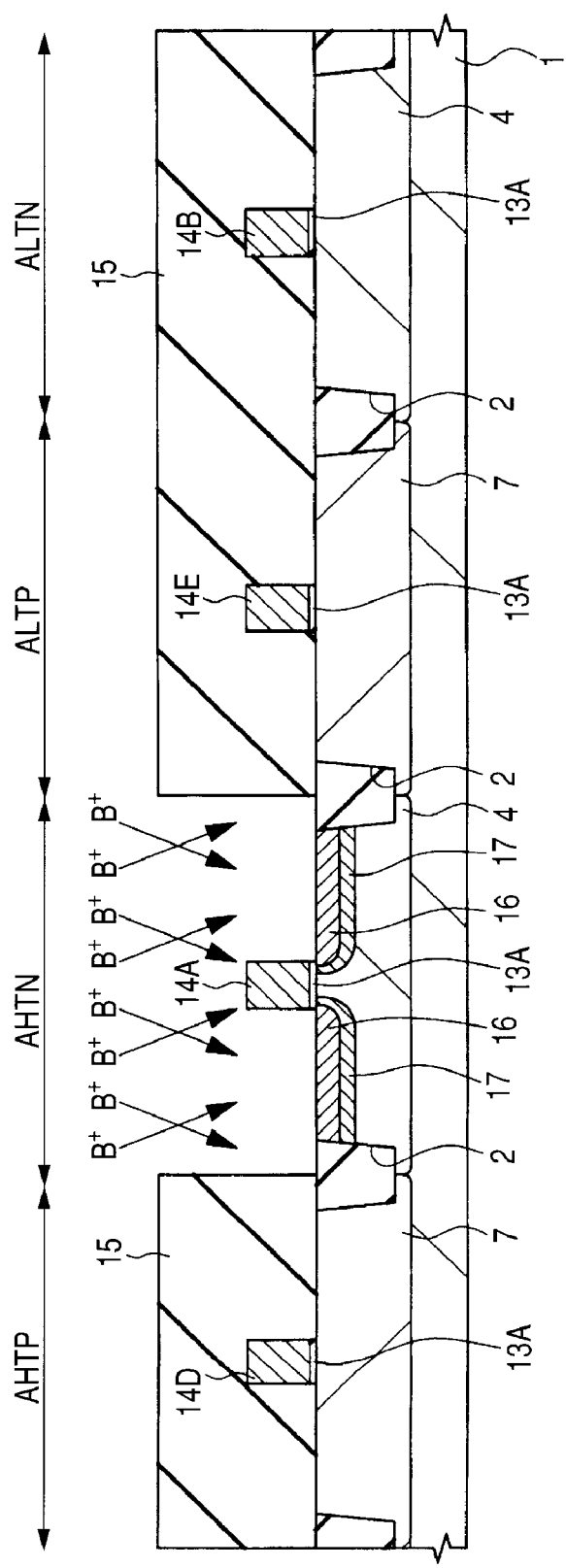
FIG. 46 is a principal part cross-sectional view in the manufacturing process of the semiconductor integrated circuit device following FIG. 44.
Figure 47:
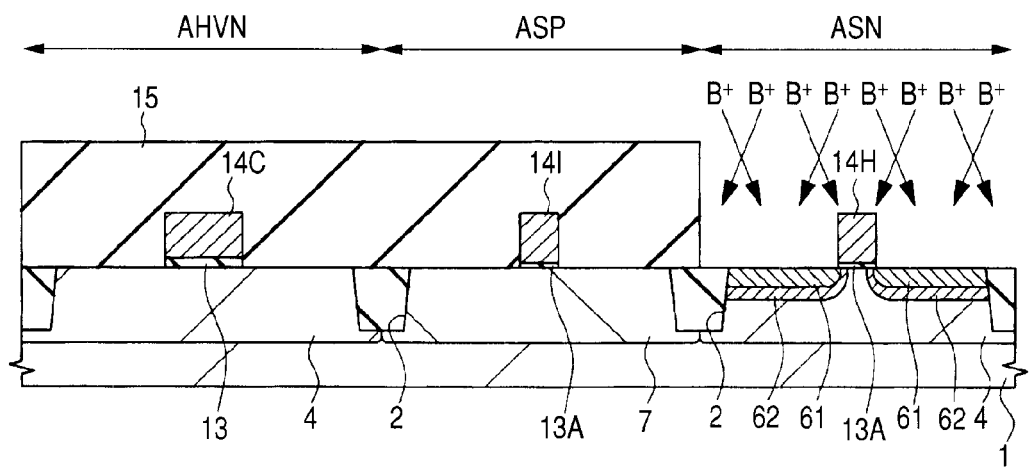
FIG. 47 is a principal part cross-sectional view in the manufacturing process of the semiconductor integrated circuit device following FIG. 45.

Next, as shown in FIG. 46 and FIG. 47, punch-through stopper layer 17 and punch-through stopper layer (the 16th semiconductor region) 62 are formed in regions AHTN and ASN by the same step as the step explained using FIG. 11 in the Embodiment 1.

Figure 48:
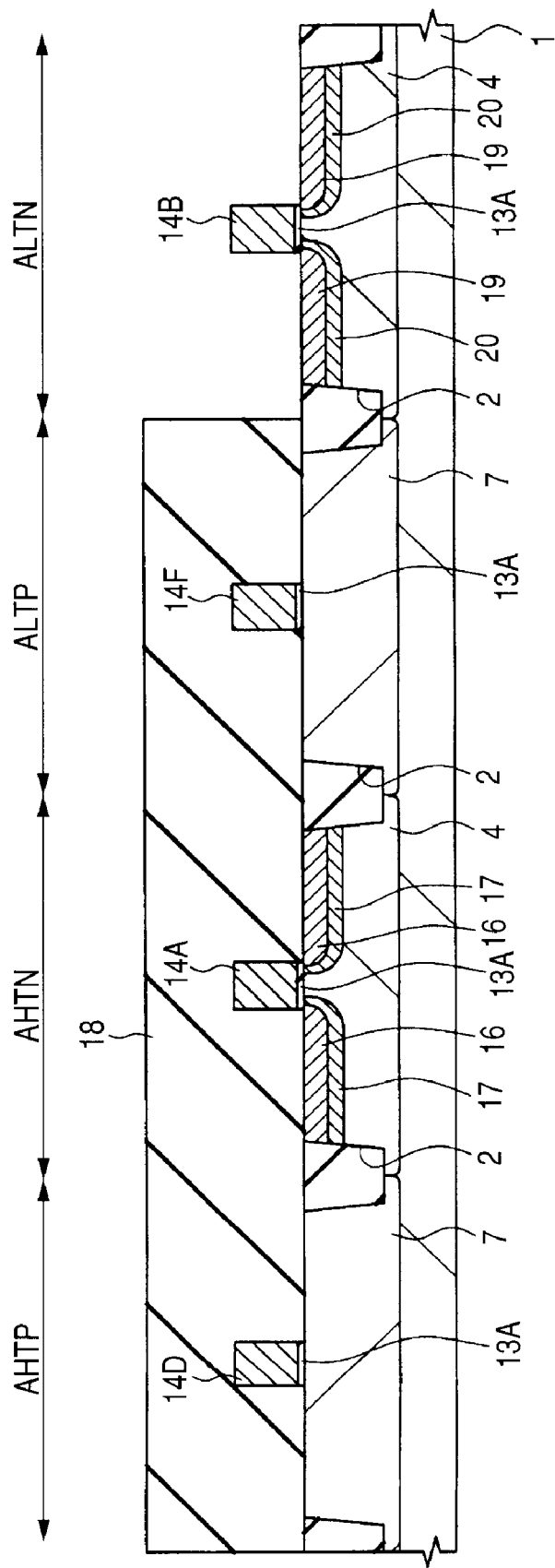
FIG. 48 is a principal part cross-sectional view in the manufacturing process of the semiconductor integrated circuit device following FIG. 46.
Figure 49:
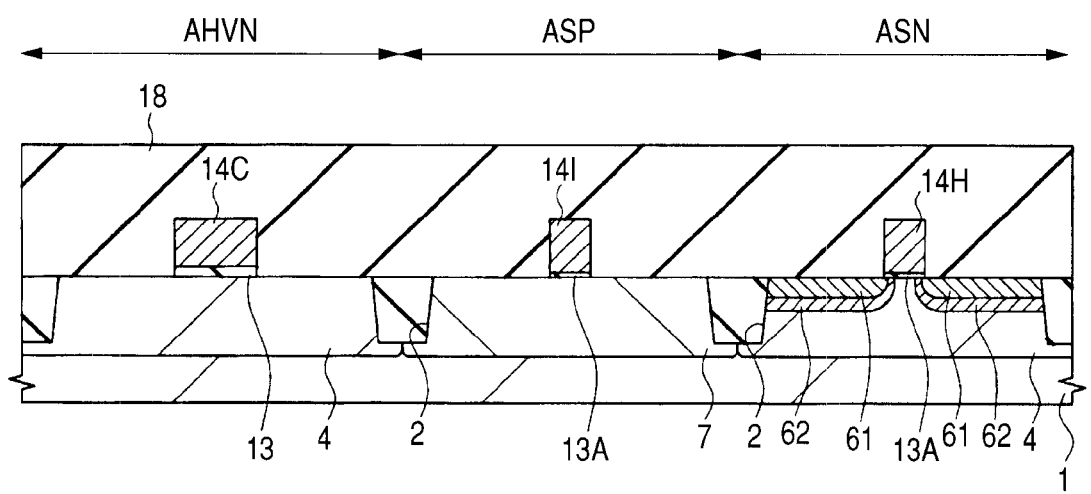
FIG. 49 is a principal part cross-sectional view in the manufacturing process of the semiconductor integrated circuit device following FIG. 47.

Next, after removing photoresist film 15, as shown in FIG. 48 and FIG. 49, in region ALTN, n⁻ type semiconductor region 19 is formed in p type well 4 of the both sides of gate electrode 14B by the same step as the step explained using FIG. 12 in the Embodiment 1. Then, punch-through stopper layer 20 is formed in region ALTN by the same step as the step explained using FIG. 13 in the Embodiment 1.

Figure 50:
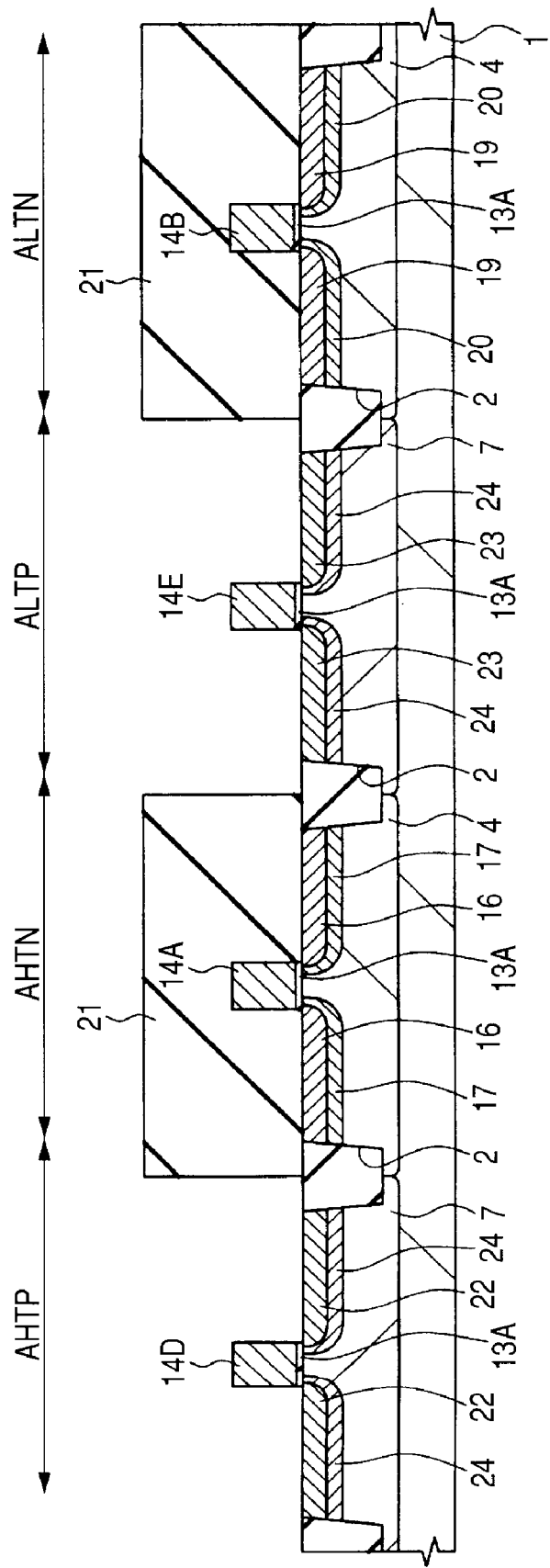
FIG. 50 is a principal part cross-sectional view in the manufacturing process of the semiconductor integrated circuit device following FIG. 48.
Figure 51:
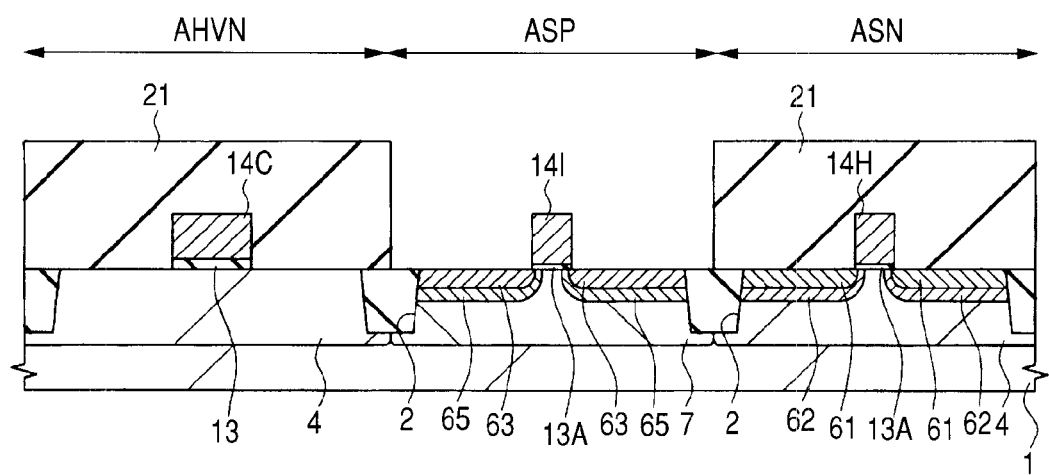
FIG. 51 is a principal part cross-sectional view in the manufacturing process of the semiconductor integrated circuit device following FIG. 49.

Next, after removing photoresist film 18, as shown in FIG. 50 and FIG. 51, in region AHTP, p⁻ type semiconductor region 22 is formed in n type well 7 of the both sides of gate electrode 14D by the same step as the step explained using FIG. 14 in the Embodiment 1. p⁻ type semiconductor region 23 is formed in n type well 7 of the both sides of gate electrode 14E in region ALTP, and p⁻ type semiconductor region 63 is formed in n type well 7 of the both sides of gate electrode 14I in region ASP. This p⁻ type semiconductor region 63 becomes a part of source/drain of p channel type MISFET (Qp4, Qp5) which forms the memory cell of SRAM. Then, by the same step as the step explained using FIG. 15 in the Embodiment 1, punch-through stopper layer 24 is formed in region AHTP, punch-through stopper layer 24 is formed in region ALTP, and punch-through stopper layer 65 is formed in region ASP.

Figure 52:
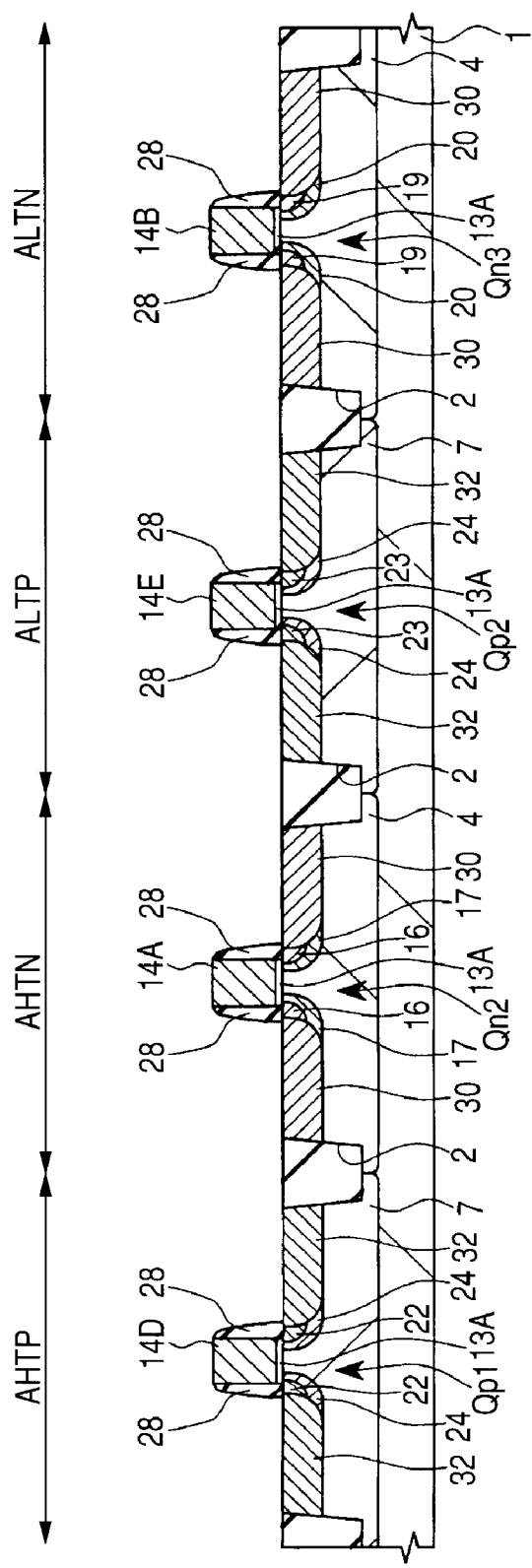
FIG. 52 is a principal part cross-sectional view in the manufacturing process of the semiconductor integrated circuit device following FIG. 50.
Figure 53:
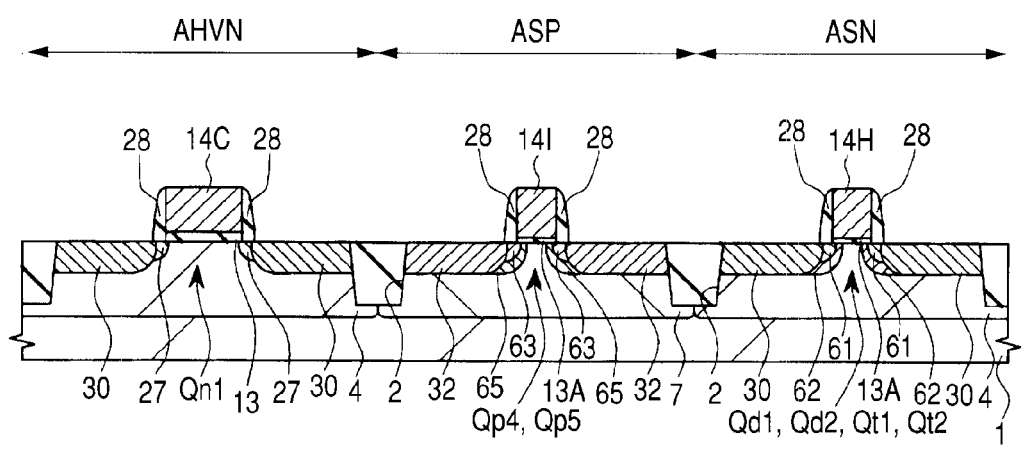
FIG. 53 is a principal part cross-sectional view in the manufacturing process of the semiconductor integrated circuit device following FIG. 51.

Next, after removing photoresist film 21, as shown in FIG. 52 and FIG. 53, in region AHVN, n⁻ type semiconductor region 27 is formed in p type well 4 of the both sides of gate electrode 14C by the same step as the step explained using FIG. 16 in the Embodiment 1.

Then, by the same step as the step explained in the Embodiment 1, p-type semiconductor region (illustration is omitted) which becomes a part of the source/drain of p channel type MISFET with a relatively large breakdown voltage is formed in the region in which p channel type MISFET with a relatively large breakdown voltage is formed.

Next, sidewall spacer 28 is formed in the side wall of gate electrodes 14A, 14B, 14C, 14D, 14E, 14H, and 14I and the gate electrode which is not illustrated by the same step as the step explained using FIG. 17 in the Embodiment 1.

Next, n⁺ type semiconductor region (the 17th semiconductor region) 30 which constitutes a source/drain of n channel type MISFET, respectively is formed in regions AHVN, AHTN, ALTN and ASN by the same step as the step explained using FIG. 18 in the Embodiment 1. By the steps so far, in region AHVN, n channel type MISFET Qn1 with a relatively large breakdown voltage is formed, and n channel type MISFET Qn2 with relatively high threshold value voltage can be formed in region AHTN. In region ALTN, n channel type MISFET Qn3 with relatively low threshold value voltage can be formed, and n channel type MISFET (Qd1, Qd2, Qt1, Qt2) which forms the memory cell of SRAM can be formed in region ASN.

Next, by the same step as the step explained using FIG. 19 in the Embodiment 1, $p^+$ type semiconductor region 32 used as the source/drain of p channel type MISFET is formed in regions AHTP, ALTP, and ASP, and the region in which p channel type MISFET with a relatively large breakdown voltage is formed, respectively. By the steps so far, in region AHTP, p channel type MISFET Qp1 with relatively high threshold value voltage is formed, and p channel type MISFET Qp2 with relatively low threshold value voltage is formed in region ALTP. In region ASP, p channel type MISFET (Qp4, Qp5) which forms the memory cell of SRAM can be formed.

Subsequent steps are the same as the step explained using FIG. 20-FIG. 22 in the Embodiment 1.

According to the above Embodiment 3, even when the memory cell of SRAM asked for low power consumption property is formed in the same substrate 1 upper part in addition to 2 kinds of n channel type MISFET Qn2 and Qn3 from which threshold value voltage differs, Among the steps which form n channel type MISFET (Qd1, Qd2, Qt1, Qt2) which forms the memory cell of SRAM, the step which forms $n^-$ type semiconductor region 61 and punch-through stopper layer 62 can be communized with the step which forms $n^-$ type semiconductor region 16 and punch-through stopper layer 17 of n channel type MISFET Qn2 with relatively high threshold value voltage. Thereby, in n channel type MISFET (Qd1, Qd2, Qt1, Qt2) which forms the memory cell of SRAM, by making low impurity concentration in $n^-$ type semiconductor region 61 and punch-through stopper layer 62, and easing the electric field near the drain like n channel type MISFET Qn2 with relatively high threshold value voltage, off-state current, such as GIDL current and BTBT current, can be suppressed inhibiting a short channel effect. That is, according to the memory cell of SRAM of the Embodiment 3 provided with such n channel type MISFET (Qd1, Qd2, Qt1, Qt2), power consumption can be reduced.

Figure 54:
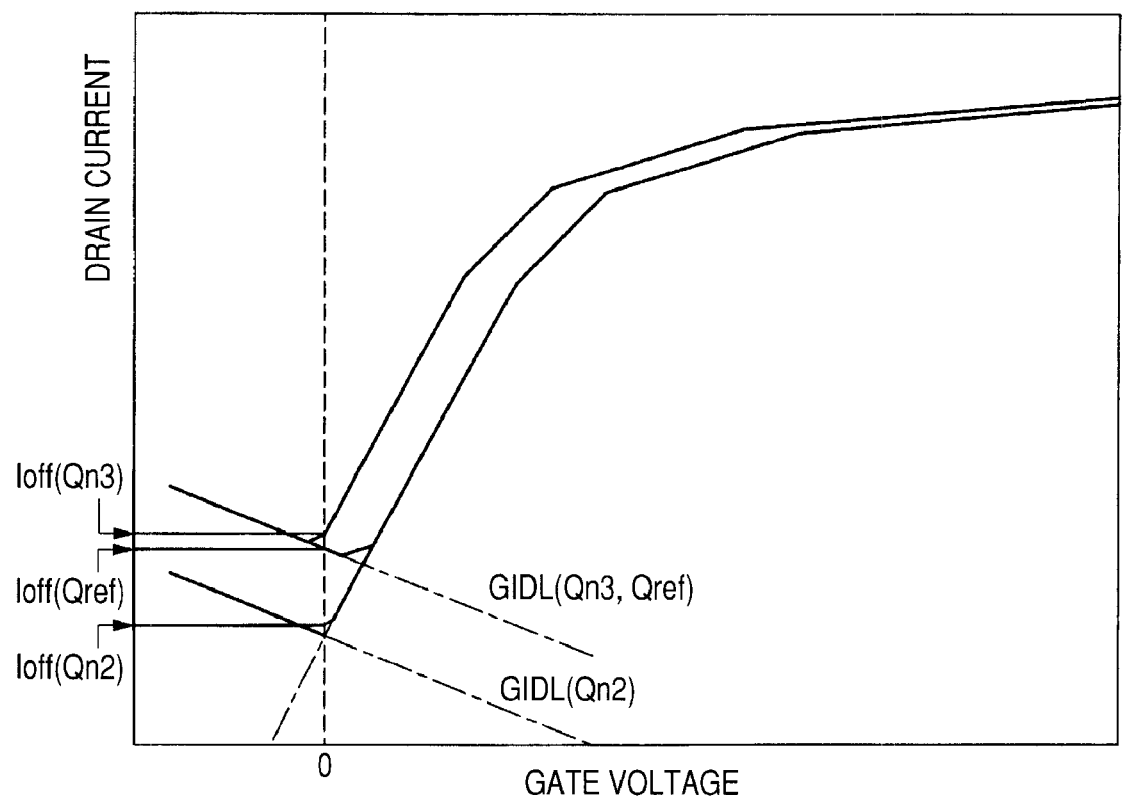
FIG. 54 is an explanatory drawing showing GIDL of n channel type MISFET included in the semiconductor integrated circuit device of Embodiment 3 of the present invention, and n channel type MISFET of a comparison object.

Here, FIG. 54 shows the relation between gate voltage and drain current of n channel type MISFET Qn3 with relatively low threshold value voltage and n channel type MISFET Qn2 with relatively high threshold value voltage (or n channel type MISFET (Qd1, Qd2, Qt1, Qt2) which forms the memory cell of SRAM) by the Embodiment 1 and this Embodiment 3. In FIG. 54, the relation between gate voltage and drain current in n channel type MISFET Qn2 with relatively high threshold value voltage (or n channel type MISFET (Qd1, Qd2, Qt1, Qt2) which forms the memory cell of SRAM) at the time of communizing the step which forms $n^-$ type semiconductor region and a punch-through stopper layer with n channel type MISFET Qn3 with relatively low threshold value voltage and adjusting threshold value voltage only by the implantation of the impurity for the threshold value voltage adjustment to p type well 4 is also shown as a comparison object. In the Embodiment 3 of in FIG. 54 and henceforth, n channel type MISFET which is this comparison object is shown as n channel type MISFET Qref. In FIG. 54, second off-state current value Ioff (Qn2), first off-state current value Ioff (Qn3) and reference off-state current value Ioff (Qref) is an off-state current value at the time of OFF (gate voltage is 0V) of n channel type MISFET Qn2 (or Qd1, Qd2, Qt1, Qt2), Qn3, and n channel type MISFET Qref that is a comparison object, respectively. GIDL (Qn2) and GIDL (Qn3, Qref) show the GIDL characteristics of n channel type MISFET Qn2 (or Qd1, Qd2, Qt1, Qt2), Qn3, and n channel type MISFET Qref that is a comparison object, respectively.

As for n channel type MISFET Qref which is a comparison object, and n channel type MISFET Qn3 with relatively low threshold value voltage, since the implantation steps of the impurity for the threshold value voltage adjustment to p type well 4 only differ, and the step which forms $n^-$ type semiconductor region and a punch-through stopper layer is communalized, resistance reduces and drain current becomes large, and as shown in FIG. 54, GIDL characteristics are communalized. For this reason, compared with n channel type MISFET Qn2 with relatively high threshold value voltage (or n channel type MISFET (Qd1, Qd2, Qt1, Qt2) which forms the memory cell of SRAM) which suppressed off-state current, such as GIDL current and BTBT current, inhibiting a short channel effect by making low impurity concentration in $n^-$ type semiconductor region 16 (or 61) and punch-through stopper layer 17 (or 62), and easing the electric field near the drain, off-state current will become large. Namely, according to the semiconductor integrated circuit device provided with n channel type MISFET Qn2 of the Embodiment 1 and this Embodiment 3, and n channel type MISFET (Qd1, Qd2, Qt1, Qt2) which forms the memory cell of SRAM of this Embodiment 3, that power consumption can be reduced can be confirmed also from FIG. 54.

Also by the above Embodiment 3, the same effect as the Embodiment 1 can be acquired.

Embodiment 4

In Embodiment 4 as well as the Embodiment 3, MISFET with relatively high threshold value voltage, MISFET with relatively low threshold value voltage, MISFET with a relatively large breakdown voltage, and MISFET that forms the memory cell of SRAM are also formed in the same substrate 1.

FIG. 55-FIG. 62 show the principal part section of substrate 1 in the manufacturing process of the semiconductor integrated circuit device of Embodiment 4 to process order, and show the section of the same part of substrate 1, respectively. In FIG. 55-FIG. 62, regions AHTN, AHTP, ALTN, ALTP, AHVN, ASN, and ASP are illustrated like the Embodiment 3. Regions AHTN, AHTP, ALTN and ALTP are illustrated in FIG. 55, FIG. 57, FIG. 59, and FIG. 61. Regions ASN, ASP, and AHVN are illustrated in FIG. 56, FIG. 58, FIG. 60, and FIG. 62.

Figure 55:
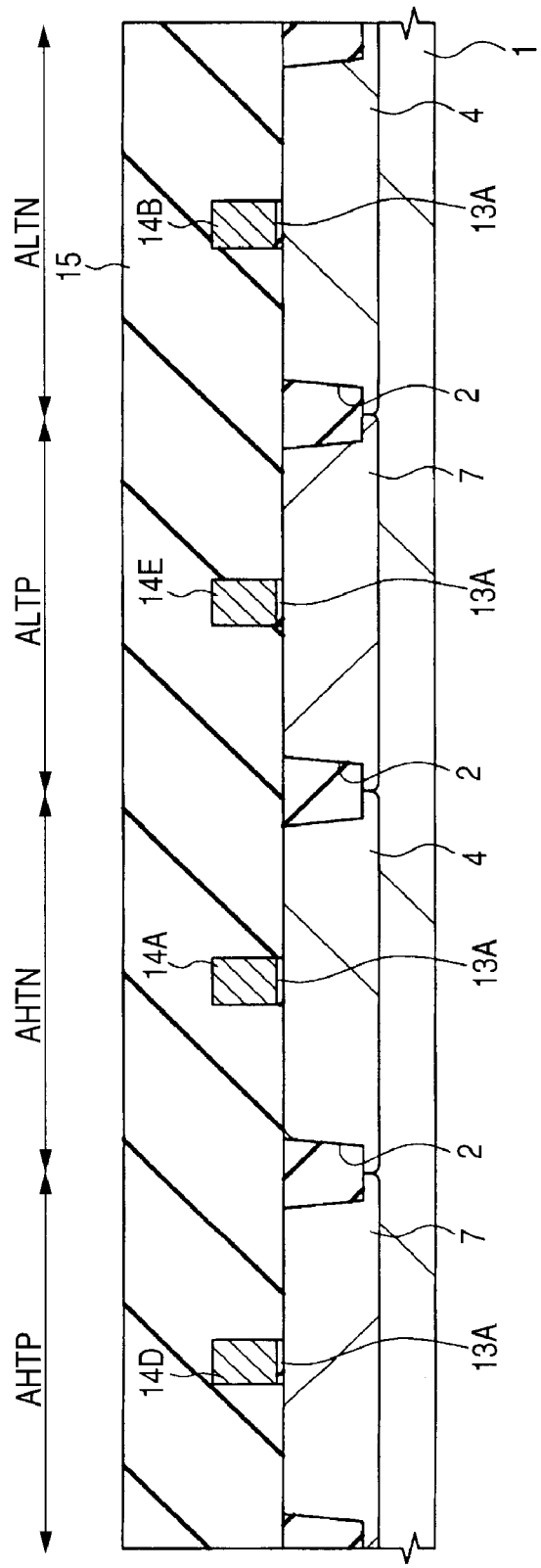
FIGS. 55 and 56 are principal part cross-sectional views explaining the manufacturing method of the semiconductor integrated circuit device of Embodiment 4 of the present invention.
Figure 56:
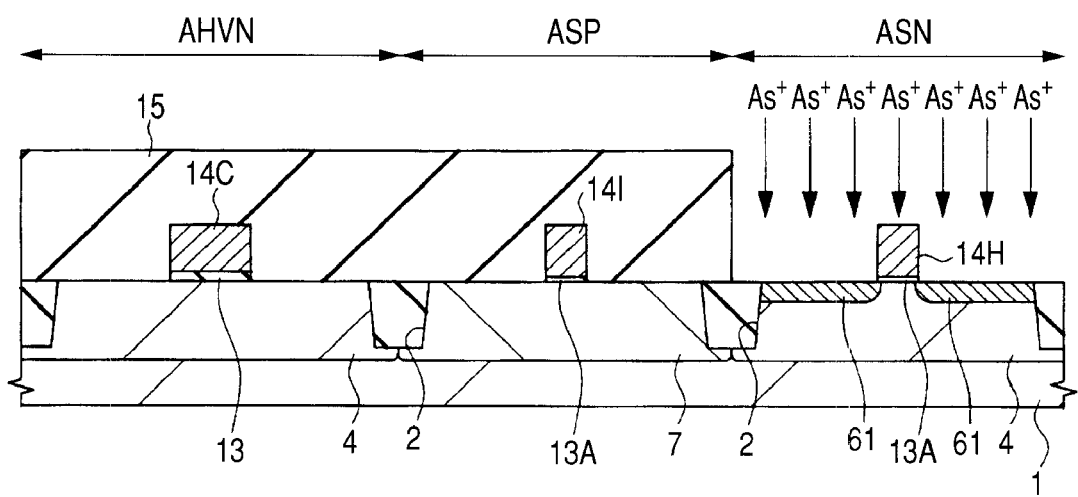

As for the steps of the manufacturing process of the semiconductor integrated circuit device of Embodiment 4, until the step which forms gate electrodes 14A-141 is the same as that of the Embodiment 3. Then, as shown in FIG. 55 and FIG. 56, on substrate 1, photoresist film 15 is formed and the photoresist film 15 is patterned with photolithography technology. This leaves photoresist film 15 to regions other than region ASN. Then, the ion implantation of the impurity which has an n type conductivity type, for example, the As, is done to region ASN by using patterned photoresist film 15 as a mask. $n^-$ type semiconductor region 61 which becomes a part of source/drain of n channel type MISFET which forms the memory cell of SRAM is formed in p type well 4 of the both sides of gate electrode 14H.

Figure 57:
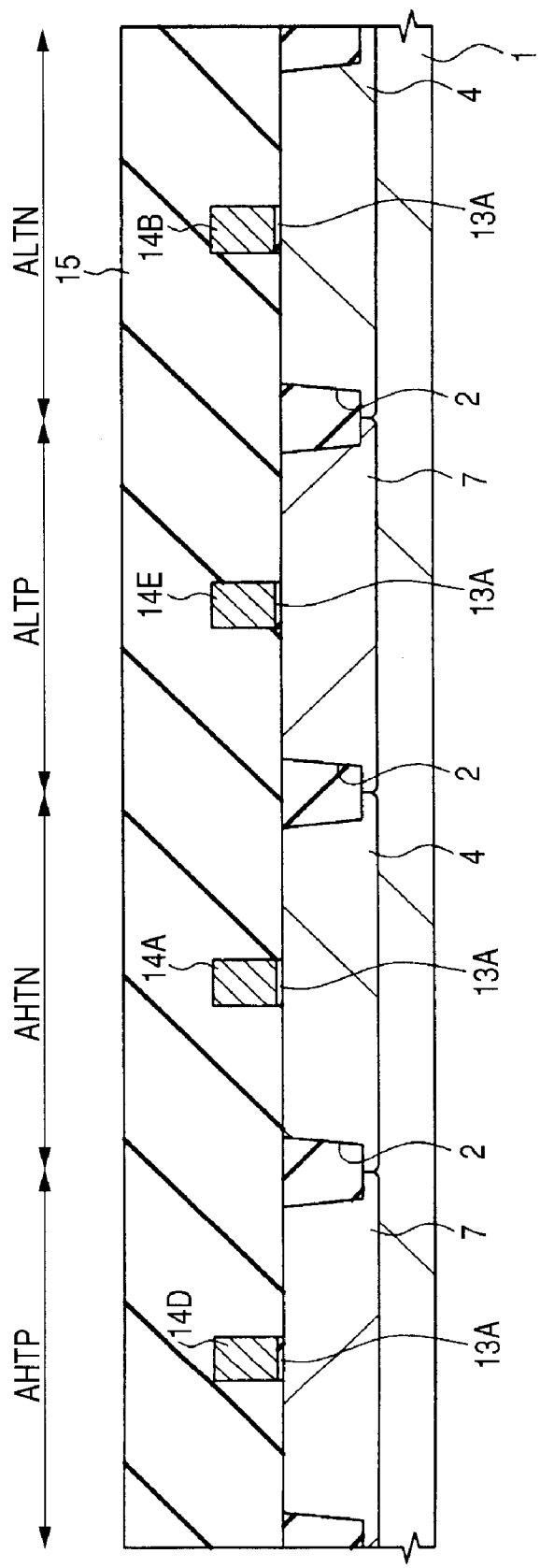
FIG. 57 is a principal part cross-sectional view in the manufacturing process of the semiconductor integrated circuit device following FIG. 55.
Figure 58:
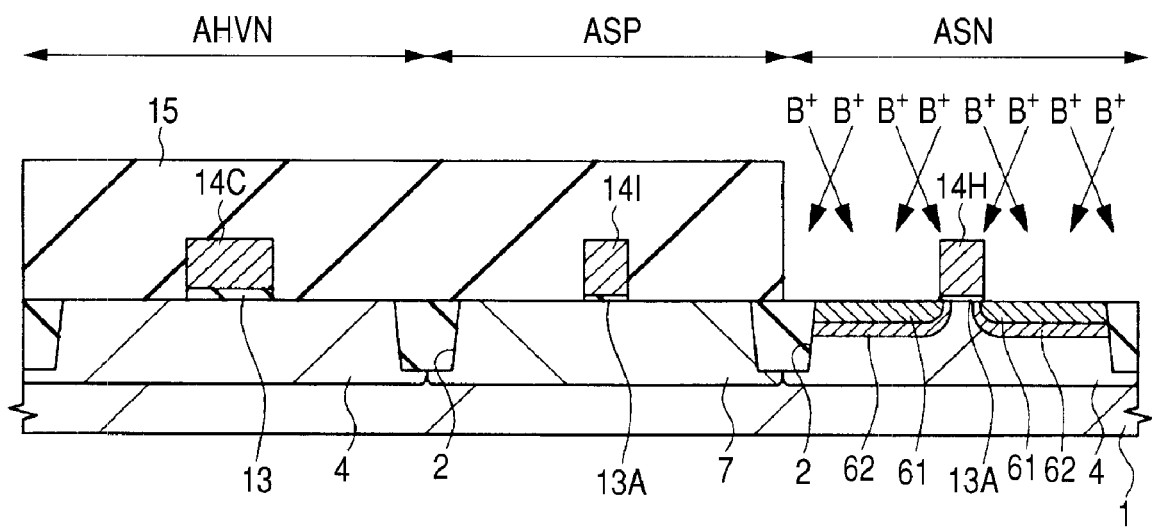
FIG. 58 is a principal part cross-sectional view in the manufacturing process of the semiconductor integrated circuit device following FIG. 56.

Next, as shown in FIG. 57 and FIG. 58, the ion implantation of the impurity which has a p type conductivity type, for example, the B, is done to region ASN by using the above-mentioned photoresist film 15 as a mask, and punch-through stopper layer 62 is formed. At this time, B is implanted from an oblique direction to the main surface of substrate 1. For example, at a plane, it is implanted from a direction parallel and vertical to the extending direction of gate electrode 14H, rotating substrate 1 90° every along the main surface. Thereby, punch-through stopper layer 62 can be formed so that n-type semiconductor region 61 may be surrounded.

Figure 59:
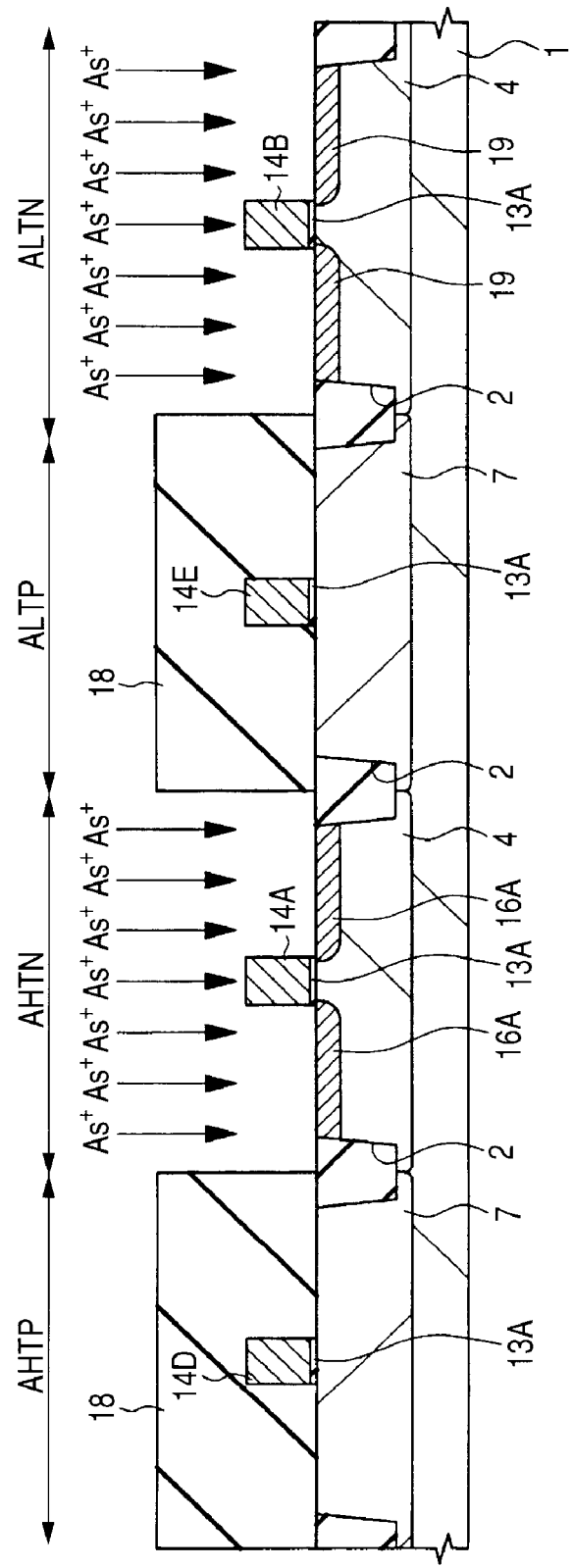
FIG. 59 is a principal part cross-sectional view in the manufacturing process of the semiconductor integrated circuit device following FIG. 57.
Figure 60:
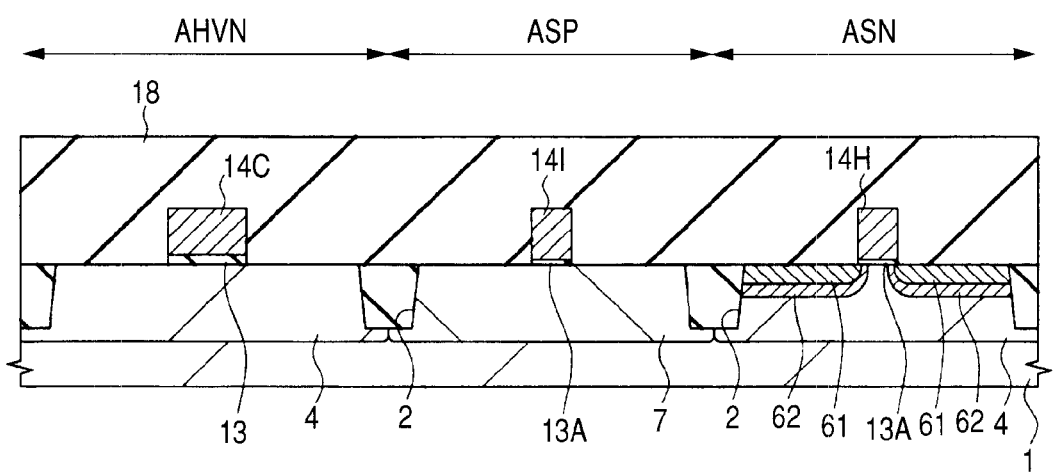
FIG. 60 is a principal part cross-sectional view in the manufacturing process of the semiconductor integrated circuit device following FIG. 58.

Next, after removing photoresist film 15, as shown in FIG. 59 and FIG. 60, on substrate 1, photoresist film 18 is formed and the photoresist film 18 is patterned with photolithography technology. This leaves photoresist film 18 to regions other than regions AHTN and ALTN. Then, the ion implantation of the impurity which has an n type conductivity type, for example, the As, is done to regions AHTN and ALTN by using patterned photoresist film 18 as a mask. $n^-$ type semiconductor regions 16A and 19 are formed in p type well 4 of the both sides of gate electrodes 14A and 14B, respectively. $n^-$ type semiconductor region 16A becomes a part of source/drain of n channel type MISFET with relatively high threshold value voltage. n-type semiconductor region 19 becomes a part of source/drain of n channel type MISFET with relatively low threshold value voltage. As ion implantation conditions at this time, it is made larger than the amount of ion implantation of As at the time of formation of $n^-$ type semiconductor region 61. That is, in Embodiment 4, the amount of ion implantation of As at the time of formation of $n^-$ type semiconductor region 61 is made less than the amount of ion implantation of As at the time of formation of $n^-$ type semiconductor regions 16A and 19.

Figure 61:
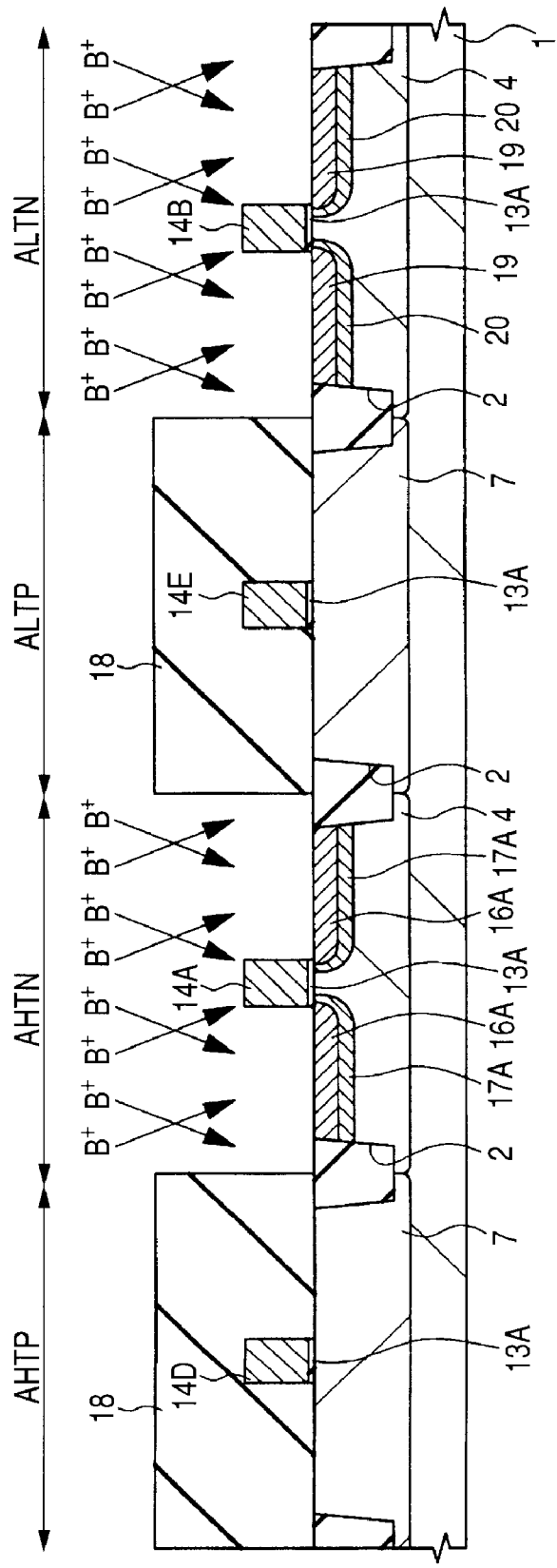
FIG. 61 is a principal part cross-sectional view in the manufacturing process of the semiconductor integrated circuit device following FIG. 59.
Figure 62:
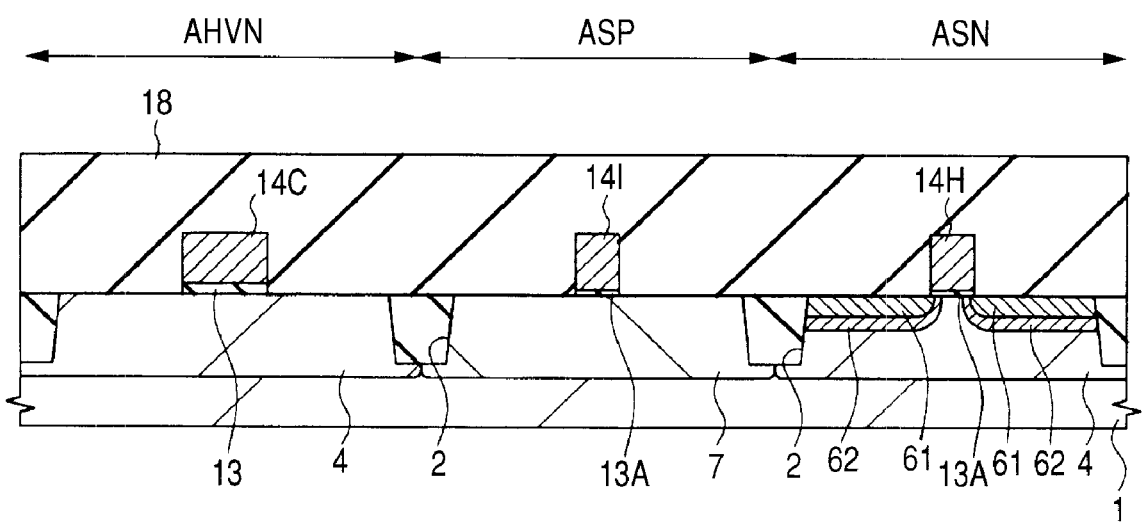
FIG. 62 is a principal part cross-sectional view in the manufacturing process of the semiconductor integrated circuit device following FIG. 60.

Next, as shown in FIG. 61 and FIG. 62, the ion implantation of the impurity which has a p type conductivity type, for example, the B, is done to regions AHTN and ALTN by using the above-mentioned photoresist film 18 as a mask, and punch-through stopper layers 17A and 20 are formed in regions AHTN and ALTN, respectively. In this Embodiment 4, it is made larger than the amount of ion implantation of B at the time of formation of punch-through stopper layer 62 as ion implantation conditions at this time. It is implanted from an oblique direction to the main surface of substrate 1 like the time of formation of punch-through stopper layer 62. That is, in this Embodiment 4, the amount of ion implantation of B at the time of formation of punch-through stopper layer 62 is made less than the amount of ion implantation of B at the time of formation of punch-through stopper layers 17A and 20.

The semiconductor integrated device of Embodiment 4 is manufactured by passing through the step explained using FIG. 50-FIG. 53 in the Embodiment 4, and the step explained using FIG. 20-FIG. 22 in the Embodiment 1 henceforth.

Also by the above Embodiment 4, like the Embodiment 3, when the memory cell of SRAM asked for low power consumption property is formed in addition to 2 kinds of n channel type MISFET Qn2 and Qn3 from which threshold value voltage differs on the same substrate 1, in n channel type MISFET which forms the memory cell of SRAM, by making low impurity concentration in $n^-$ type semiconductor region 61 and punch-through stopper layer 62, and easing the electric field near the drain, off-state current, such as GIDL current and BTBT current, can be suppressed, inhibiting a short channel effect. That is, according to the memory cell of SRAM of the Embodiment 4 provided with such n channel type MISFET, power consumption can be reduced like the Embodiment 3.

Also by the above Embodiment 4, the same effect as the Embodiment 3 can be acquired.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

Although exemplified in the embodiment about the step which forms in the same substrate two kinds or three kinds of MISFET from which threshold value voltage differs, four or more kinds of MISFET from which threshold value voltage differs may be formed at the same step.

The manufacturing method of the semiconductor integrated circuit device of the present invention is widely applicable to the manufacturing process of the semiconductor integrated circuit device provided with two or more sorts of MISFET from which threshold value voltage differs.

What is claimed is:

1. A method of manufacturing a semiconductor integrated circuit device with a first MISFET of a first threshold value voltage and a second MISFET of a second threshold value voltage lower than the first threshold value voltage in a main surface of the same semiconductor substrate, comprising the steps of:
   (a) forming a semiconductor region for threshold value voltage adjustment of the first MISFET which has a first conductivity type and has first concentration in a first region of the semiconductor substrate;
   (b) forming a semiconductor region for threshold value voltage adjustment of the second MISFET which has the first conductivity type and has a second concentration of impurity concentration lower than the first concentration in a second region of the semiconductor substrate;
   (c) forming a gate insulating film over the main surface of the semiconductor substrate;
   (d) forming a first gate electrode of the first MISFET in the first region, and forming a second gate electrode of the second MISFET in the second region by depositing a conductive film over the gate insulating film, and patterning the conductive film and the gate insulating film;
   (e) after the step (d), forming a first semiconductor region which has a second conductivity type and has third concentration in the first region of the semiconductor substrate;
   (f) after the step (d), forming a second semiconductor region which has the first conductivity type and has fourth concentration in the first region of the semiconductor substrate;
   (g) after the step (d), forming a third semiconductor region which has the second conductivity type and has a fifth concentration of impurity concentration higher than the third concentration in the second region of the semiconductor substrate;
   (h) after the step (d), forming a fourth semiconductor region which has the first conductivity type and has a sixth concentration of impurity concentration higher than the fourth concentration in the second region of the semiconductor substrate;
   (i) after the steps from (e) to (h), forming an insulation film at a side wall of the first gate electrode and the second gate electrode; and
   (j) after the step (i), forming a fifth and a sixth semiconductor region which have the second conductivity type and have a seventh concentration of impurity concentration higher than the third and the fifth concentration in the first and the second region of the semiconductor substrate, respectively.

2. A method of manufacturing a semiconductor integrated circuit device according to claim 1, wherein the step (a) and the step (b) are performed before implementation of the step (c) and the step (d).

3. A method of manufacturing a semiconductor integrated circuit device according to claim 1, wherein
the first MISFET and the second MISFET are n channel type MISFET's which form logical circuits.

4. A method of manufacturing a semiconductor integrated circuit device according to claim 3, wherein
in the main surface of the semiconductor substrate, first p channel type MISFET of third threshold value voltage is formed in a third region, and second p channel type MISFET of fourth threshold value voltage lower than the third threshold value voltage is formed in a fourth region;
at the step (d), a third gate electrode of the first p channel type MISFET and a fourth gate electrode of the second p channel type MISFET are formed; and
at the step (i), the insulation film is formed in a side wall of the third gate electrode and the fourth gate electrode;
further comprising the steps of:
(k) forming a semiconductor region for threshold value voltage adjustment of the first p channel type MISFET which has the second conductivity type and has eighth concentration in the third region of the semiconductor substrate;
(l) forming a semiconductor region for threshold value voltage adjustment of the second p channel type MISFET which has the second conductivity type and has ninth concentration in the fourth region of the semiconductor substrate;
(m) forming a seventh semiconductor region of the first conductivity type in the third and the fourth region of the semiconductor substrate under existence of the third gate electrode and the fourth gate electrode;
(n) forming an eighth semiconductor region of the second conductivity type in the third and the fourth region of the semiconductor substrate under existence of the third gate electrode and the fourth gate electrode; and
(o) forming a ninth semiconductor region of the first conductivity type which has impurity concentration higher than the seventh semiconductor region in the third and the fourth region of the semiconductor substrate under a situation where the insulation film is formed in a side wall of the third gate electrode and the fourth gate electrode.

5. A method of manufacturing a semiconductor integrated circuit device according to claim 1, wherein
the second semiconductor region prevents generation of punch through effect in the first MISFET, and the fourth semiconductor region prevents generation of the punch through effect in the second MISFET.

6. A method of manufacturing a semiconductor integrated circuit device according to claim 5, wherein
the second and the fourth semiconductor region at the step (f) and the step (h) are formed by ion implantation from an oblique direction to the main surface of the semiconductor substrate.

7. A method of manufacturing a semiconductor integrated circuit device according to claim 1, wherein
third MISFET of a second breakdown voltage larger than a first breakdown voltage of the first MISFET and the second MISFET is formed in a fifth region of the main surface of the semiconductor substrate;
at the step (d), a fifth gate electrode of the third MISFET is formed;
at the step (i), the insulation film is formed in a side wall of the fifth gate electrode; and at the step (j), an eleventh semiconductor region of the second conductivity type is formed in the fifth region of the semiconductor substrate;
further comprising the steps of:
(p) forming a semiconductor region for threshold value voltage adjustment of the third MISFET which has the first conductivity type and has tenth concentration of impurity concentration lower than the second concentration in the fifth region of the semiconductor substrate; and
(q) forming a tenth semiconductor region that has the second conductivity type and has eleventh concentration of impurity concentration lower than the third concentration in the fifth region of the semiconductor substrate under existence of the fifth gate electrode.

8. A method of manufacturing a semiconductor integrated circuit device with a first MISFET of first threshold value voltage, a second MISFET of second threshold value voltage lower than the first threshold value voltage and a fourth MISFET of third threshold value voltage between the first threshold value voltage and the second threshold value voltage in a main surface of the same semiconductor substrate, comprising the steps of:
(a) forming a semiconductor region for threshold value voltage adjustment of the first MISFET which has a first conductivity type and has first concentration in a first region of the semiconductor substrate;
(b) forming a semiconductor region for threshold value voltage adjustment of the second MISFET which has the first conductivity type and has second concentration of impurity concentration lower than the first concentration in a second region of the semiconductor substrate;
(c) forming a semiconductor region for threshold value voltage adjustment of the fourth MISFET which has the first conductivity type and has twelfth concentration of impurity concentration lower than the second concentration in a sixth region of the semiconductor substrate;
(d) forming a gate insulating film in the main surface of the semiconductor substrate;
(e) forming a first gate electrode of the first MISFET in the first region, forming a second gate electrode of the second MISFET in the second region, and forming a sixth gate electrode of the fourth MISFET in the sixth region by depositing a conductive film over the gate insulating film, and patterning the conductive film and the gate insulating film;
(f) after the step (e), forming a first semiconductor region which has a second conductivity type and has third concentration in the first region of the semiconductor substrate;
(g) after the step (e), forming a second semiconductor region which has the first conductivity type and has fourth concentration in the first region of the semiconductor substrate;
(h) after the step (e), forming a third semiconductor region and a twelfth semiconductor region which have the second conductivity type and have fifth concentration higher than the third concentration in the second region and the sixth region of the semiconductor substrate, respectively;
(i) after the step (e), forming a fourth semiconductor region and a thirteenth semiconductor region which have the first conductivity type and have sixth concentration higher than the fourth concentration in the second region and the sixth region of the semiconductor substrate, respectively;

(j) after the steps from (f) to (i), forming an insulation film at a side wall of the first gate electrode, the second gate electrode, and the sixth gate electrode; and (k) after the step (j), forming a fifth, and a sixth and a fourteenth semiconductor region which have the second conductivity type and have a seventh concentration of impurity concentration higher than the third and the fifth concentration in the first region, the second region, and the sixth region of the semiconductor substrate, respectively.

9. A method of manufacturing a semiconductor integrated circuit device according to claim 8, wherein
the step (a), the step (b), and the step (c) are performed before implementation of the step (d) and the step (e).

10. A method of manufacturing a semiconductor integrated circuit device according to claim 8, wherein
the first MISFET, the second MISFET, and the fourth MISFET are n channel type MISFET's which form logical circuits.

11. A method of manufacturing a semiconductor integrated circuit device according to claim 10, wherein
in the main surface of the semiconductor substrate, a first p channel type MISFET of third threshold value voltage is formed in a third region, and a second p channel type MISFET of fourth threshold value voltage lower than the third threshold value voltage is formed in a fourth region;
at the step (e), a third gate electrode of the first p channel type MISFET and a fourth gate electrode of the second p channel type MISFET are formed; and
at the step (j), the insulation film is formed in a side wall of the third gate electrode and the fourth gate electrode;
further comprising the steps of:
(l) forming a semiconductor region for threshold value voltage adjustment of the first p channel type MISFET which has the second conductivity type and has eighth concentration in the third region of the semiconductor substrate;
(m) forming a semiconductor region for threshold value voltage adjustment of the second p channel type MISFET which has the second conductivity type and has ninth concentration in the fourth region of the semiconductor substrate;
(n) forming a seventh semiconductor region of the first conductivity type in the third region and the fourth region of the semiconductor substrate under existence of the third gate electrode and the fourth gate electrode;
(o) forming an eighth semiconductor region of the second conductivity type in the third region and the fourth region of the semiconductor substrate under existence of the third gate electrode and the fourth gate electrode; and
(p) forming a ninth semiconductor region of the first conductivity type which has impurity concentration higher than the seventh semiconductor region in the third region and the fourth region of the semiconductor substrate under a situation where the insulation film is formed in the side wall of the third gate electrode and the fourth gate electrode.

12. A method of manufacturing a semiconductor integrated circuit device according to claim 8, wherein
the second semiconductor region prevents generation of punch through effect in the first MISFET;
the fourth semiconductor region prevents generation of the punch through effect in the second MISFET; and
the thirteenth semiconductor region prevents generation of the punch through effect in the fourth MISFET.

13. A method of manufacturing a semiconductor integrated circuit device according to claim 12, wherein
the second, the fourth, and the thirteenth semiconductor region in the step (g) and the step (i) are formed by ion implantation from an oblique direction to the main surface of the semiconductor substrate.

14. A method of manufacturing a semiconductor integrated circuit device according to claim 8, wherein
a third MISFET of a second breakdown voltage larger than a first breakdown voltage of the first MISFET, the second MISFET, and the fourth MISFET is formed in a fifth region of the main surface of the semiconductor substrate;
at the step (e), a fifth gate electrode of the third MISFET is formed;
at the step (j), the insulation film is formed in a side wall of the fifth gate electrode; and
at the step (k), an eleventh semiconductor region of a second conductivity type is formed in the fifth region of the semiconductor substrate;
further comprising the steps of:
(q) forming a semiconductor region for threshold value voltage adjustment of the third MISFET which has the first conductivity type and has tenth concentration of impurity concentration lower than the twelfth concentration in the fifth region of the semiconductor substrate; and
(r) forming a tenth semiconductor region that has the second conductivity type and has eleventh concentration of impurity concentration lower than the third concentration in the fifth region of the semiconductor substrate under existence of the fifth gate electrode.

15. A method of manufacturing a semiconductor integrated circuit device with a first MISFET of first threshold value voltage, a second MISFET of second threshold value voltage lower than the first threshold value voltage, and a fifth MISFET which forms a memory cell of SRAM and has a second off-state current value smaller than a first off-state current value in a main surface of the same semiconductor substrate, comprising the steps of:
(a) forming a semiconductor region for threshold value voltage adjustment of the first MISFET which has a first conductivity type and has first concentration in a first region of the semiconductor substrate;
(b) forming a semiconductor region for threshold value voltage adjustment of the second MISFET which has the first conductivity type and has second concentration of impurity concentration lower than the first concentration in a second region of the semiconductor substrate;
(c) forming a semiconductor region for threshold value voltage adjustment of the fifth MISFET which has the first conductivity type and has thirteenth concentration in a seventh region of the semiconductor substrate;
(d) forming a gate insulating film in the main surface of the semiconductor substrate;
(e) forming a first gate electrode of the first MISFET in the first region, forming a second gate electrode of the second MISFET in the second region, and forming a seventh gate electrode of the fifth MISFET in the seventh region by depositing a conductive film over the gate insulating film, and patterning the conductive film and the gate insulating film;
(f) after the step (e), forming a first semiconductor region and a fifteenth semiconductor region which have a second conductivity type and have third concentration in the first region and the seventh region of the semiconductor substrate, respectively;

(g) after the step (e), forming a second semiconductor region and a sixteenth semiconductor region which have the first conductivity type and have fourth concentration in the first region and the seventh region of the semiconductor substrate, respectively;

(h) after the step (e), forming a third semiconductor region which has the second conductivity type and has fifth concentration higher than the third concentration in the second region of the semiconductor substrate;

(i) after the step (e), forming a fourth semiconductor region which has the first conductivity type and has sixth concentration higher than the fourth concentration in the second region of the semiconductor substrate;

(j) after the steps from (f) to (i), forming an insulation film at a side wall of the first gate electrode, the second gate electrode, and the seventh gate electrode; and (k) after the step (j), forming a fifth, a sixth, and a seventeenth semiconductor region which have the second conductivity type and have a seventh concentration of impurity concentration higher than the third and the fifth concentration in the first region, the second region, and the seventh region of the semiconductor substrate, respectively.

16. A method of manufacturing a semiconductor integrated circuit device according to claim 15, wherein
the step (a), the step (b), and the step (c) are performed before implementation of the step (d) and the step (e).

17. A method of manufacturing a semiconductor integrated circuit device according to claim 15, wherein
the first MISFET and the second MISFET are n channel type MISFET's which form logical circuits.

18. A method of manufacturing a semiconductor integrated circuit device according to claim 17, wherein
a first p channel type MISFET of third threshold value voltage is formed in a third region, and a second p channel type MISFET of fourth threshold value voltage lower than the third threshold value voltage is formed in a fourth region in the main surface of the semiconductor substrate;
at the step (e), a third gate electrode of the first p channel type MISFET and a fourth gate electrode of the second p channel type MISFET are formed; and
at the step (j), the insulation film is formed in a side wall of the third gate electrode and the fourth gate electrode;
further comprising the steps of:
(l) forming a semiconductor region for threshold value voltage adjustment of the first p channel type MISFET which has the second conductivity type and has eighth concentration in the third region of the semiconductor substrate;
(m) forming a semiconductor region for threshold value voltage adjustment of the second p channel type MISFET which has the second conductivity type and has ninth concentration in the fourth region of the semiconductor substrate;
(n) forming a seventh semiconductor region of a first conductivity type in the third region and the fourth region of the semiconductor substrate under existence of the third gate electrode and the fourth gate electrode;
(o) forming an eighth semiconductor region of a second conductivity type in the third region and the fourth region of the semiconductor substrate under existence of the third gate electrode and the fourth gate electrode; and
(p) forming a ninth semiconductor region of the first conductivity type which has impurity concentration higher than the seventh semiconductor region in the third region and the fourth region of the semiconductor substrate under a situation where the insulation film is formed in the side wall of the third gate electrode and the fourth gate electrode.

19. A method of manufacturing a semiconductor integrated circuit device according to claim 15, wherein
the second semiconductor region prevents generation of punch through effect in the first MISFET;
the fourth semiconductor region prevents generation of the punch through effect in the second MISFET; and
the sixteenth semiconductor region prevents generation of the punch through effect in the fifth MISFET.

20. A method of manufacturing a semiconductor integrated circuit device according to claim 19, wherein
the second, the fourth, and the sixteenth semiconductor region in the step (g) and the step (i) are formed by ion implantation from an oblique direction to the main surface of the semiconductor substrate.

21. A method of manufacturing a semiconductor integrated circuit device according to claim 15, wherein
a third MISFET of a second breakdown voltage larger than a first breakdown voltage of the first MISFET, the second MISFET, and the fifth MISFET is formed in a fifth region of the main surface of the semiconductor substrate;
at the step (e), a fifth gate electrode of the third MISFET is formed;
at the step (j), the insulation film is formed in a side wall of the fifth gate electrode; and
at the step (k), an eleventh semiconductor region of the second conductivity type is formed in the fifth region of the semiconductor substrate;
further comprising the steps of:
(q) forming a semiconductor region for threshold value voltage adjustment of the third MISFET which has the first conductivity type and has tenth concentration of impurity concentration lower than the second concentration in the fifth region of the semiconductor substrate; and
(r) forming a tenth semiconductor region that has the second conductivity type and has eleventh concentration of impurity concentration lower than the third concentration in the fifth region of the semiconductor substrate under existence of the fifth gate electrode.

22. A method of manufacturing a semiconductor integrated circuit device with a first MISFET of first threshold value voltage, a second MISFET of second threshold value voltage lower than the first threshold value voltage, and a fifth MISFET which forms a memory cell of SRAM and has a second off-state current value smaller than a first off-state current value in a main surface of the same semiconductor substrate, comprising the steps of:
(a) forming a semiconductor region for threshold value voltage adjustment of the first MISFET which has a first conductivity type and has first concentration in a first region of the semiconductor substrate;
(b) forming a semiconductor region for threshold value voltage adjustment of the second MISFET which has the first conductivity type and has second concentration of impurity concentration lower than the first concentration in a second region of the semiconductor substrate;
(c) forming a semiconductor region for threshold value voltage adjustment of the fifth MISFET which has the first conductivity type and has thirteenth concentration in a seventh region of the semiconductor substrate;
(d) forming a gate insulating film in the main surface of the semiconductor substrate;

(e) forming a first gate electrode of the first MISFET in the first region, forming a second gate electrode of the second MISFET in the second region, and forming a seventh gate electrode of the fifth MISFET in the seventh region by depositing a conductive film over the gate insulating film, and patterning the conductive film and the gate insulating film;

(f) after the step (e), forming a fifteenth semiconductor region that has a second conductivity type and has third concentration in the seventh region of the semiconductor substrate;

(g) after the step (e), forming a sixteenth semiconductor region that has the first conductivity type and has fourth concentration in the seventh region of the semiconductor substrate, respectively;

(h) after the step (e), forming a first semiconductor region and a third semiconductor region which have the second conductivity type and have fifth concentration higher than the third concentration in the first region and the second region of the semiconductor substrate, respectively;

(i) after the step (e), forming a second semiconductor region and a fourth semiconductor region which have the first conductivity type and have sixth concentration higher than the fourth concentration in the first region and the second region of the semiconductor substrate, respectively;

(j) after the steps from (f) to (i), forming an insulation film at a side wall of the first gate electrode, the second gate electrode, and the seventh gate electrode; and (k) after the step (j), forming a fifth, a sixth and a seventeenth semiconductor region which have the second conductivity type and have seventh concentration of impurity concentration higher than the third and the fifth concentration in the first region, the second region, and the seventh region of the semiconductor substrate, respectively.

23. A method of manufacturing a semiconductor integrated circuit device according to claim 22, wherein
the step (a), the step (b), and the step (c) are performed before implementation of the step (d) and the step (e).

24. A method of manufacturing a semiconductor integrated circuit device according to claim 22, wherein
the first MISFET and the second MISFET are n channel type MISFET's which form logical circuits.

25. A method of manufacturing a semiconductor integrated circuit device according to claim 24, wherein
in the main surface of the semiconductor substrate, a first p channel type MISFET of third threshold value voltage is formed in a third region, and a second p channel type MISFET of fourth threshold value voltage lower than the third threshold value voltage is formed in a fourth region;
at the step (e), a third gate electrode of the first p channel type MISFET and a fourth gate electrode of the second p channel type MISFET are formed; and
at the step (j), the insulation film is formed in a side wall of the third gate electrode and the fourth gate electrode;
further comprising the steps of:
(l) forming a semiconductor region for threshold value voltage adjustment of the first p channel type MISFET which has the second conductivity type and has eighth concentration in the third region of the semiconductor substrate;

(m) forming a semiconductor region for threshold value voltage adjustment of the second p channel type MISFET which has the second conductivity type and has ninth concentration in the fourth region of the semiconductor substrate;

(n) forming a seventh semiconductor region of the first conductivity type in the third region and the fourth region of the semiconductor substrate under existence of the third gate electrode and the fourth gate electrode;

(o) forming an eighth semiconductor region of the second conductivity type in the third region and the fourth region of the semiconductor substrate under existence of the third gate electrode and the fourth gate electrode; and (p) forming a ninth semiconductor region of the first conductivity type which has impurity concentration higher than the seventh semiconductor region in the third region and the fourth region of the semiconductor substrate under a situation where the insulation film is formed in the side wall of the third gate electrode and the fourth gate electrode.

26. A method of manufacturing a semiconductor integrated circuit device according to claim 22, wherein
the second semiconductor region prevents generation of punch through effect in the first MISFET;
the fourth semiconductor region prevents generation of the punch through effect in the second MISFET; and
the sixteenth semiconductor region prevents generation of the punch through effect in the fifth MISFET.

27. A method of manufacturing a semiconductor integrated circuit device according to claim 26, wherein
the second, the fourth, and the sixteenth semiconductor region in the step (g) and the step (i) are formed by ion implantation from an oblique direction to the main surface of the semiconductor substrate.

28. A method of manufacturing a semiconductor integrated circuit device according to claim 22, wherein
a third MISFET of a second breakdown voltage larger than a first breakdown voltage of the first MISFET, the second MISFET, and the fifth MISFET is formed in a fifth region of the main surface of the semiconductor substrate;
at the step (e), a fifth gate electrode of the third MISFET is formed;
at the step (j), the insulation film is formed in a side wall of the fifth gate electrode; and
at the step (k), an eleventh semiconductor region of a second conductivity type is formed in the fifth region of the semiconductor substrate;
further comprising the steps of:
(q) forming a semiconductor region for threshold value voltage adjustment of the third MISFET which has the first conductivity type and has tenth concentration of impurity concentration lower than the second concentration in the fifth region of the semiconductor substrate; and
(r) forming a tenth semiconductor region that has the second conductivity type and has an eleventh concentration of impurity concentration lower than the third concentration in the fifth region of the semiconductor substrate under existence of the fifth gate electrode.

* * * * *